(12) United States Patent
Shibamoto et al.

(10) Patent No.: US 11,370,862 B2
(45) Date of Patent: *Jun. 28, 2022

(54) RADIATION-SENSITIVE COMPOSITION, PLANOGRAPHIC PRINTING PLATE PRECURSOR, AND PLATE-MAKING METHOD FOR PLANOGRAPHIC PRINTING PLATE

(71) Applicant: FUJIFILM CORPORATION, Tokyo (JP)

(72) Inventors: Tadao Shibamoto, Shizuoka (JP); Taira Murakami, Shizuoka (JP); Kyosuke Tsumura, Shizuoka (JP); Kotaro Kudo, Shizuoka (JP)

(73) Assignee: FUJIFILM CORPORATION, Tokyo (JP)

( * ) Notice: Subject to any disclaimer, the term of this patent is extended or adjusted under 35 U.S.C. 154(b) by 123 days.

This patent is subject to a terminal disclaimer.

(21) Appl. No.: 16/409,856

(22) Filed: May 12, 2019

(65) Prior Publication Data

US 2019/0329545 A1 Oct. 31, 2019

Related U.S. Application Data

(63) Continuation of application No. PCT/JP2017/040319, filed on Nov. 8, 2017.

(30) Foreign Application Priority Data

Nov. 16, 2016 (JP) .............................. JP2016-223580
Apr. 14, 2017 (JP) .............................. JP2017-080570

(51) Int. Cl.
*B41C 1/10* (2006.01)
*C08F 220/28* (2006.01)

(52) U.S. Cl.
CPC ........ *C08F 220/282* (2020.02); *B41C 1/1016* (2013.01); *B41C 2201/04* (2013.01);
(Continued)

(58) Field of Classification Search
CPC ........................................................ G03F 7/32
See application file for complete search history.

(56) References Cited

U.S. PATENT DOCUMENTS

| | | |
|---|---|---|
| 7,524,614 B2 | 4/2009 | Tao et al. |
| 2003/0172828 A1 | 9/2003 | Tabuchi et al. |

(Continued)

FOREIGN PATENT DOCUMENTS

| | | |
|---|---|---|
| CN | 101687407 A | 3/2010 |
| CN | 103814330 A | 5/2014 |

(Continued)

OTHER PUBLICATIONS

Extended European Search Report dated Nov. 12, 2019, issued in corresponding EP Patent Application No. 17872234.4.

(Continued)

*Primary Examiner* — Chanceity N Robinson
(74) *Attorney, Agent, or Firm* — Solaris Intellectual Property Group, PLLC

(57) ABSTRACT

A planographic printing plate precursor includes: a support; and an image recording layer which includes a radical initiator, a radical polymerizable component, and a radiation absorption compound, and in which the image recording layer shows two or more peaks of a radical generation amount in a radical generation amount-versus-time curve after exposure to image forming radiation, in which the radical initiator includes an electron-donating radical initiator and an electron-accepting radical initiator, and the radiation absorption compound comprises a compound represented by the following Formula 1.

(Continued)

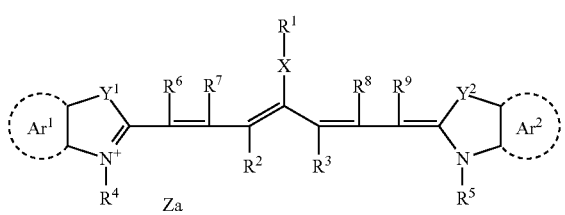

Formula 1

15 Claims, 2 Drawing Sheets

(52) U.S. Cl.
CPC ...... *B41C 2210/04* (2013.01); *B41C 2210/06* (2013.01); *B41C 2210/22* (2013.01); *B41C 2210/24* (2013.01)

(56) References Cited

U.S. PATENT DOCUMENTS

| | | | |
|---|---|---|---|
| 2004/0202957 A1 | 10/2004 | Murota | |
| 2008/0299488 A1 | 12/2008 | Yu et al. | |
| 2011/0045408 A1* | 2/2011 | Suzuki | C07D 209/14 430/281.1 |
| 2013/0078573 A1* | 3/2013 | Balbinot | G03F 7/031 430/284.1 |
| 2014/0045118 A1 | 2/2014 | Balbinot et al. | |
| 2014/0290516 A1 | 10/2014 | Mori | |
| 2015/0099229 A1* | 4/2015 | Simpson | G03F 7/0388 430/285.1 |
| 2015/0192852 A1 | 7/2015 | Sato et al. | |
| 2015/0198885 A1* | 7/2015 | Suzuki | B41C 1/1008 430/285.1 |
| 2016/0121596 A1* | 5/2016 | Saito | B41C 1/1025 101/463.1 |
| 2017/0123315 A1* | 5/2017 | Mizuno | B41M 5/3333 |

FOREIGN PATENT DOCUMENTS

| | | |
|---|---|---|
| CN | 103826856 A | 5/2014 |
| EP | 2113381 A2 | 4/2009 |
| EP | 2165830 A1 | 3/2010 |
| EP | 2223804 A2 | 9/2010 |
| EP | 2440977 A1 | 4/2012 |
| EP | 2549331 A1 | 1/2013 |
| EP | 2644380 A2 | 10/2013 |
| EP | 2690495 A1 | 1/2014 |
| EP | 2778782 A1 | 9/2014 |
| EP | 3418332 A1 | 12/2018 |
| EP | 3508553 A1 | 7/2019 |
| JP | 2002-202592 A | 7/2002 |
| JP | 2003-005350 A | 1/2003 |
| JP | 2004-309976 A | 11/2004 |
| JP | 2013-205519 A | 10/2013 |
| JP | 2014-024278 A | 2/2014 |
| JP | 2014-162156 A | 9/2014 |
| JP | 2017-132227 A | 8/2017 |
| WO | 2008150441 A1 | 11/2008 |
| WO | 2010/144119 A1 | 12/2010 |
| WO | 2013/043421 A2 | 3/2013 |
| WO | 2013/043493 A1 | 3/2013 |
| WO | WO-2013043493 A1 * | 3/2013 ........... B41C 1/1008 |
| WO | 2014/045783 A1 | 3/2014 |
| WO | 2014/050435 A1 | 4/2014 |
| WO | WO-2015008578 A1 * | 1/2015 ........... B41C 1/1025 |
| WO | 2016/027886 A1 | 2/2016 |
| WO | WO-2016027886 A1 * | 2/2016 ............... G03F 7/11 |
| WO | 2016/052443 A1 | 4/2016 |
| WO | 2017/141882 A1 | 8/2017 |

OTHER PUBLICATIONS

English language translation of the following: Office action dated Apr. 7, 2020 from the JPO in a Japanese patent application No. 2018-551587 corresponding to the instant patent application.

Office action dated Feb. 12, 2021 from the IPO in a Indian patent application No. 201947019537 corresponding to the instant patent application.

Office action dated Jul. 27, 2021 from the INPI in a Brazilian patent application No. BR112019009802-0 corresponding to the instant patent application.

Office Action dated Sep. 2, 2021, issued by the EPO in corresponding EP Patent Application No. 17872234.4.

International Search Report issued in International Application No. PCT/JP2017/040319 dated Feb. 6, 2018.

Written Opinion of the ISA issued in International Application No. PCT/JP2017/040319 dated Feb. 6, 2018.

English language translation of the following: Office action dated Dec. 17, 2021 from the SIPO in a Chinese patent application No. 201780070357.9 corresponding to the instant patent application. This office action translation is submitted now in order to supplement the understanding of the cited references which are being disclosed in the instant Information Disclosure Statement.

Office Action dated Mar. 28, 2022, issued by the EPO in corresponding EP Patent Application No. 17872234.4.

* cited by examiner

RADIATION-SENSITIVE COMPOSITION, PLANOGRAPHIC PRINTING PLATE PRECURSOR, AND PLATE-MAKING METHOD FOR PLANOGRAPHIC PRINTING PLATE

CROSS-REFERENCE TO RELATED APPLICATIONS

This application is a continuation application of International Application No. PCT/JP2017/040319, filed Nov. 8, 2017, the disclosure of which is incorporated herein by reference in its entirety. Further, this application claims priority from Japanese Patent Application No. 2016-223580, filed Nov. 16, 2016, and Japanese Patent Application No. 2017-080570, filed Apr. 14, 2017, the disclosures of which are incorporated herein by reference in their entirety.

BACKGROUND OF THE INVENTION

1. Field of the Invention

The present disclosure relates to a radiation-sensitive composition, a planographic printing plate precursor, and a plate-making method for a planographic printing plate.

2. Description of the Related Art

A planographic printing plate is typically formed of a lipophilic image area that receives ink during the printing process and a hydrophilic non-image area that receives dampening water.

Planographic printing is a method of printing an image by setting a lipophilic image area of a planographic printing plate as an ink receiving unit and a hydrophilic non-image area as a dampening water receiving unit (ink non-receiving unit) by using the property in which water and oily ink repel each other, causing a difference in adhesiveness of ink on the surface of the planographic printing plate, impressing ink on only an image area, and transferring the ink to a printing medium such as paper.

Currently, in a plate-making step of preparing a planographic printing plate from a planographic printing plate precursor, image exposure has been performed using a computer-to-plate (CTP) technology. In other words, the image exposure is performed by directly scanning and exposing a planographic printing plate precursor using a laser or a laser diode without utilizing a lith film.

From the growing interest in the global environment, environmental problems related to a waste liquid associated with wet treatments such as a development treatment have been highlighted in regard to plate-making for a planographic printing plate precursor. Along with this, it is desired to simplify a development treatment or not to perform a development treatment. As one of simple development treatments, a method referred to as "on-press development" has been suggested. The on-press development is a method of image-exposing a planographic printing plate precursor, mounting the planographic printing plate precursor on a printing press without performing a wet development treatment of the related art, and then removing a non-image area of an image recording layer, at an initial stage of a typical printing step.

As planographic printing plate precursors of the related art, those described in U.S. Pat. No. 7,524,614B or WO2016/052443A have been known.

SUMMARY OF THE INVENTION

In the field of a planographic printing plate precursor, it is required that a planographic printing plate in which the strength of an image recording layer is high and the number of sheets that can be printed is large, in other words, a planographic printing plate having excellent printing durability, can be prepared.

For example, in a region which is deviated from an irradiation center position of laser light used for exposure and is irradiated with a low-output laser in the field of a planographic printing plate precursor, from the viewpoint of tone reproducibility (definition enhancement) of a planographic printing plate to be obtained, it is required that polymerization of a radical polymerizable component does not proceed and an image recording layer in such a region is removed by development.

Here, in order to improve the printing durability, it is important that the polymerization reaction efficiently proceeds even with a small amount of radicals. Further, in order to improve the tone reproducibility, it is important that the polymerization reaction does not proceed in irradiation with a low-output laser.

In other words, the mechanisms for obtaining two effects of improving the printing durability and improving the tone reproducibility are contradictory to each other and it is difficult to achieve both effects.

An object of an embodiment of the present invention is to provide a radiation-sensitive composition from which a planographic printing plate with excellent printing durability and tone reproducibility is obtained.

An object of another embodiment of the present invention is to provide a planographic printing plate precursor from which a planographic printing plate with excellent printing durability and tone reproducibility is obtained.

An object of a still another embodiment of the present invention is to provide a plate-making method for a planographic printing plate with excellent printing durability and tone reproducibility.

The means for achieving the above-described objects includes the following aspects.

<1> A radiation-sensitive composition, comprising:
a radical initiator;
a radical polymerizable component; and
a radiation absorption compound,
in which the radiation-sensitive composition shows two or more peaks of a radical generation amount in a radical generation amount-versus-time curve after exposure to image forming radiation.

<2> The radiation-sensitive composition according to <1>, in which a peak interval between a peak of the radical generation amount which is initially generated with respect to time after the exposure to the image forming radiation and at least one of peaks of the radical generation amount which are generated subsequent to the initially generated peak, among the peaks of the radical generation amount, is 40 ms or greater.

<3> The radiation-sensitive composition according to <1> or <2>, in which at least one of peaks of the radical generation amount which are generated subsequent to the initially generated peak with respect to the time after exposure to the image forming radiation, among the peaks of the radical generation amount, is a peak derived from a decomposition product of the radiation absorption compound.

<4> The radiation-sensitive composition according to any one of <1> to <3>, in which the radical initiator contains an electron-donating radical initiator, and the radiation absorption compound contains a compound which is decomposable to generate a radical due to exposure to the image forming radiation.

<5> The radiation-sensitive composition according to any one of <1> to <3>, in which the radical initiator contains an electron-donating radical initiator and an electron-accepting radical initiator.

<6> The radiation-sensitive composition according to <5>, in which a difference between a highest occupied molecular orbital of the radiation absorption compound and a highest occupied molecular orbital of the electron-donating radical initiator is 0.61 eV or greater.

<7> The radiation-sensitive composition according to <5> or <6>, in which a difference between a lowest unoccupied molecular orbital of the electron-accepting radical initiator and a lowest unoccupied molecular orbital of the radiation absorption compound is 0.90 eV or less.

<8> A planographic printing plate precursor, comprising:
a support; and
an image recording layer which contains a radical initiator, a radical polymerizable component, and a radiation absorption compound, and in which the image recording layer shows two or more peaks of a radical generation amount in a radical generation amount-versus-time curve after exposure to image forming radiation.

<9> The planographic printing plate precursor according to <8>, further comprising: a protective layer on the image recording layer.

<10> The planographic printing plate precursor according to <8> or <9>, in which a peak interval between a peak of the radical generation amount which is initially generated with respect to time after the exposure to the image forming radiation and at least one of peaks of the radical generation amount which are generated subsequent to the initially generated peak, among the peaks of the radical generation amount, is 40 ms or greater.

<11> The planographic printing plate precursor according to any one of <8> to <10>, in which at least one of peaks of the radical generation amount which are generated subsequent to the initially generated peak with respect to the time after exposure to the image forming radiation, among the peaks of the radical generation amount, is a peak derived from a decomposition product of the radiation absorption compound.

<12> The planographic printing plate precursor according to any one of <8> to <11>, in which the radical initiator contains an electron-donating radical initiator, and the radiation absorption compound contains a compound which is decomposable to generate a radical due to exposure to the image forming radiation.

<13> The planographic printing plate precursor according to any one of <8> to <11>, in which the radical initiator contains an electron-donating radical initiator and an electron-accepting radical initiator.

<14> The planographic printing plate precursor according to <13>, in which a difference between a highest occupied molecular orbital of the electron-donating radical initiator and a highest occupied molecular orbital of the radiation absorption compound is 0.61 eV or greater.

<15> The planographic printing plate precursor according to <13> or <14>, in which a difference between a lowest unoccupied molecular orbital of the electron-accepting radical initiator and a lowest unoccupied molecular orbital of the radiation absorption compound is 0.90 eV or less.

<16> The planographic printing plate precursor according to any one of <8> to <15>, further comprising: an interlayer between the support and the image recording layer.

<17> The planographic printing plate precursor according to any one of <8> to <16>, in which the radiation absorption compound is an infrared absorption compound.

<18> The planographic printing plate precursor according to any one of <8> to <17>, in which the image recording layer is removable by any one or both of dampening water and printing ink.

<19> A plate-making method for a planographic printing plate, the method comprising the steps of:
subjecting the planographic printing plate precursor according to any one of <8> to <17> to image-wise light exposure; and
removing a non-image area of an image recording layer from the exposed planographic printing plate precursor in the presence of a developer having a pH of 2 to 14.

<20> A plate-making method for a planographic printing plate, the method comprising the steps of:
subjecting the planographic printing plate precursor according to any one of <8> to <18> to image-wise light exposure; and
supplying any one or both of printing ink and dampening water on a printing press to remove a non-image area of an image recording layer.

According to an embodiment of the present invention, it is possible to provide a radiation-sensitive composition from which a planographic printing plate with excellent printing durability and tone reproducibility is obtained.

According to another embodiment of the present invention, it is possible to provide a planographic printing plate precursor from which a planographic printing plate with excellent printing durability and tone reproducibility is obtained.

According to still another embodiment of the present invention, it is possible to provide a plate-making method for a planographic printing plate with excellent printing durability and tone reproducibility.

DESCRIPTION OF THE PREFERRED EMBODIMENTS

Figure 1:
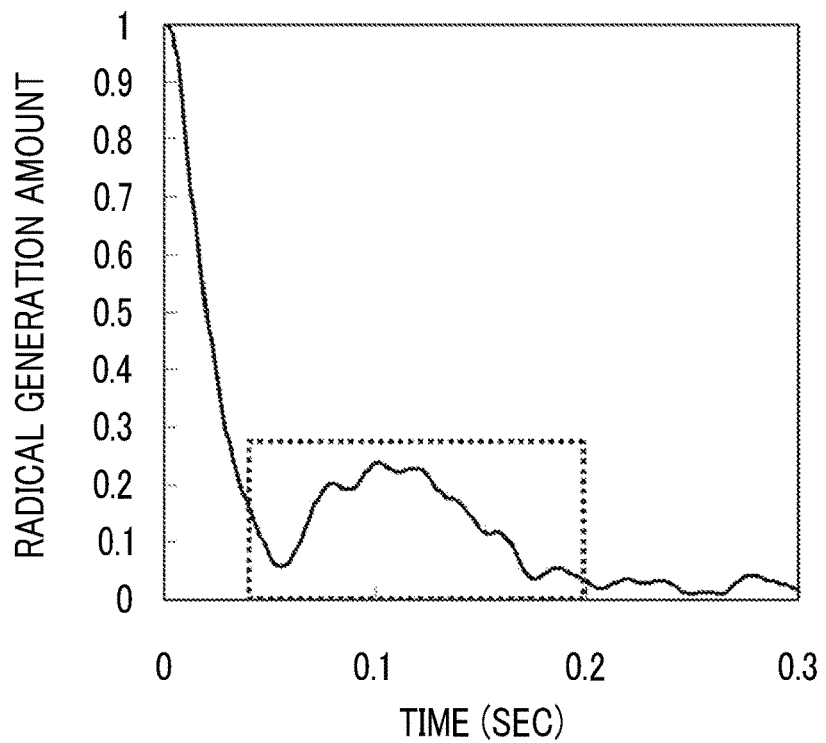
FIG. 1 is a graph showing an example of a radical generation amount-versus-time curve for a radiation-sensitive composition according to the present disclosure.

Hereinafter, the present disclosure will be described in detail.

Further, in the present specification, the description of "a numerical value xx to a numerical value yy" indicates a numerical value range including xx and yy.

In the present specification, "(meth)acryl" indicates both or any one of acryl or methacryl, and "(meth)acrylate" indicates both or any one of acrylate or methacrylate.

In the present specification, "% by mass" has the same definition as that for "% by weight", and "part(s) by mass" has the same definition as that for "part(s) by weight". Further, in the present specification, a combination of two or more preferred aspects is a more preferred aspect.

In the present specification, in a case where substitution or unsubstitution is not noted in regard to the notation of a group in a compound represented by a formula and the group may further include a substituent, the group includes not only an unsubstituted group but also a group having a substituent unless otherwise specified. For example, in the description of "R represents an alkyl group, an aryl group, or a heterocyclic group" related to a formula, this sentence indicates that "R represents an unsubstituted alkyl group, a substituted alkyl group, an unsubstituted aryl group, a substituted aryl group, an unsubstituted heterocyclic group, or a substituted heterocyclic group".

In the present specification, the term "step" indicates not only an independent step but also a step which cannot be clearly distinguished from other steps as long as the intended purpose of the step is achieved.

(Radiation-Sensitive Composition)

A radiation-sensitive composition according to the embodiment of the present disclosure includes a radical initiator, a radical polymerizable component, and a radiation absorption compound, and shows two or more peaks of a radical generation amount in a radical generation amount-versus-time curve after exposure to image forming radiation.

Further, it is preferable that the radiation-sensitive composition according to the embodiment of the present disclosure is used to form an image recording layer of a planographic printing plate precursor.

As the result of intensive research conducted by the present inventors, it was found that both of improvement of printing durability and improvement of tone reproducibility are achieved in a case where the radiation-sensitive composition according to the embodiment of the present disclosure, a planographic printing plate precursor according to the embodiment of the present disclosure, or a plate-making method for a planographic printing plate according to the embodiment of the present disclosure is used.

The detailed mechanisms for obtaining the above-described effects are not clear, but can be speculated as follows.

As the intensive research conducted by the present inventors, it was found that generation of a relatively small amount of radicals for a long period of time is preferred to generation of a large amount of radicals in a short time in a case where the total generation amounts of radicals are the same as each other because the reaction rate of the radical polymerizable component is improved, the curability of the image recording layer is improved, and the printing durability of a planographic printing plate to be obtained is improved.

Accordingly, it was found that the printing durability of a planographic printing plate to be obtained is improved by designing the radiation-sensitive composition or the planographic printing plate precursor to have two or more peaks of the radical generation amount in the radical generation amount-versus-time curve at the time of exposure to radiation.

Further, it was found that radicals are unlikely to be generated and the tone reproducibility of a planographic printing plate to be obtained is improved in a region where such a radiation-sensitive composition or the planographic printing plate precursor according to the embodiment of the present disclosure is exposed to low-output image forming radiation.

<Peaks of Radical Generation Amount>

The radical generation amount-versus-time curve having two or more peaks of the radical generation amount after exposure to image forming radiation is confirmed by measurement based on nano transient absorption.

The radical generation amount-versus-time curve is a curve obtained by plotting the time on the horizontal axis and the radical generation amount on the vertical axis and connecting each plotted point with a straight line.

Specifically, the radiation-sensitive composition applied to a quartz substrate and then dried by setting the dry coating amount to 1.19 $g/m^2$ is irradiated with a nanosecond laser pulse having a wavelength used as image forming radiation. In synchronization with the nanosecond laser pulse, laser light (a wavelength at which a radical to be observed has absorption) for a monitor is oscillated, and a change in photon number of the laser light for a monitor over time is detected by a photomultiplier tube (PMT) so that the measurement is performed using a measurement technique using an oscilloscope.

The measurement is performed at room temperature (25° C.), and millisecond (ms) is used as the scale of the measurement time.

The coating is performed according to a bar coating method, and the drying is performed in an oven. The temperature and the time of drying the composition in an oven may be determined depending on the radiation-sensitive composition. For example, the composition may be dried at 120° C. for 40 seconds.

In a case where a decomposition type radiation absorption compound described below is used as the radiation absorption compound, it is preferable that the drying temperature is set to be lower than or equal to the decomposition temperature of the decomposition type radiation absorption compound.

In the radical generation amount-versus-time curve obtained by the above-described measurement, a peak immediately after the exposure is set to 0 ms, and a range therefrom to 15 ms is extracted, and an attenuation curve is curve-fitted using an exponential function represented by Equation C. The fitted peak is set as a peak (first peak) of the radical generation amount which is initially generated.

$$I = I_0 \exp(-t/\tau) \qquad \text{(Equation C)}$$

$I_0$ represents a radical generation amount immediately after exposure (t=0), I represents a radical generation amount at time t, and τ represents a radical lifetime.

The first peak is subtracted from the radical generation amount-versus-time curve, and remaining peaks are set as peaks of the radical generation amount to be generated subsequent to the initially generated peak (peaks subsequent to the initially generated peak).

A plurality of the peaks subsequent to the initially generated peak may be present.

FIG. 1 shows an example of a radical generation amount-versus-time curve for a radiation-sensitive composition according to the embodiment of the present disclosure.

FIG. 1 shows that the peak (first peak) of the radical generation amount which is initially generated immediately after exposure (0 ms) is present and a plurality of peaks (peaks subsequent to the initially generated peak) of the radical generation amount which are generated subsequent to the initially generated peak are present in a region (50 ms to 200 ms) enclosed by the dotted line.

Further, the composition of the radiation-sensitive composition used in the measurement is as listed in the following table.

TABLE 1

| | Coating amount (g/m²) |
|---|---|
| NK ESTER A-9300-40M | 0.2066 |
| Compound 1-1 | 0.2025 |
| Compound 1-2 | 0.0099 |
| Compound 1-3 | 0.0233 |
| Compound 1-4 | 0.0278 |
| Compound 1-5 | 0.1838 |
| Compound 1-6 | 0.0450 |
| Hoku-boron-NA (TPB) | 0.0094 |
| TINUVIN 405 | 0.0400 |
| Lower-molecular-weight hydrophilic compound (1) | 0.0599 |
| AMINOCOAT | 0.0047 |
| TANAC | 0.0387 |
| Microgel (1) | 0.3308 |
| F781F (10% aq) | 0.0040 |

The abbreviations in the table are as follows.

NK ESTER A-9300-40M: tris(acryloyloxyethyl)isocyanurate, (NK ESTER A-9300, manufactured by Shin-Nakamura Chemical Co., Ltd.)

Compound 1-1: compound 1-1 with the following structure

Compound 1-2: compound 1-2 with the following structure

Compound 1-3: compound 1-3 with the following structure

Compound 1-4: compound 1-4 with the following structure

Compound 1-5: compound 1-5 with the following structure

Compound 1-6: compound 1-6 with the following structure

Hoku-boron-NA (TPB): sodium tetraphenyl borate (manufactured by Hokko Chemical Industry Co., Ltd.)

TINUVIN 405 (UV-528): reaction product of 2-(2,4-dihydroxyphenyl)-4,6-bis-(2,4-dimethylphenyl)-1,3,5-triazine and (2-ethylhexyl)-glycidic acid ester (manufactured by BASF SE)

AMINOCOAT: trimethyl glycine (manufactured by Asahi Kasei Corporation)

TANAC: tris(2-hydroxyethyl)isocyanurate

Microgel (1): microgel obtained using the following preparation method

F781F (10% aq): fluorine-based surfactant (manufactured by DIC Corporation)

The structures of the compounds 1-1 to 1-6 and a low-molecular-weight hydrophilic compound (1) are shown below. Further, Me represents a methyl group, and each number on the lower right side of the parentheses of each constitutional unit of the following polymer indicates the molar ratio.

Compound 1-1

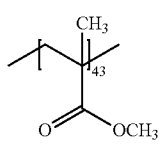

Compound 1-2

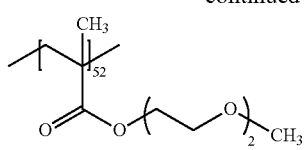

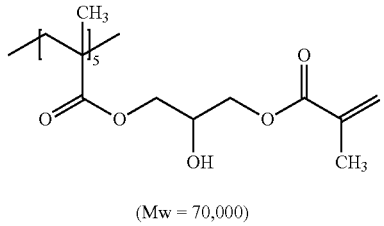

(Mw = 70,000)

Compound 1-3

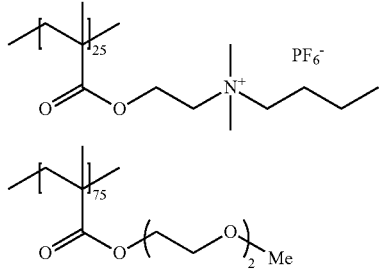

Compound 1-4

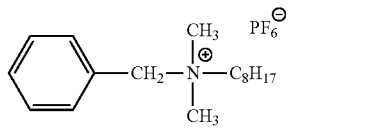

Compound 1-5

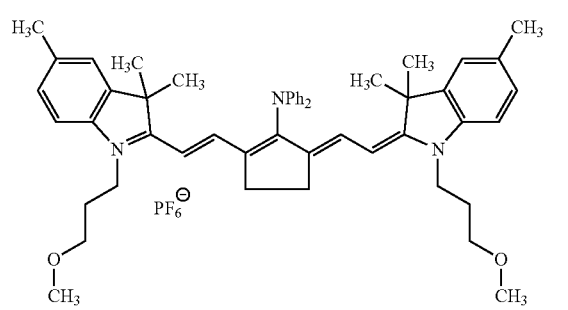

Compound 1-6

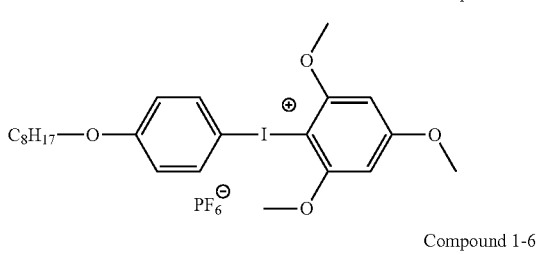

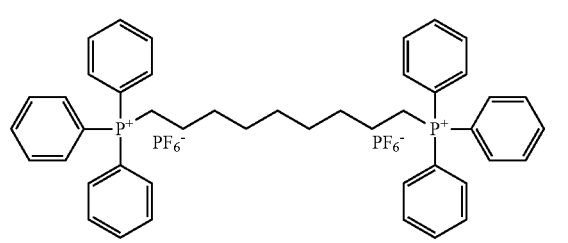

-continued

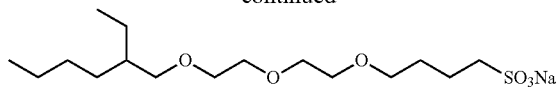

Low-molecular-weight hydrophilic compound (1)

A method of preparing the microgel (1) is described below.

—Preparation of Polyvalent Isocyanate Compound (1)—

0.043 parts of bismuth tris(2-ethylhexanoate) (NEO-STANN U-600 (manufactured by NITTO KASEI CO., LTD.)) is added to an ethyl acetate (25.31 parts) suspension solution of 17.78 parts (80 mmol) of isophorone diisocyanate and 7.35 parts (20 mmol) of the following polyhydric phenol compound (1) and the solution is stirred. The reaction temperature is set to 50° C. at the time of heat generation being subsided, and the solution is stirred for 3 hours, thereby obtaining an ethyl acetate (50% by mass) solution of a polyvalent isocyanate compound (1).

compound (1)

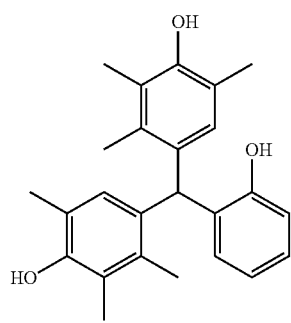

Polyhydric phenol

—Preparation of Microgel (1)—

The following oil phase components and water phase components are mixed and emulsified at 12000 rpm for 10 minutes using a homogenizer. The obtained emulsion is stirred at 45° C. for 4 hours, 5.20 parts of a 10 mass % aqueous solution of 1,8-diazabicyclo[5.4.0]undeca-7-ene-octylate (U-CAT SA102, manufactured by San-Apro Ltd.) is added thereto, and the solution is stirred at room temperature for 30 minutes and allowed to stand at 45° C. for 24 hours. The concentration of solid contents is adjusted to 20% by mass using distilled water, thereby obtaining an aqueous dispersion of the microgel (1). The number average particle diameter thereof is measured using a laser diffraction scattering type particle size distribution measuring device (LA-920, manufactured by Horiba Ltd.) according to a light scattering method, and the value is 0.28 µm.

In the radiation-sensitive composition according to the embodiment of the present disclosure, from the viewpoint of improving the printing durability, a peak interval between a peak of the radical generation amount which is initially generated with respect to the time after the exposure to the image forming radiation and at least one of peaks of the radical generation amount which are generated subsequent to the initially generated peak, among the peaks of the radical generation amount, is preferably 30 ms or greater, more preferably 40 ms or greater, still more preferably in a range of 40 ms to 500 ms, and even still more preferably in a range of 50 ms to 300 ms.

In the radiation-sensitive composition according to the embodiment of the present disclosure, from the viewpoint of achieving both of printing durability and tone reproducibility, it is preferable that at least one of peaks of the radical generation amount which are generated subsequent to the initially generated peak with respect to the time after exposure to the image forming radiation, among the peaks of the radical generation amount, is a peak derived from a decomposition product of the radiation absorption compound.

For example, in a case where the radiation-sensitive composition contains a decomposition type radiation absorption compound described below, at least one of peaks of the radical generation amount which are generated subsequent to the initially generated peak with respect to the time becomes a peak derived from a decomposition product of the radiation absorption compound.

[Image Forming Radiation]

Examples of the image forming radiation according to the present disclosure include infrared light, visible light, ultraviolet light, and electron beams, but infrared light is preferable and infrared light having a wavelength of 750 nm to 1400 nm is more preferable.

In other words, it is preferable that the radiation absorption compound contained in the radiation-sensitive composition according to the embodiment of the present disclosure is an infrared absorption compound.

In the present disclosure, the infrared absorption compound indicates a compound having a maximum absorption wavelength at a wavelength of 750 nm to 1400 nm.

As a light source of the image forming radiation according to the present disclosure, a light source having an emission wavelength between a near infrared region to an infrared region is preferable, and a solid-state laser or a semiconductor laser is more preferable. Among the examples, in the present disclosure, it is particularly preferable that the image exposure is carried out by a solid-state laser or a semiconductor laser that radiates an infrared ray having a wavelength of 750 nm to 1400 nm.

The output of the laser is preferably 100 mW or greater. Further, in order to reduce the exposure time, it is preferable to use a multi-beam laser device. In addition, the exposure time per one pixel is preferably in a range of 1000 microseconds to 0.001 microseconds, more preferably in a range of 500 microseconds to 0.01 microseconds, and still more preferably in a range of 300 microseconds to 0.1 microseconds.

The energy radiated as the image forming radiation is preferably in a range of 10 mJ/cm$^2$ to 300 mJ/cm$^2$. In a case where the value is in the above-described range, laser ablation is suppressed, and damage to an image can be prevented.

<Aspect of Radiation-Sensitive Composition>

According to a first aspect of the present disclosure, the radiation-sensitive composition (hereinafter, also referred to as a "first radiation-sensitive composition") is a radiation-sensitive composition which includes a radical initiator, a radical polymerizable component, and a radiation absorption compound and in which the radical initiator contains an electron-donating radical initiator, the radiation absorption compound contains a compound that is decomposable to generate a radical due to exposure to the image forming radiation, and shows two or more peaks of a radical generation amount in the radical generation amount-versus-time curve after exposure to image forming radiation.

Further, according to a second aspect of the present disclosure, the radiation-sensitive composition (hereinafter, also referred to as a "second radiation-sensitive composition") is a radiation-sensitive composition which includes a radical initiator, a radical polymerizable component, and a radiation absorption compound and in which the radical initiator contains an electron-donating radical initiator and an electron-accepting radical initiator, and shows two or more peaks of a radical generation amount in the radical generation amount-versus-time curve after exposure to image forming radiation.

Further, the second radiation-sensitive composition also includes an aspect in which the radical initiator includes an electron-donating radical initiator and an electron-accepting radical initiator, and the radiation absorption compound contains a compound that is decomposable to generate a radical due to exposure to the image forming radiation.

<First Radiation-Sensitive Composition>

The first radiation-sensitive composition according to the embodiment of the present disclosure includes a radical initiator, a radical polymerizable component, and a radiation absorption compound. Further, the radical initiator contains an electron-donating radical initiator, and the radiation absorption compound contains a compound that is decomposable to generate a radical due to exposure to the image forming radiation.

For example, the first radiation-sensitive composition generates the first radical and the second radical through the reaction shown by the following reaction formula.

As the results, the first radiation-sensitive composition has two or more peaks of the radical generation amount in the radical generation amount-versus-time curve after exposure to image forming radiation.

the first peak described above and the generation of the second radical corresponds to the peak subsequent to the initially generated peak.

Here, it is speculated that the peak position of the peak subsequent to the initially generated peak is determined based on the stability of the decomposition product of the radiation absorption compound.

[Radical Initiator]

The radical initiator in the first radiation-sensitive composition according to the embodiment of the present disclosure contains an electron-donating radical initiator.

Further, it is preferable that the first radiation-sensitive composition according to the embodiment of the present disclosure does not contain an electron-accepting radical initiator described below as a radical initiator.

—Electron-Donating Radical Initiator—

The electron-donating radical initiator according to the present disclosure is not particularly limited, but an alkyl or arylate complex, an aminoacetic acid compound, a sulfur-containing compound, a tin-containing compound, or sulfinates are preferable, an alkyl group or an arylate complex, an aminoacetic acid compound, or a sulfur-containing compound is more preferable, and a borate compound, a N-phenylglycine compound, or a thiol compound is still more preferable.

<Alkyl or Arylate Complex>

As the alkyl or arylate complex, a borate compound is preferable.

It is considered that a carbon-hetero bond is oxidatively cleaved so that an active radical is generated in the alkyl or arylate complex.

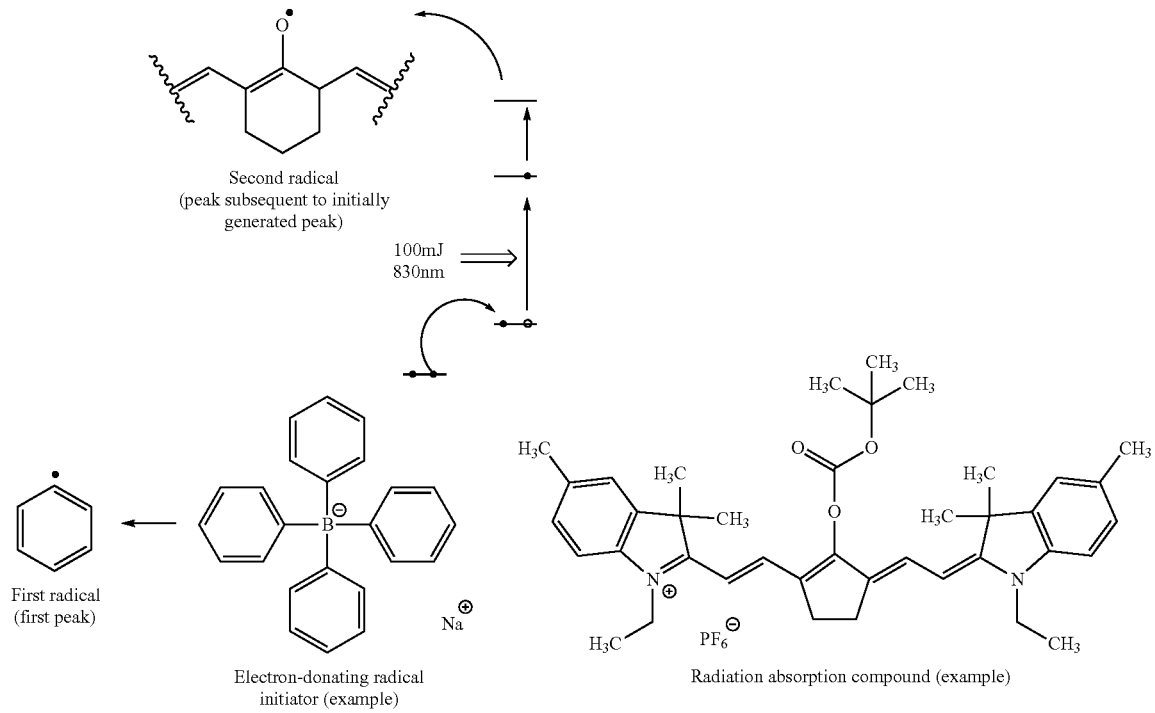

In the reaction formula, first, the first radical is generated from the electron-donating radical initiator at the time of irradiation with image forming radiation. Thereafter, the radiation absorption compound to which electrons have been donated is excited and cleaved so that the second radical is generated. The generation of the first radical corresponds to

[Borate Compound]

As the borate compound, a tetraaryl borate compound or a monoalkyl triaryl borate compound is preferable, a tetraaryl borate compound is more preferable from the viewpoints of the stability of the compound and the potential difference described below, and a tetraaryl borate compound containing one or more aryl groups having an electron-withdrawing group is particularly preferable from the viewpoint of the potential difference described below.

As the electron-withdrawing group, a group in which the σ value of the Hammett's rule is positive is preferable, and a group in which the σ value of the Hammett's rule is in a range of 0 to 1.2 is more preferable. The σ value ($\sigma_p$ value and $\sigma_m$ value) of the Hammett's rule is specifically described in Hansch, C.' Leo, A.' Taft, R. W., Chem. Rev., 1991, 91, 165 to 195.

As the electron-withdrawing group, a halogen atom, a trifluoromethyl group, or a cyano group is preferable, and a fluorine atom, a chlorine atom, a trifluoromethyl group, or a cyano group is more preferable.

As a counter cation of the borate compound, an alkali metal ion or a tetraalkylammonium ion is preferable, a sodium ion, a potassium ion, or a tetrabutylammonium ion is more preferable.

Hereinafter, preferred examples of the borate compound will be described, but the present disclosure is not limited thereto. Here, $X_c^+$ represents a monovalent cation. Among these, an alkali metal ion or a tetraalkylammonium ion is preferable, and an alkali metal ion or a tetrabutylammonium ion is more preferable. Further, Bu represents an n-butyl group.

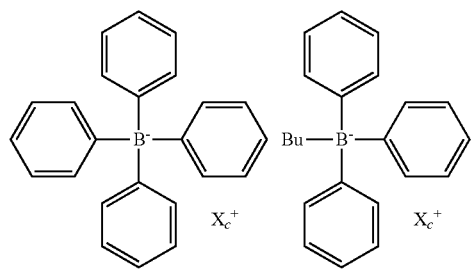

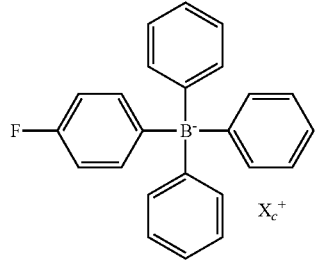

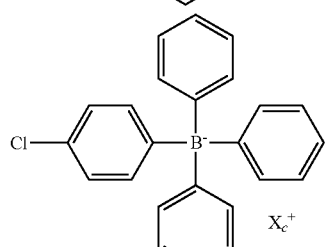

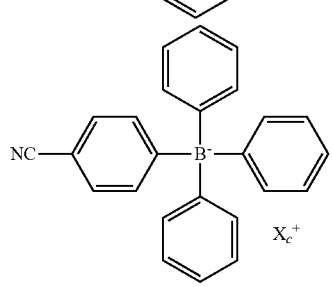

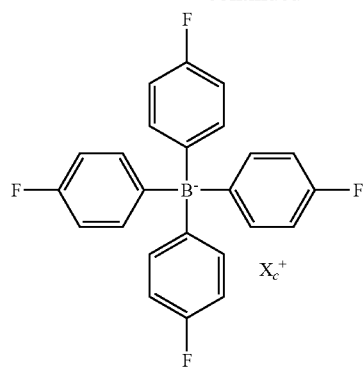

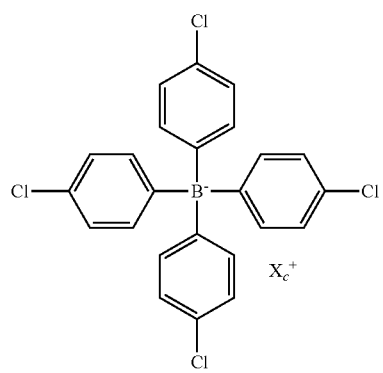

<Aminoacetic Acid Compound>

It is considered that a C—X bond on carbon adjacent to nitrogen is cleaved due to oxidation so that an active radical is generated in the aminoacetic acid compound. As X, a hydrogen atom, a carboxy group, a trimethylsilyl group, or a benzyl group is preferable. Specific examples thereof include a N-phenylglycines (which may have a substituent in the phenyl group) and N-phenyliminodiacetic acid (which may have a substituent in the phenyl group), and a N-phenylglycine compound is preferable.

[N-phenylglycine Compound]

Examples of the N-phenylglycine compound include N-phenylglycine, a N-phenylglycine alkyl ester compound, and a N-phenylglycine compound further having a substituent in a nitrogen atom to which a phenyl group is bonded.

From the viewpoint of the potential difference described below, it is preferable that the N-phenylglycine compound has a substituent in the phenyl group. Preferred examples of the substituent include the above-described electron-withdrawing groups.

Hereinafter, preferred examples of the N-phenylglycine compound will be described, but the present disclosure is not limited thereto.

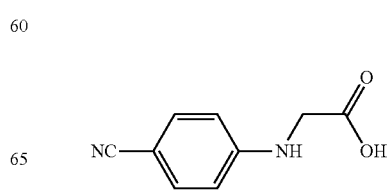

-continued

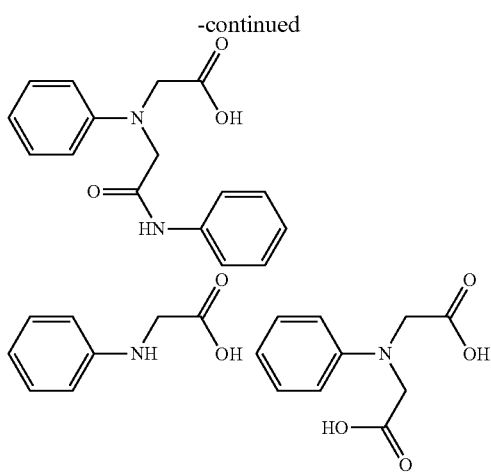

<Sulfur-Containing Compound>

As the sulfur-containing compound, a thiol compound which has a thiol group (—SH group) and generates a radical by cleavage of the thiol group is exemplified.

In addition, a sulfur-containing compound obtained by substituting the nitrogen atom of the above-described aminoacetic acid compound for a sulfur atom can generate an active radical using the same mechanism as that for the aminoacetic acid compound.

As the sulfur-containing compound, a compound containing a thiol group is preferable, a thiol compound having 7 or more carbon atoms is more preferable from the viewpoint of the boiling point (difficulty in volatilization), a compound (aromatic thiol compound) containing a thiol group (mercapto group) on an aromatic ring is still more preferable, and a compound having a 2-mercaptobenzimidazole structure, a 3-mercapto-1,2,4 triazole structure, or a 2-mercaptobenzothiazole structure is particularly preferable.

The hydrogen atom bonded to the nitrogen atom at the 1-position in the 2-mercaptobenzimidazole structure may be substituted, and preferred examples of the substituent include an alkyl group and an aryl group.

Further, the benzene ring structure in the 2-mercaptobenzimidazole structure may have a substituent, and preferred examples of the substituent include an alkyl group, an alkoxy group, and a halogen atom.

The hydrogen atom bonded to the nitrogen atom at the 4-position or the carbon atom at the 5-position in the 3-mercapto-1,2,4 triazole structure may be substituted, and preferred examples of the substituent include an alkyl group and an aryl group.

The benzene ring structure in the 2-mercaptobenzothiazole structure may have a substituent, and preferred examples of the substituent include an alkyl group, an alkoxy group, and a halogen atom.

Hereinafter, preferred examples of the sulfur-containing compound will be described, but the present disclosure is not limited thereto.

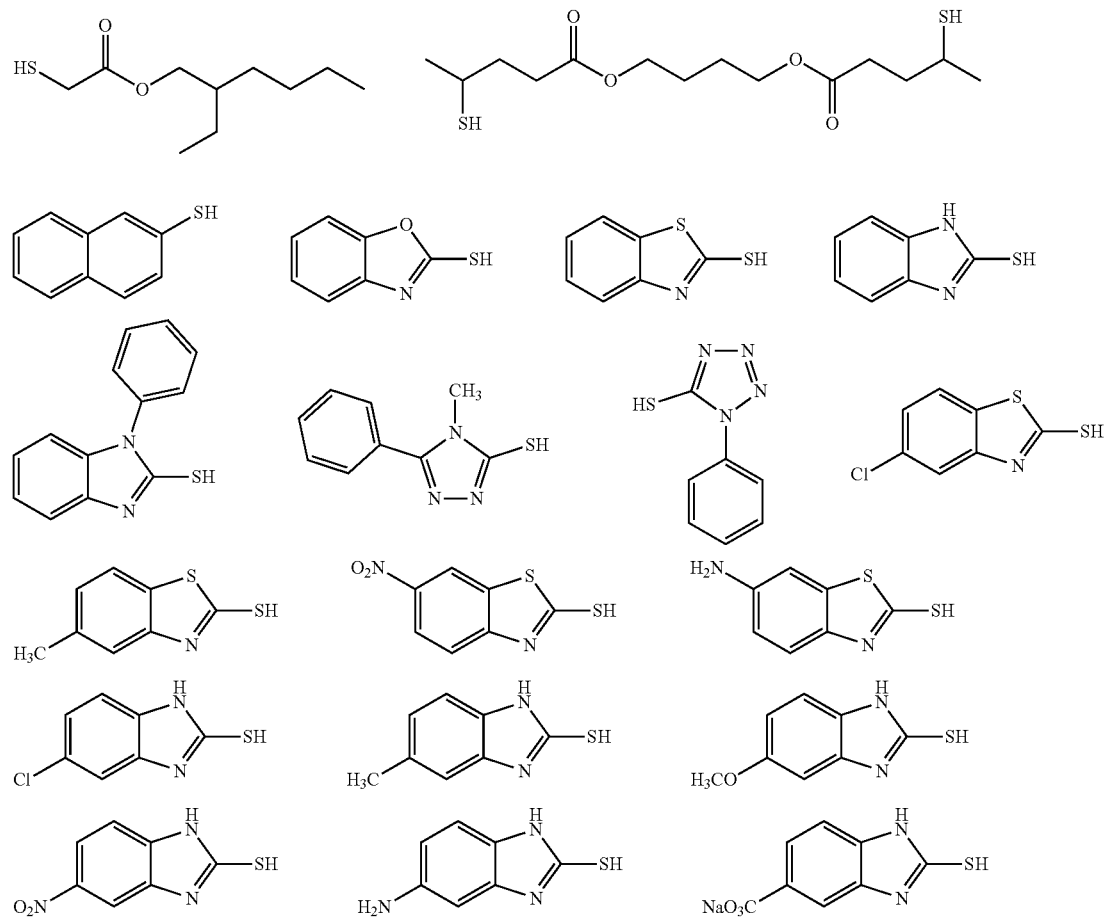

-continued
17
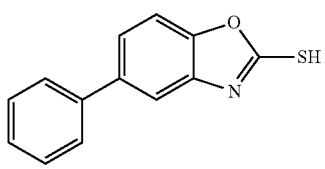
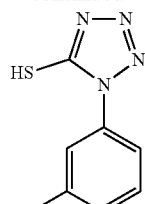
18
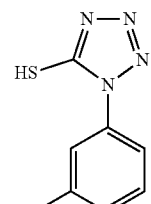
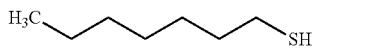
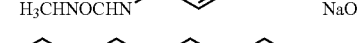
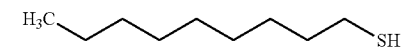
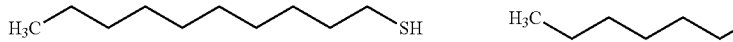
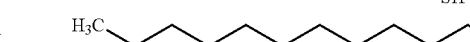
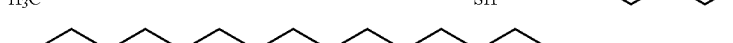
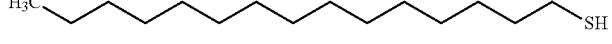
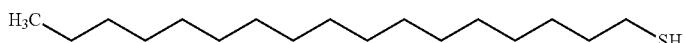
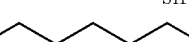
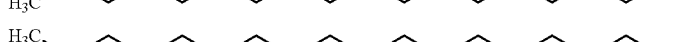
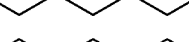
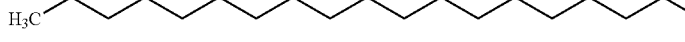
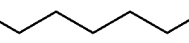
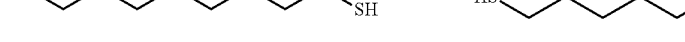
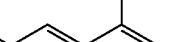
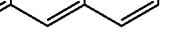
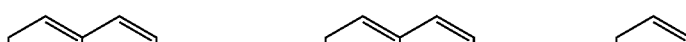
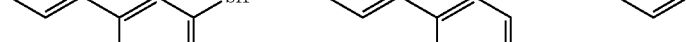

19

<Tin-Containing Compound>

The tin-containing compound is a compound obtained by substituting a nitrogen atom of the above-described aminoacetic acid compound with a tin and can generate an active radical using the same mechanism as described above.

<Sulfinates>

The sulfinates are sulfinate compounds such as sodium arylsulfinate and can generate an active radical through oxidation.

<Content>

In the first radiation-sensitive composition according to the embodiment of the present disclosure, the radical initiator may be used alone or in combination of two or more kinds thereof.

The content of the radical initiator is preferably in a range of 0.01% to 30% by mass, more preferably in a range of 0.05% to 25% by mass, and still more preferably in a range of 0.1% to 20% by mass with respect to the total solid content of the first radiation-sensitive composition. Further, the total solid content in the present disclosure indicates the total amount of components obtained by excluding volatile components such as solvents from the composition.

The volatile component indicates a component whose vapor pressure exceeds 10 mmHg at 25° C.

[Radical Polymerizable Component]

The first radiation-sensitive composition according to the embodiment of the present disclosure contains a radical polymerizable component.

As the radical polymerizable component, an addition polymerizable compound (ethylenically unsaturated compound) having at least one ethylenically unsaturated bond is preferable. As the ethylenically unsaturated compound, a compound having at least one terminal ethylenically unsaturated bond is preferable, and a compound having two or more terminal ethylenically unsaturated bonds is more preferable. The radical polymerizable component may have a chemical form such as a monomer, a pre-polymer, that is, a dimer, a trimer or an oligomer, or a mixture of these.

Examples of the monomer include unsaturated carboxylic acid (such as acrylic acid, methacrylic acid, itaconic acid, crotonic acid, isocrotonic acid, or maleic acid), esters thereof, and amides thereof. Among these, esters of unsaturated carboxylic acid and a polyhydric alcohol compound and amides of unsaturated carboxylic acid and a polyvalent amine compound are preferably used. Further, addition reactants of unsaturated carboxylic acid esters having a nucleophilic substituent such as a hydroxy group, an amino group, or a mercapto group or amides with monofunctional or polyfunctional isocyanates or epoxies; and dehydration condensation reactants with monofunctional or polyfunctional carboxylic acid are suitably used. Moreover, addition reactants of unsaturated carboxylic acid esters having an electrophilic substituent such as an isocyanate group or an epoxy group or amides with monofunctional or polyfunctional alcohols, amines, or thiols; and substitution reactants of unsaturated carboxylic acid esters having a releasable substituent such as a halogen atom or a tosyloxy group or amides with monofunctional or polyfunctional alcohols, amines, or thiols are also suitably used. Further, compound groups in which the above-described unsaturated carboxylic acid is substituted with unsaturated phosphonic acid, styrene, vinyl ether, and the like can also be used. These compounds are described in JP2006-508380A, JP2002-287344A, JP2008-256850A, JP2001-342222A, JP1997-179296A (JP-H09-179296A), JP1997-179297A (JP-H09-179297A), JP1997-179298A (JP-H09-179298A), JP2004-

20

294935A, JP2006-243493A, JP2002-275129A, JP2003-064130A, JP2003-280187A, and JP1998-333321A (JP-H10-333321A).

Specific examples of monomers of esters of a polyhydric alcohol compound and unsaturated carboxylic acid include acrylic acid ester such as ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO)-modified triacrylate, or a polyester acrylate oligomer. Examples of the methacrylic acid ester include tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane, and bis-[p-(methacryloxyethoxy)phenyl]dimethylmethane. Specific examples of monomers of amides of a polyvalent amine compound and unsaturated carboxylic acid include methylene bis-acrylamide, methylene bis-methacrylamide, 1,6-hexamethylene bis-acrylamide, 1,6-hexamethylene bis-methacrylamide, diethylene triamine trisacrylamide, xylylene bisacrylamide, and xylylene bismethacrylamide.

Moreover, a urethane-based addition polymerizable compound produced by using an addition reaction of isocyanate and a hydroxy group is also suitable, and specific examples of such a compound include a vinyl urethane compound which is formed by adding a vinyl monomer containing a hydroxy group represented by Formula (M) to a polyisocyanate compound that has two or more isocyanate groups in one molecule described in JP1973-041708B (JP-S48-041708B) and contains two or more polymerizable vinyl groups in one molecule.

$$CH_2=C(R^{M4})COOCH_2CH(R^{M5})OH \qquad (M)$$

In Formula (M), $R^{M4}$ and $R^{M5}$ each independently represent a hydrogen atom or a methyl group.

In addition, urethane acrylates described in JP1976-037193A (JP-S51-037193A), JP1990-032293B (JP-H02-032293B), JP1990-016765B (JP-H02-016765B), JP2003-344997A, and JP2006-065210A; urethane compounds having an ethylene oxide-based skeleton described in JP1983-049860B (JP-S58-049860B), JP1981-017654B (JP-S56-017654B), JP1987-039417B (JP-S62-039417B), JP1987-039418B (JP-S62-039418B), JP2000-250211A, and JP2007-094138A; and urethane compounds having a hydrophilic group described in U.S. Pat. No. 7,153,632B, JP1996-505958A (JP-H08-505958A), JP2007-293221A, and JP2007-293223A are also suitable.

In the first radiation-sensitive composition, the radical polymerizable component may be used alone or in combination of two or more kinds thereof.

The content of the radical polymerizable component is preferably in a range of 5% to 75% by mass, more preferably in a range of 10% to 70% by mass, and particularly preferably in a range of 15% to 60% by mass with respect to the total solid content of the first radiation-sensitive composition.

[Radiation Absorption Compound]

The first radiation-sensitive composition contains a radiation absorption compound.

The radiation absorption compound in the first radiation-sensitive composition is a compound (hereinafter, also referred to as a decomposition type radiation absorption compound") which is decomposed after exposure to image forming radiation to generate a radical in the presence of the above-described electron-donating radical initiator.

The decomposition type radiation absorption compound is not particularly limited, and examples thereof include a compound represented by Formula 1.

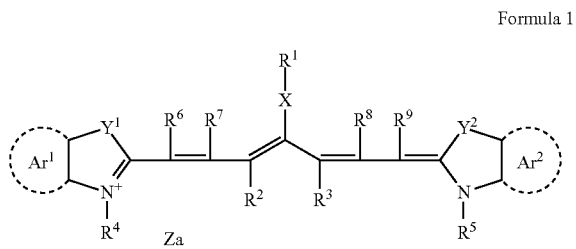

Formula 1

In Formula 1, $R^1$ represents a group capable of cleaving $R^1$—X bond due to exposure to image forming radiation, X represents —O—, —S—, or —$NR^N$—, $R^N$ represents a hydrocarbon group, $R^2$ and $R^3$ each independently represent a hydrogen atom or an alkyl group, $R^2$ and $R^3$ may be linked to each other to form a ring, $Ar^1$ and $Ar^2$ each independently represent a group that forms a benzene ring or a naphthalene ring, $Y^1$ and $Y^2$ each independently represent an oxygen atom, a sulfur atom, —$NR^O$—, or a dialkylmethylene group, $R^4$ and $R^5$ each independently represent an alkyl group, $R^6$ to $R^9$ each independently represent a hydrogen atom or an alkyl group, $R^O$ represents a hydrogen atom, an alkyl group, or an aryl group, and Za represents a counter ion that neutralizes the charge.

$R^1$ represents a group capable of cleaving the $R^1$—X bond due to exposure to image forming radiation. Specific examples thereof include a group in which the decomposition or isomerization reaction proceeds due to externally applied thermal energy, energy generated in a case where a compound represented by Formula 1 absorbs image forming radiation such as infrared rays and the state thereof is returned to the ground state from the excited state that has occurred, or the chemical reaction which proceeds from the excited state, and an $R^1$—X bond is cleaved.

In the first radiation-sensitive composition according to the embodiment of the present disclosure, a radical is generated due to this cleavage. As described above, it is considered that, since this cleavage is generated by electron transfer or the like, radicals are generated a little later than the generation of the first radical so that the peaks subsequent to the initially generated peak is formed.

A preferable aspect of $R^1$ will be described below.

As the alkyl group as $R^2$ to $R^9$ and $R^O$, an alkyl group having 1 to 30 carbon atoms is preferable, an alkyl group having 1 to 15 carbon atoms is more preferable, and an alkyl group having 1 to 10 carbon atoms is still more preferable. The alkyl group may have a linear, branched, or ring structure.

Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eicosyl group, an isopropyl group, an isobutyl group, an s-butyl group, a t-butyl group, an isopentyl group, a neopentyl group, a 1-methylbutyl group, an isohexyl group, a 2-ethylhexyl group, a 2-methylhexyl group, a cyclohexyl group, a cyclopentyl group, and a 2-norbornyl group.

Among these alkyl groups, a methyl group, an ethyl group, a propyl group, or a butyl group is particularly preferable.

Further, the alkyl group may have a substituent. Examples of the substituent include an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and groups formed by combining these groups.

As the aryl group represented by $R^O$, an aryl group having 6 to 30 carbon atoms is preferable, an aryl group having 6 to 20 carbon atoms is more preferable, and an aryl group having 6 to 12 carbon atoms is still more preferable.

Further, the aryl group may have a substituent. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and groups formed by combining these groups.

Specific examples thereof include a phenyl group, a naphthyl group, a p-tolyl group, a p-chlorophenyl group, a p-fluorophenyl group, a p-methoxyphenyl group, a p-dimethylaminophenyl group, a p-methylthiophenyl group, and a p-phenylthiophenyl group.

Among these examples of the aryl group, a phenyl group, a p-methoxyphenyl group, a p-dimethylaminophenyl group, or a naphthyl group is preferable.

It is preferable that $R^2$ and $R^3$ are linked to each other to form a ring.

In a case where $R^2$ and $R^3$ are linked to each other to form a ring, a 5- or 6-membered ring is preferable, and a 6-membered ring is most preferable.

$Y^1$ and $Y^2$ each independently represents an oxygen atom, a sulfur atom, —$NR^O$—, or a dialkylmethylene group, a —$NR^O$— or a dialkylmethylene group is preferable, and a dialkylmethylene group is more preferable.

$R^O$ represents a hydrogen atom, an alkyl group, or an aryl group and preferably an alkyl group.

It is preferable that $R^4$ and $R^5$ represent the same group.

Further, $R^4$ and $R^5$ each independently represent preferably a linear alkyl group or an alkyl group having a sulfonate group at the terminal and more preferably a methyl group, an ethyl group, or a butyl group having a sulfonate group at the terminal.

Further, the counter cation of the sulfonate group may be a quaternary ammonium group in Formula 1, or an alkali metal cation or an alkaline earth metal cation.

Further, from the viewpoint of improving the solubility of the compound represented by Formula 1 in water, $R^4$ and $R^5$ each independently represent preferably an alkyl group having an anion structure, more preferably an alkyl group having a carboxylate group or a sulfonate group, and still more preferably an alkyl group having a sulfonate group at the terminal.

Further, from the viewpoints of making the maximum absorption wavelength of the compound represented by formula 1 longer, easily generating a radical, and improving the printing durability of the planographic printing plate, $R^4$ and $R^5$ each independently represent preferably an alkyl group having an aromatic ring, more preferably an alkyl group having an aromatic ring at the terminal, and particularly preferably a 2-phenylethyl group, a 2-naphthalenyl ethyl group, or a 2-(9-anthracenyl) ethyl group.

$R^6$ to $R^9$ each independently represent a hydrogen atom or an alkyl group and preferably a hydrogen atom.

Ar$^1$ and Ar$^2$ each independently represent a group that forms a benzene ring or a naphthalene ring. The group may have a substituent on the benzene ring or naphthalene ring. Examples of the substituent include an alkyl group, an alkoxy group, an aryloxy group, an amino group, an alkylthio group, an arylthio group, a halogen atom, a carboxy group, a carboxylate group, a sulfo group, a sulfonate group, an alkyloxycarbonyl group, an aryloxycarbonyl group, and groups formed by combining these groups. Among these, an alkyl group is preferable.

Further, from the viewpoints of making the maximum absorption wavelength of the compound represented by formula 1 longer, easily generating a radical, and improving the printing durability of the planographic printing plate, Ar$^1$ and Ar$^2$ each independently represent preferably a group that forms a naphthalene ring or a benzene ring having an alkyl group or an alkoxy group as a substituent, more preferably a group that forms a naphthalene ring or a benzene ring having an alkoxy group as a substituent, and particularly preferably a group that forms a naphthalene ring or a benzene ring having a methoxy group as a substituent.

Za represents a counter ion that neutralizes the charge. In a case where Za represents the anion species, examples thereof include a sulfonate ion, a carboxylate ion, a tetrafluoroborate ion, a hexafluorophosphate ion, a p-toluenesulfonate ion, and a perchlorate ion. Among these, a hexafluorophosphate ion is particularly preferable. In a case where Za represents the cation species, an alkali metal ion, an alkaline earth metal ion, an ammonium ion, a pyridinium ion, or a sulfonium ion is preferable, a sodium ion, a potassium ion, an ammonium ion, a pyridinium ion, or a sulfonium ion is more preferable, and a sodium ion, a potassium ion, or an ammonium ion is still more preferable.

R$^1$ to R$^9$, R$^0$, Ar$^1$, Ar$^2$, Y$^1$, and Y$^2$ may have an anion structure or a cation structure. In a case where all of R$^1$ to R$^9$, R$^0$, Ar$^1$, Ar$^2$, Y$^1$, and Y$^2$ represent a neutrally charged group, Za represents a monovalent counter anion. However, for example, in a case where R$^1$ to R$^9$, R$^0$, Ar$^1$, Ar$^2$, Y$^1$, and Y$^2$ have two or more anion structures, Za may represent a counter cation.

From the viewpoint of easily generating a radical, R$^1$—X— in Formula 1 represents preferably a group represented by any of Formulae 1-1 to 1-10, more preferably a group represented by any of Formulae 1-1 to 1-3 and Formulae 1-8 to 1-10, and still more preferably a group represented by Formula 1-10. Further, in a case where R$^1$—X in Formula 1 represents a group represented by Formula 1-10, the compound represented by Formula 1 contains a terminal ethylenically unsaturated group at the terminal of the compound. The position of the terminal ethylenically unsaturated group is not limited as long as the group is present at the terminal of the compound represented by Formula 1, but it is preferable that the terminal ethylenically unsaturated group is included in the substituent of R$^4$, R$^5$, Ar$^1$, or Ar$^2$ in Formula 1 or R$^{31}$ in Formula 1-10.

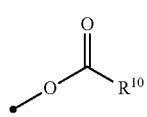

Formula 1-1

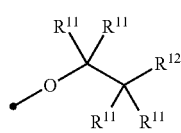

Formula 1-2

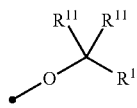

Formula 1-3

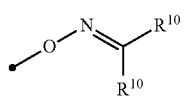

Formula 1-4

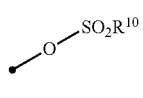

Formula 1-5

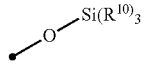

Formula 1-6

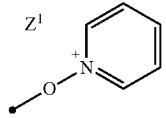

Formula 1-7

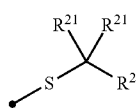

Formula 1-8

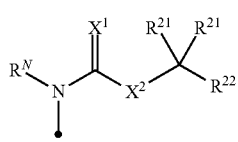

Formula 1-9

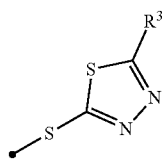

Formula 1-10

In Formulae 1-1 to 1-10, "●" represents a bonding site with respect to the carbon atom to which X of Formula 1 is bonded, R$^{10}$'s each independently represent a hydrogen atom, an alkyl group, an alkenyl group, an aryl group, —OR$^{14}$, —NR$^{15}$R$^{16}$, or —SR$^{17}$, R$^{11}$'s each independently represent a hydrogen atom, an alkyl group, or an aryl group, R$^{12}$ represents an aryl group, —OR$^{14}$, —NR$^{15}$R$^{16}$, —SR$^{17}$, —C(=O)R$^{18}$, —OC(=O)R$^{18}$, or a halogen atom, R$^{13}$ represents an aryl group, an alkenyl group, an alkoxy group, or an onium group, R$^{14}$ to R$^{17}$ each independently represent a hydrogen atom, an alkyl group, or an aryl group, R$^{18}$'s each independently represent an alkyl group, an aryl group, —OR$^{14}$, —NR$^{15}$R$^{16}$, or —SR$^{17}$, R$^N$ represents a hydrocarbon group, X$^1$ and X$^2$ each independently represent an oxygen atom or a sulfur atom, R$^{21}$'s each independently represent a hydrogen atom, an alkyl group, or an aryl group, R$^{22}$ represents an aryl group, an alkenyl group, an alkoxy group, or an onium group, R$^{31}$ represents an alkyl group, an aryl group, or an aralkyl group, and Z$^1$ represents a counter ion that neutralizes the charge.

The preferable aspects in a case where R$^{10}$, R$^{11}$, and R$^{14}$ to R$^{18}$ represent an alkyl group are the same as the preferable aspects of the alkyl group as R$^2$ to R$^9$ and R$^0$.

The number of carbon atoms of the alkenyl group as R$^{10}$ and R$^{13}$ is preferably in a range of 2 to 30, more preferably in a range of 2 to 15, and still more preferably in a range of 2 to 10.

The preferable aspects in a case where $R^{10}$ to $R^{18}$ represent an aryl group are the same as the preferable aspects of the aryl group as $R^0$.

From the viewpoint of easily generating a radical, $R^{10}$ in Formula 1-1 represents preferably an alkyl group, an alkenyl group, an aryl group, —$OR^{14}$, —$NR^{15}R^{16}$, or —$SR^{17}$, more preferably an alkyl group, —$OR^{14}$, —$NR^{15}R^{16}$, or —$SR^{17}$, still more preferably an alkyl group or —$OR^{14}$, and particularly preferably —$OR^{14}$.

Further, in a case where $R^{10}$ in Formula 1-1 represents an alkyl group, it is preferable that the alkyl group is an alkyl group having an arylthio group or an alkyloxycarbonyl group at the α-position.

In a case where $R^{10}$ in Formula 1-1 represents —$OR^{14}$, $R^{14}$ represents preferably an alkyl group, more preferably an alkyl group having 1 to 8 carbon atoms, still more preferably an isopropyl group or a t-butyl group, and particularly preferably a t-butyl group.

From the viewpoint of easily generating a radical, it is preferable that $R^{11}$ in Formula 1-2 represents a hydrogen atom.

Further, from the viewpoint of easily generating a radical, $R^{12}$ in Formula 1-2 represents preferably —C(=O)$OR^{14}$, —OC(=O)$OR^{14}$, or a halogen atom and more preferably —C(=O)$OR^{14}$ or —OC(=O)$OR^{14}$. In a case where $R^{12}$ in Formula 1-2 represents —C(=O)$OR^{14}$ or —OC(=O)$OR^{14}$, it is preferable that $R^{14}$ represents an alkyl group.

From the viewpoint of easily generating a radical, it is preferable that $R^{11}$'s in Formula 1-3 each independently represents a hydrogen atom or an alkyl group and more preferable that at least one $R^{11}$ in Formula 1-3 represents an alkyl group.

Further, as the alkyl group represented by $R^{11}$, an alkyl group having 1 to 10 carbon atoms is preferable, and an alkyl group having 3 to 10 carbon atoms is more preferable.

Further, as the alkyl group represented by $R^{11}$, an alkyl group having a branched or ring structure is preferable, a secondary or tertiary alkyl group is more preferable, and an isopropyl group, a cyclopentyl group, a cyclohexyl group, or a t-butyl group is still more preferable.

Further, from the viewpoint of easily generating a radical, $R^{13}$ in Formula 1-3 represents preferably an aryl group, an alkoxy group, or an onium group, more preferably a p-dimethylaminophenyl group or a pyridinium group, and still more preferably a pyridinium group.

Examples of the onium group as $R^{13}$ include a pyridinium group, an ammonium group, and a sulfonium group. The onium group may have a substituent. Examples of the substituent include an alkyl group, an alkoxy group, an aryloxy group, an amino group, an alkylthio group, an arylthio group, a halogen atom, a carboxy group, a sulfo group, an alkyloxycarbonyl group, an aryloxycarbonyl group, and groups formed by combining these groups. Among these, an alkyl group, an aryl group, and groups formed by combining these groups are preferable.

Among these, a pyridinium group is preferable, a N-alkyl-3-pyridinium group, a N-benzyl-3-pyridinium group, a N-(alkoxypolyalkyleneoxyalkyl)-3-pyridinium group, a N-alkoxycarbonylmethyl-3-pyridinium group, a N-alkyl-4-pyridinium group, a N-benzyl-4-pyridinium group, a N-(alkoxypolyalkyleneoxyalkyl)-4-pyridinium group, a N-alkoxycarbonylmethyl-4-pyridinium group, or a N-alkyl-3,5-dimethyl-4-pyridinium group is more preferable, a N-alkyl-3-pyridinium group or a N-alkyl-4-pyridinium group is still more preferable, a N-methyl-3-pyridinium group, a N-octyl-3-pyridinium group, a N-methyl-4-pyridinium group, or a N-octyl-4-pyridinium group is particularly preferable, and a N-octyl-3-pyridinium group or a N-octyl-4-pyridinium group is most preferable.

Further, in a case where $R^{13}$ represents a pyridinium group, examples of the counter anion include a sulfonate ion, a carboxylate ion, a tetrafluoroborate ion, a hexafluorophosphate ion, a p-toluenesulfonate ion, and a perchlorate ion. Among these, a p-toluenesulfonate ion or a hexafluorophosphate ion is preferable.

From the viewpoint of easily generating a radical, it is preferable that $R^{10}$ in Formula 1-4 represents an alkyl group or an aryl group and more preferable that one of two $R^{10}$'s represents an alkyl group and the other represents an aryl group.

From the viewpoint of easily generating a radical, $R^{10}$ in Formula 1-5 represents preferably an alkyl group or an aryl group, more preferably an aryl group, and still more preferably a p-methylphenyl group.

From the viewpoint of easily generating a radical, $R^{10}$'s in Formula 1-6 each independently represent preferably an alkyl group or an aryl group and more preferably a methyl group or a phenyl group.

From the viewpoint of easily generating a radical, $Z^1$ in Formula 1-7 may represent a counter ion that neutralizes the charge. In a case where Za represents a polyvalent ion, examples thereof are the same as those for Za described above.

$Z^1$ represents preferably a sulfonate ion, a carboxylate ion, a tetrafluoroborate ion, a hexafluorophosphate ion, a p-toluenesulfonate ion, and a perchlorate ion. Among these, a p-toluenesulfonate ion or a hexafluorophosphate ion is more preferable.

From the viewpoint of easily generating a radical, $R^{21}$'s in Formula 1-8 or 1-9 each independently represent a hydrogen atom, an alkyl group, or an aryl group, preferably a hydrogen atom, an alkyl group having 1 to 10 carbon atoms, or a phenyl group, more preferably an alkyl group having 3 to 10 carbon atoms or a hydrogen atom, and still more preferably a hydrogen atom.

Further, as the alkyl group as $R^{21}$, an alkyl group having a branched or ring structure is preferable, a secondary or tertiary alkyl group is more preferable, and an isopropyl group, a cyclopentyl group, a cyclohexyl group, or a t-butyl group is still more preferable.

From the viewpoint of easily generating a radical, $R^{22}$ in Formula 1-8 or 1-9 represents preferably an aryl group, an alkoxy group, or an onium group, more preferably a p-dimethylaminophenyl group or a pyridinium group, and still more preferably a pyridinium group.

Examples of the onium group as $R^{22}$ include a pyridinium group, an ammonium group, and a sulfonium group. The onium group may have a substituent. Examples of the substituent include an alkyl group, an alkoxy group, an aryloxy group, an amino group, an alkylthio group, an arylthio group, a halogen atom, a carboxy group, a sulfo group, an alkyloxycarbonyl group, an aryloxycarbonyl group, and groups formed by combining these groups, and an alkyl group, an aryl group, and groups formed by combining these groups are preferable. Among these, a pyridinium group is preferable.

As the pyridinium group, a N-alkyl-3-pyridinium group, a N-benzyl-3-pyridinium group, a N-(alkoxypolyalkyleneoxyalkyl)-3-pyridinium group, a N-alkoxycarbonylmethyl-3-pyridinium group, a N-alkyl-4-pyridinium group, a N-benzyl-4-pyridinium group, a N-(alkoxypolyalkyleneoxyalkyl)-4-pyridinium group, a N-alkoxycarbonylmethyl-4-pyridinium group, or a N-alkyl-3,5-dimethyl-4-pyridinium group is more preferable, a N-alkyl-3-pyridinium group or a N-alkyl-4-pyridinium group is still more preferable, a N-methyl-3-pyridinium group, a N-octyl-3-pyridinium group, a N-methyl-4-pyridinium group, or a N-octyl-4-pyridinium group is particularly preferable, and a N-octyl-3-pyridinium group or a N-octyl-4-pyridinium group is most preferable.

Further, in a case where $R^{22}$ represents an onium group, examples of the counter anion include a sulfonate ion, a carboxylate ion, a tetrafluoroborate ion, a hexafluorophosphate ion, a p-toluenesulfonate ion, and a perchlorate ion. Among these, a p-toluenesulfonate ion or a hexafluorophosphate ion is preferable.

In Formula 1-9, $R^N$ represents a hydrocarbon group, preferably an alkyl group, more preferably an alkyl group having 1 to 4 carbon atoms, and still more preferably a methyl group.

In Formula 1-9, it is preferable that $X^1$ and $X^2$ represent the same atom and more preferable that both of $X^1$ and $X^2$ represent an oxygen atom.

In Formula 1-10, $R^{31}$ represents an alkyl group, an aryl group, or an aralkyl group, preferably an alkyl group having 1 to 10 carbon atoms, an aryl group having 6 to 10 carbon atoms, or an aralkyl group having 7 to 12 carbon atoms, more preferably an alkyl group having 1 to 4 carbon atoms or an aralkyl group having 7 to 10 carbon atoms, and still more preferably a methyl group or a phenylmethyl group.

An aromatic ring in the aryl group or aralkyl group may have a substituent. Preferred examples of the substituent include an alkyl group, a halogen atom, and a substituent having an ethylenically unsaturated group. Examples of the substituent having an ethylenically unsaturated group include a vinyl group and a 2-propenyl group. Among these, a vinyl group is preferable.

Hereinafter, preferred examples of the first radiation-sensitive composition according to the embodiment of the present disclosure will be described, but the present disclosure is not limited thereto.

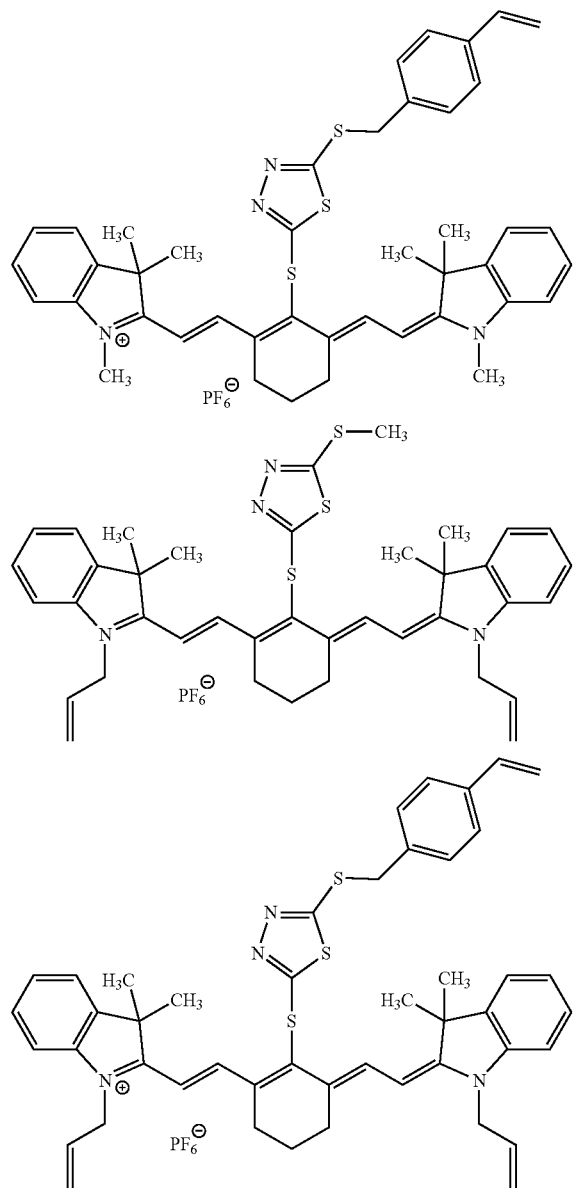

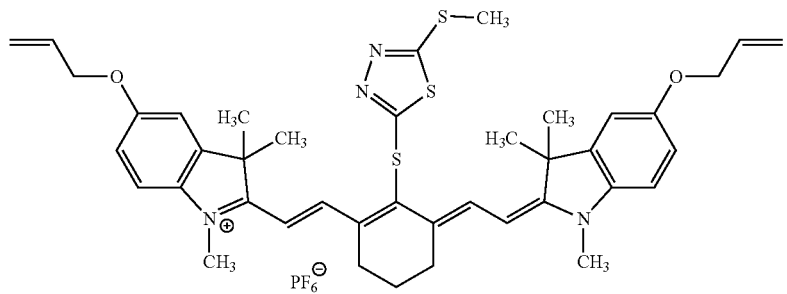
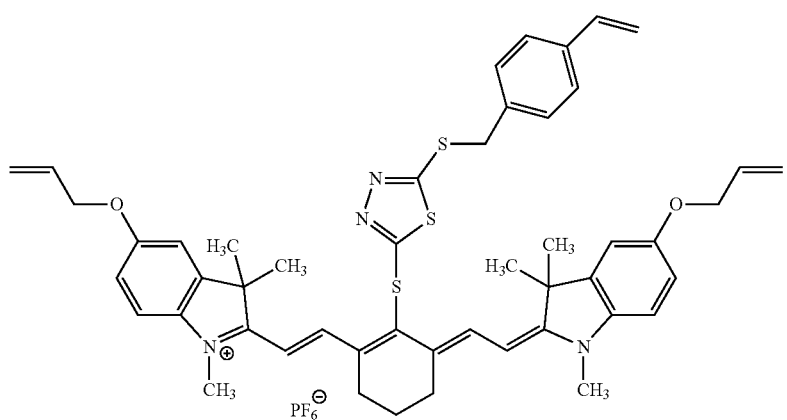
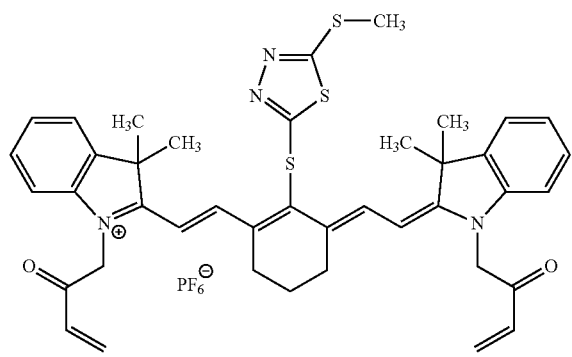
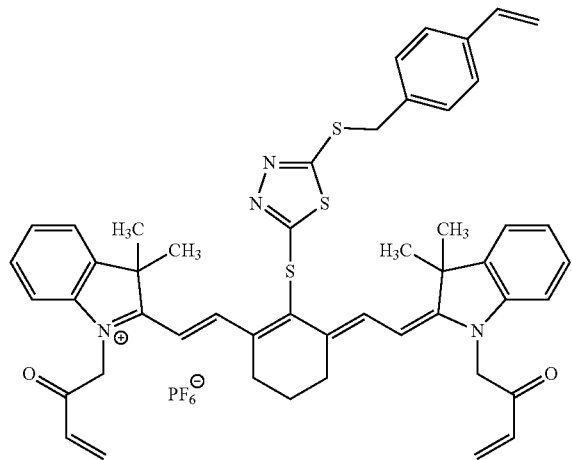

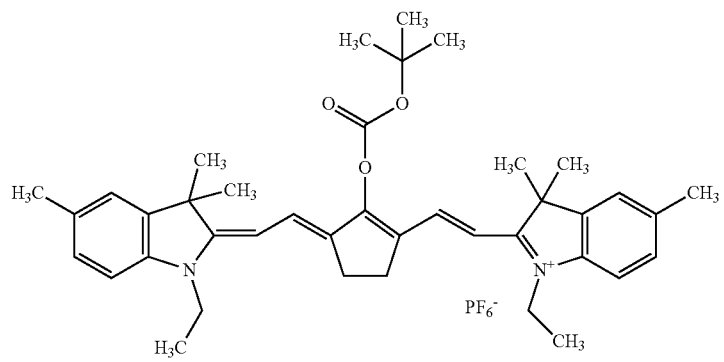
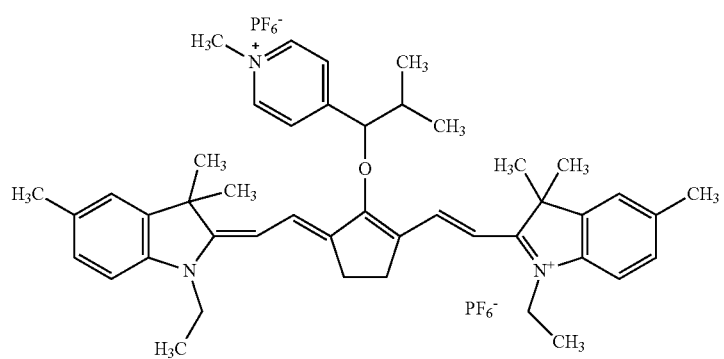
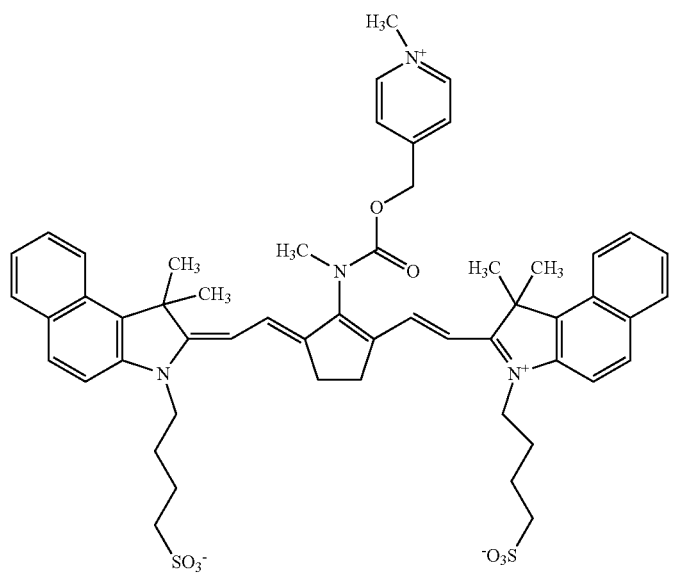

-continued

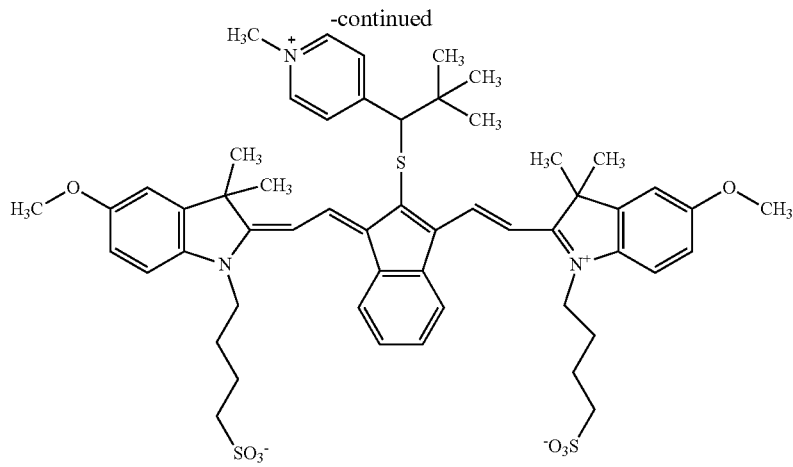

The decomposition type radiation absorption compound may be used alone or in combination of two or more kinds thereof.

The content of the decomposition type radiation absorption compound in the first radiation-sensitive composition according to the embodiment of the present disclosure is preferably in a range of 0.1% to 95% by mass, more preferably in a range of 1% to 50% by mass, and still more preferably in a range of 1% to 20% by mass with respect to the total solid content of the first radiation-sensitive composition.

[Binder Polymer]

From the viewpoints of coating properties and film forming properties, it is preferable that the first radiation-sensitive composition according to the embodiment of the present disclosure contains a binder polymer. The kind of polymer is not particularly limited as long as a known polymer is used, and preferred examples thereof include a film-forming polymer. Examples of the film-forming polymer include a (meth)acrylic resin, polyurethane, polyester, polyamide, polyether, polycarbonate, polyurea, polyolefin, a vinyl resin, and polyamine. As the form of a polymer used in the first radiation-sensitive composition, the polymer may be dissolved in the composition and then added. Preferred examples of the polymer to be dissolved in the composition and then added include a (meth)acrylic resin, polyurethane, polyester, and a vinyl resin.

In a case where a polymer is dissolved in the composition and then added, as a binder polymer (also referred to as a "binder polymer for on-press development) suitable for an on-press development type planographic printing plate precursor, a (meth)acrylic resin, polyurethane, polyester, or a vinyl resin is preferable and a (meth)acrylic resin or polyurethane is more preferable.

As the binder polymer, a polymer having an alkylene oxide chain is particularly preferable. The polymer having an alkylene oxide chain may have a poly(alkylene oxide) moiety in the main chain or a side chain. Further, a graft polymer having poly(alkylene oxide) in a side chain or a block copolymer of a block formed of a poly(alkylene oxide)-containing repeating unit and a block formed of an (alkylene oxide)-free repeating unit may be used.

In a case where a polymer has a poly(alkylene oxide) moiety in the main chain, polyurethane is preferable. Examples of the polymer in a case of having a poly(alkylene oxide) moiety in a side chain include a (meth)acrylic resin, polyvinyl acetal, polyurethane, polyurea, polyimide, polyamide, an epoxy resin, polystyrene, a novolac type phenol resin, polyester, synthetic rubber, and natural rubber. Among these, a (meth)acrylic resin is particularly preferable.

As the alkylene oxide, alkylene oxide having 2 to 6 carbon atoms is preferable, and ethylene oxide or propylene oxide is particularly preferable.

The repetition number of alkylene oxides in the poly(alkylene oxide) moiety is preferably in a range of 2 to 120, more preferably in a range of 2 to 70, and still more preferably in a range of 2 to 50.

In a case where the repetition number of alkylene oxides is 120 or less, degradation of film hardness is suppressed.

It is preferable that the poly(alkylene oxide) moiety is contained in a side chain of a polymer as a structure represented by Formula (AO) and more preferable that the poly(alkylene oxide) moiety is contained in a side chain of a (meth)acrylic resin as a structure represented by Formula (AO).

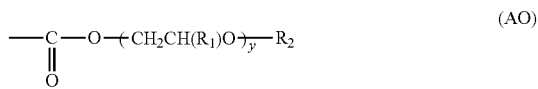

(AO)

In Formula (AO), y represents 2 to 120, $R_1$ represents a hydrogen atom or an alkyl group, and $R_2$ represents a hydrogen atom or a monovalent organic group.

As the monovalent organic group, an alkyl group having 1 to 6 carbon atoms is preferable. Specific examples thereof include a methyl group, an ethyl group, an n-propyl group, an isopropyl group, an n-butyl group, a sec-butyl group, an isobutyl group, a tert-butyl group, an n-pentyl group, an isopentyl group, a neopentyl group, an n-hexyl group, an isohexyl group, a 1,1-dimethylbutyl group, a 2,2-dimethylbutyl group, a cyclopentyl group, and a cyclohexyl group.

In Formula (AO), y represents preferably 2 to 70 and more preferably 2 to 50. $R_1$ represents preferably a hydrogen atom or a methyl group and particularly preferably a hydrogen atom. $R_2$ represents particularly preferably a hydrogen atom or a methyl group.

It is preferable that the binder polymer has crosslinking properties in order to improve the film hardness of a layer. In order to impart the crosslinking properties to the binder polymer, a crosslinking group such as an ethylenically unsaturated bond may be introduced to the binder polymer so that photocrosslinking properties are imparted or the binder polymer may be allowed to have thermoplasticity so that thermal crosslinking properties are imparted. The crosslinking group can be introduced to any of the main chain or a side chain of a polymer, and examples of the method of introducing a crosslinking group include a method of introducing a crosslinking group by carrying out copolymerization and a method of introducing a crosslinking group by carrying out polymerization and then causing a polymer reaction. In order to impart the thermoplasticity, the glass transition temperature of the polymer may be adjusted.

Examples of the binder polymer having an ethylenically unsaturated bond in the main chain include polybutadiene and polyisoprene.

Examples of the binder polymer having an ethylenically unsaturated bond in a side chain include a polymer having a (meth)acrylate group, a (meth)acrylamide group, a vinyl group, or an allyl group in a side chain.

According to the method of adjusting the glass transition temperature, the glass transition temperature can be adjusted by changing the composition of the monomers to be copolymerized or the molecular weight of the polymer.

From the viewpoint of the film hardness, the content (the content of a radical polymerizable unsaturated double bond by iodine titration) of the crosslinking group in the binder polymer is preferably in a range of 0.1 to 10.0 mmol, more preferably in a range of 1.0 to 7.0 mmol, and particularly preferably in a range of 2.0 to 5.5 mmol per 1 g of the binder polymer.

Specific examples 1 to 11 of the binder polymer will be described below, but the present disclosure is not limited thereto. In the exemplary compounds shown below, the numerical value (the numerical value shown together with the repeating unit in the main chain) shown together with each repeating unit indicates the molar percentage of the repeating unit. The numerical value shown together with the repeating unit in a side chain indicates the repetition number of the repeating sites. Further, Me represents a methyl group, Et represents an ethyl group, and Ph represents a phenyl group.

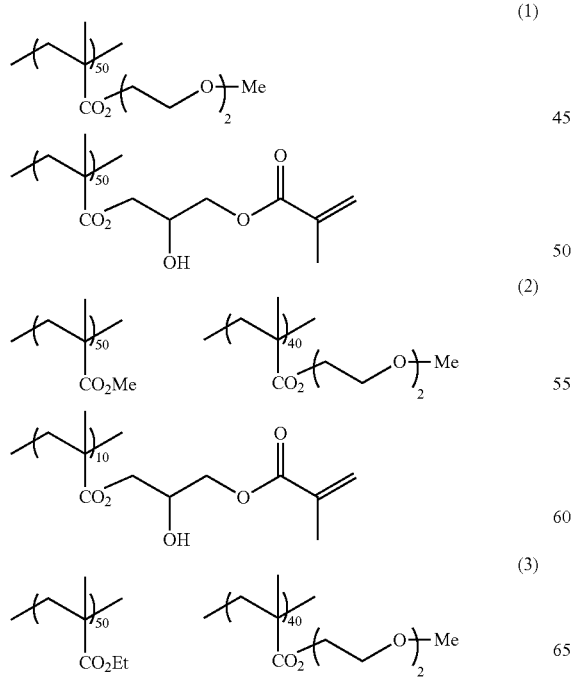

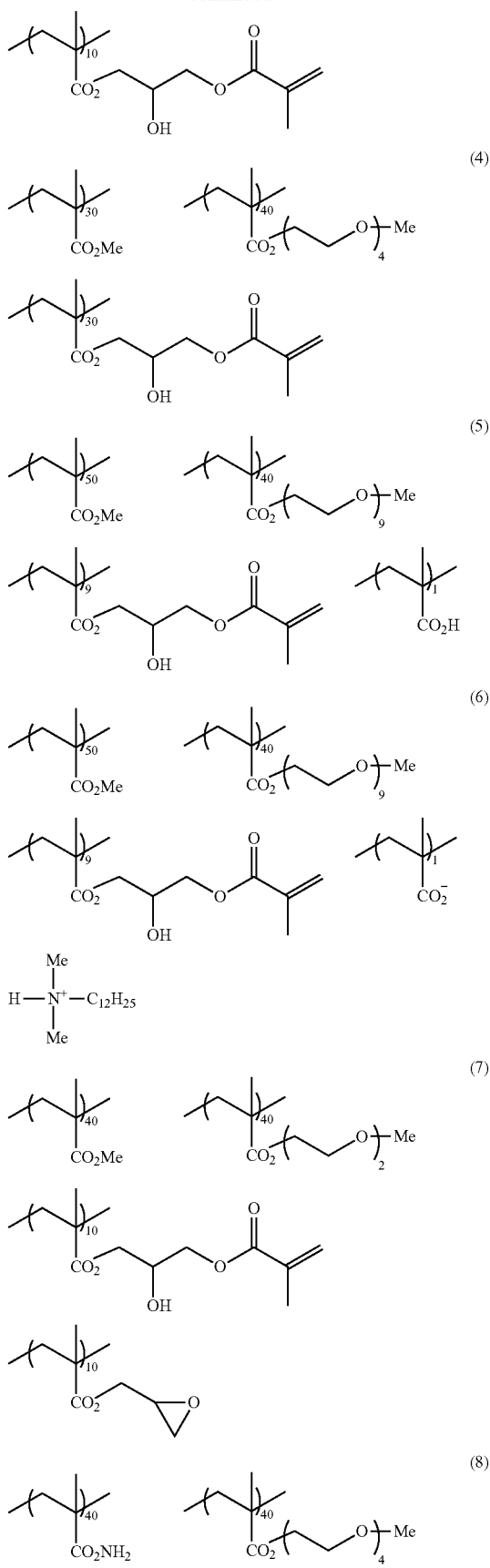

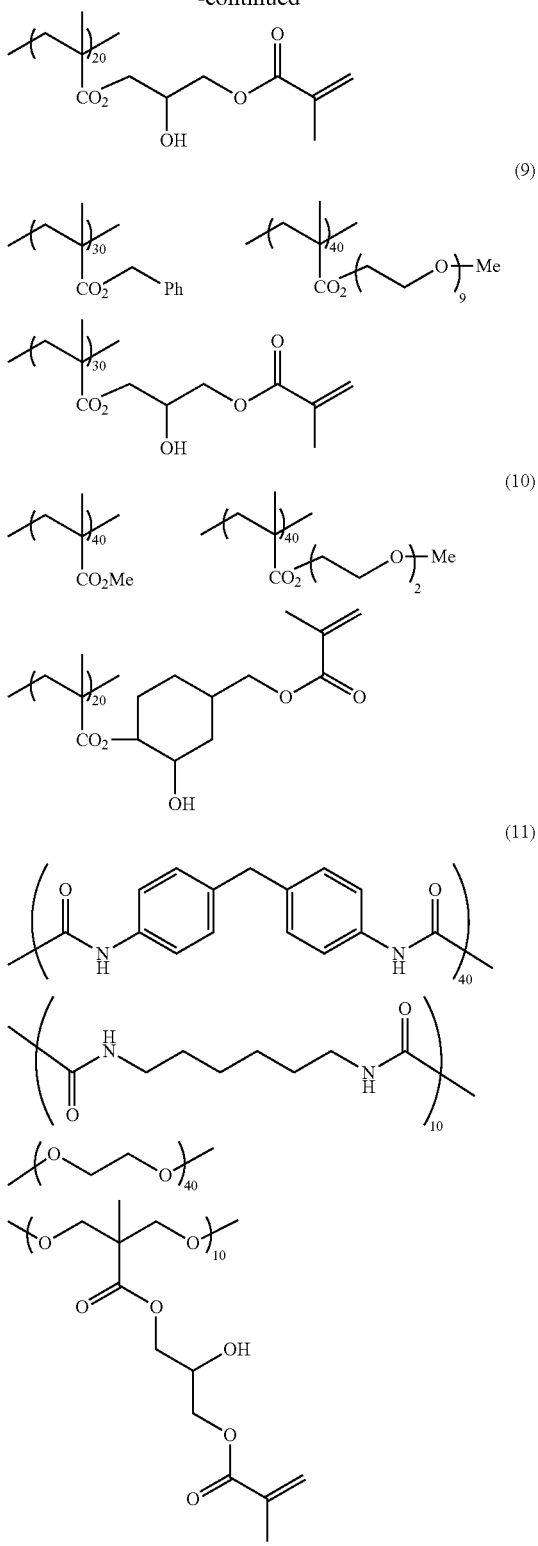

In the molecular weight of the binder polymer used in the present disclosure, the weight-average molecular weight (Mw) thereof in terms of polystyrene according to a gel permeation chromatography (GPC) method is preferably 2000 or greater, more preferably 5000 or greater, and still more preferably in a range of 10000 to 300000.

In the present disclosure, the oligomer is set to have an Mw of 800 or greater and less than 2000 and the polymer is set to have an Mw of 2000 or greater.

As necessary, hydrophilic polymers such as polyacrylic acid and polyvinyl alcohol described in JP2008-195018A can be used in combination. Further, a lipophilic polymer and a hydrophilic polymer can be used in combination.

In the first radiation-sensitive composition according to the embodiment of the present disclosure, the binder polymer may be used alone or in combination of two or more kinds thereof.

An optional amount of the binder polymer can be contained in the first radiation-sensitive composition.

The content of the binder polymer can be appropriately selected depending on the applications of the first radiation-sensitive composition, but is preferably in a range of 1% to 90% by mass and more preferably in a range of 5% to 80% by mass with respect to the total solid content of the first radiation-sensitive composition.

[Microgel and Polymer Particles]

In order to improve water solubility of the first radiation-sensitive composition or improve the on-press developability in a case where the first radiation-sensitive composition is used in the planographic printing plate precursor, the first radiation-sensitive composition may contain at least one selected from the group consisting of microgels and polymer particles. It is preferable that the microgels or the polymer particles are crosslinked or melted, or crosslinked and melted due to light or heat generated from irradiation with infrared rays, or are changed to have hydrophobicity. It is preferable that the microgels or the polymer particles are at least one selected from the group consisting of non-crosslinking microgels, crosslinking microgels, thermally fusible particles, thermally reactive polymer particles, and polymer particles having a polymerizable group. These may have a core shell structure or include other compounds.

Suitable examples of the thermally fusible particles include polymer particles described in Research Disclosure No. 33303 on January, 1992, and the specifications of JP1997-123387A (JP-H09-123387A), JP1997-131850A (JP-H09-131850A), JP1997-171249A (JP-H09-171249A), JP1997-171250A (JP-H09-171250A), and EP931647B.

Specific examples of the polymer constituting thermally fusible particles include homopolymers or copolymers of monomers such as acrylate or methacrylate having structures of ethylene, styrene, vinyl chloride, methyl acrylate, ethyl acrylate, methyl methacrylate, ethyl methacrylate, vinylidene chloride, acrylonitrile, vinyl carbazole, and polyalkylene, and mixtures of these. Among these, polystyrene, styrene, a copolymer containing acrylonitrile, and polymethyl methacrylate are preferable.

Examples of the thermally reactive polymer particles include polymer particles having a thermally reactive group. The polymer particles having a thermally reactive group are crosslinked by a thermal reaction and have hydrophobic regions formed by a change in functional groups during the crosslinking.

As the thermally reactive group in polymer particles having a thermally reactive group, a functional group that performs any reaction may be used as long as a chemical bond is formed, but a polymerizable group is preferable. Suitable examples of the polymerizable group include an ethylenically unsaturated group that performs a radical polymerization reaction (such as an acryloyl group, a methacryloyl group, a vinyl group, or an allyl group); a cationic polymerizable group (such as a vinyl group, a vinyloxy group, an epoxy group, or an oxetanyl group); an isocyanate group that performs an addition reaction or a block body thereof, an epoxy group, a vinyloxy group, and a functional group having active hydrogen atoms as the reaction partners of these (such as an amino group, a hydroxy group, or a carboxy group); a carboxy group that performs a condensation reaction and a hydroxy group or an amino group as a reaction partner thereof; and an acid anhydride that performs a ring opening addition reaction and an amino group or a hydroxy group as a reaction partner thereof.

Examples of the microcapsule include those obtained by encapsulating all or some of the constituent components of the first radiation-sensitive composition in a microcapsule as described in JP2001-277740A and JP2001-277742A. Further, the constituent component of the first radiation-sensitive composition may also be contained in a portion other than the microcapsule. Moreover, a preferred aspect of the first radiation-sensitive composition containing the microcapsule is an aspect in which hydrophobic constituent components are contained in a microcapsule and hydrophilic constituent components are contained in a portion other than the microcapsule.

The microgel may contain some of the constituent components of the first radiation-sensitive composition in at least one of the surface or the inside thereof. Particularly, from the viewpoints of image forming sensitivity and printing durability, it is preferable that the microgel has a radical polymerizable group in the surface thereof to obtain a reactive microgel.

In order to obtain a microcapsule or a microgel through the components of the first radiation-sensitive composition, a known method can be used.

In a case where the first radiation-sensitive composition according to the embodiment of the present disclosure contains a polymer in the form of a microcapsule, a microgel, or polymer particles, the average primary particle diameter of the microcapsules, the microgels, or the polymer particles is preferably in a range of 10 to 1000 nm, more preferably in a range of 20 to 300 nm, and still more preferably in a range of 30 to 120 nm.

The average primary particle diameter can be measured according to a light scattering method.

The content of the microgel or the polymer particles is preferably in a range of 5% to 90% by mass with respect to the total solid content of the first radiation-sensitive composition.

[Infrared Absorbing Agent]

The first radiation-sensitive composition according to the embodiment of the present disclosure may contain an infrared absorbing agent. In a case where the first radiation-sensitive composition contains an infrared absorbing agent, the first radiation-sensitive composition according to the embodiment of the present disclosure can be suitably used as an infrared sensitive composition.

In the first radiation-sensitive composition according to the embodiment of the present disclosure, the infrared absorbing agent does not contain a decomposition type radiation absorption compound corresponding to the above-described radiation absorption compound.

The infrared absorbing agent is a compound that has a function of converting absorbed infrared rays to heat. Further, the infrared absorbing agent may have a function of being excited by infrared rays and electron-transferring or energy-transferring to the radical initiator or the like.

The infrared absorbing agent preferably has the maximum absorption wavelength in a wavelength range of 750 to 1400 nm. As the infrared absorbing agent, dyes or pigments are preferably used.

As the dye, commercially available dyes and known dyes described in the literatures such as "Dye Handbook" (edited by The Society of Synthetic Organic Chemistry, Japan, published in 1970) can be used. Specific examples thereof include dyes such as an azo dye, a metal complex salt azo dye, a pyrazolone azo dye, a naphthoquinone dye, an anthraquinone dye, a phthalocyanine dye, a carbonium dye, a quinone imine dye, a methine dye, a cyanine dye, a squarylium coloring agent, a pyrylium salt, and a metal thiolate complex.

Among the above-described dyes, a cyanine coloring agent, a squarylium coloring agent, and a pyrylium salt are preferable. Among these, a cyanine coloring agent is preferable, and an indolenine cyanine coloring agent is particularly preferable.

Specific examples of the cyanine coloring agent include compounds described in paragraphs 0017 to 0019 of JP2001-133969A and compounds described in paragraphs 0016 to 0021 of JP2002-023360A and paragraphs 0012 to 0037 of JP2002-040638A. Preferred examples thereof include compounds described in paragraphs 0034 to 0041 of JP2002-278057A and paragraphs 0080 to 0086 of JP2008-195018A and particularly preferred examples thereof include compounds described in paragraphs 0035 to 0043 of JP2007-090850A.

Further, compounds described in paragraphs 0008 and 0009 of JP1993-005005A (JP-H05-005005A) and paragraphs 0022 to 0025 of JP2001-222101A can be preferably used.

As the pigments, compounds described in paragraphs 0072 to 0076 of JP2008-195018A are preferable.

The infrared absorbing agent may be used alone or in combination of two or more kinds thereof. Further, pigments and dyes may be used in combination as the infrared absorbing agent.

An optional amount of the infrared absorbing agent can be contained in the first radiation-sensitive composition. The content of the infrared absorbing agent is preferably in a range of 0.05% to 30% by mass, more preferably in a range of 0.1% to 20% by mass, and still more preferably in a range of 0.2% to 10% by mass with respect to 100 parts by mass which is the total solid content of the first radiation-sensitive composition.

[Other Components]

The first radiation-sensitive composition according to the embodiment of the present disclosure may contain additives (for example, surfactants) other than those described above, as necessary.

[Formation of Composition Film]

A composition film can be formed by dissolving or dispersing each component contained in the first radiation-sensitive composition according to the embodiment of the present disclosure in an appropriate solvent to prepare a coating solution, coating a support or the like with the coating solution, and drying the coating solution.

As the solvent, a known solvent can be used. Specific examples thereof include water, acetone, methyl ethyl ketone (2-butanone), cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 1-methoxy-2-propanol, 3-methoxy-1-propanol, methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethylformamide, dimethyl sulfoxide, γ-butyrolactone, methyl lactate, and ethyl lactate. The solvent can be used alone or in the form of a mixture of two or more kinds thereof. The concentration of solid contents in the coating solution is preferably in a range of 1% to 50% by mass.

<Second Radiation-Sensitive Composition>

A second radiation-sensitive composition according to the embodiment of the present disclosure includes a radical initiator, a radical polymerizable component, and a radiation absorption compound. Further, the radical initiator contains an electron-donating radical initiator and an electron-accepting radical initiator, and the radical generation amount-versus-time curve thereof has two or more peaks of the radical generation amount after exposure to the image forming radiation.

The second radiation-sensitive composition generates the first radical and the second radical through the reaction shown by the following reaction formula.

As the results, the second radiation-sensitive composition has two or more peaks of the radical generation amount in the radical generation amount-versus-time curve after exposure to image forming radiation.

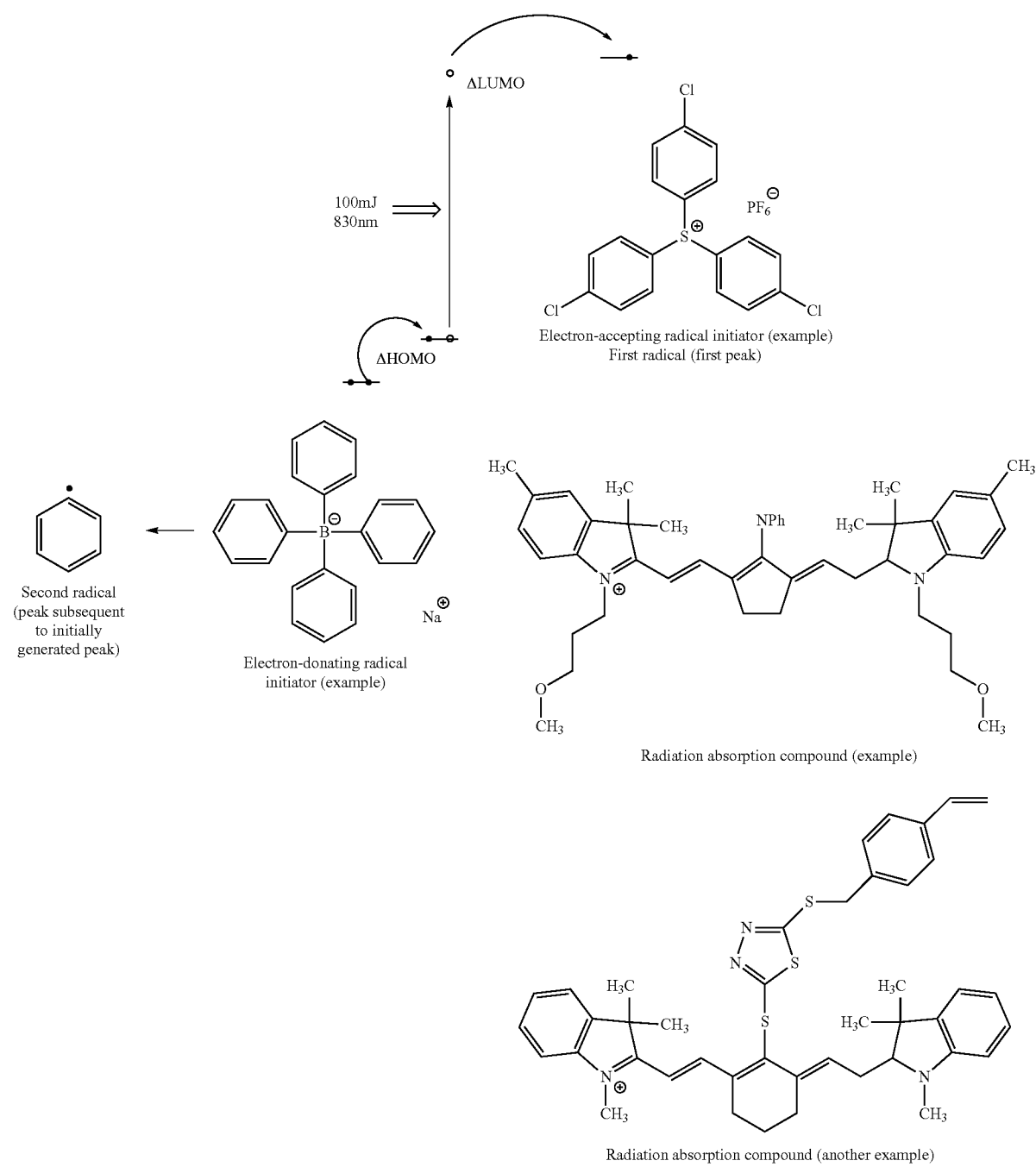

In the reaction formula, it is speculated that the radiation absorption compound is excited due to irradiation with image forming radiation, and electron transfer to the electron-accepting radical initiator occurs so that the first radical is generated.

Further, it is speculated that electron transfer to the radiation absorption compound from the electron-donating radical initiator occurs so that the second radical is generated.

Since there is a difference in reaction rate between the reaction in which the first radical is generated and the reaction in which the second radical is generated, in the second radiation-sensitive composition according to the embodiment of the present disclosure, the radical generation amount-versus-time curve has two or more peaks of the radical generation amount after exposure to image forming radiation.

Further, it is speculated that generation of the peaks subsequent to the initially generated peak is delayed and the second radical generation amount decreases as the difference between the highest occupied molecular orbital (HOMO) of the radiation absorption compound and HOMO of the electron-donating radical initiator increases.

In the reaction formula shown above, Ph represents a phenyl group.

[Radical Initiator]

The radical initiators in the second radiation-sensitive composition according to the embodiment of the present disclosure includes an electron-donating radical initiator and an electron-accepting radical initiator.

Here, the electron-donating radical initiator in the second radiation-sensitive composition has the same definition as that for the electron-accepting radical initiator in the first radiation-sensitive composition described above, and the preferable aspects thereof are also the same as described above.

—Electron-Accepting Radical Initiator—

Examples of the electron-accepting radical initiator include an organic halide (a), a carbonyl compound (b), an azo compound (c), an organic peroxide (d), a metallocene compound (e), an azide compound (f), a hexaaryl biimidazole compound (g), a disulfone compound (h), an oxime ester compound (i), and an onium salt compound (j).

As the organic halide (a), for example, compounds described in paragraphs 0022 and 0023 of JP2008-195018A are preferable.

As the carbonyl compound (b), for example, compounds described in paragraph 0024 of JP2008-195018A are preferable.

As the azo compound (c), for example, an azo compound and the like described in JP1996-108621A (JP-H08-108621A) can be used.

As the organic peroxide (d), for example, compounds described in paragraph 0025 of JP2008-195018A are preferable.

As the metallocene compound (e), for example, compounds described in paragraph 0026 of JP2008-195018A are preferable.

As the azide compound (f), for example, compounds such as 2,6-bis(4-azidobenzylidene)-4-methylcyclohexanone may be exemplified.

As the hexaaryl biimidazole compound (g), for example, compounds described in paragraph 0027 of JP2008-195018A are preferable.

As the disulfone compound (h), for example, compounds described in JP1986-166544A (JP-S61-166544A) and JP2002-328465A may be exemplified.

As the oxime ester compound (i), for example, compounds described in paragraphs 0028 to 0030 of JP2008-195018A are preferable.

Among examples of the electron-accepting radical initiator, from the viewpoint of the curability, oxime ester and an onium salt are more preferable, and an onium salt such as an iodonium salt, a sulfonium salt, or an azinium salt is still more preferable. In a case of using a planographic printing plate precursor, an iodonium salt or a sulfonium salt is particularly preferable. Specific examples of the iodonium salt and the sulfonium salt will be described below, but the present disclosure is not limited thereto.

As examples of the iodonium salt, a diphenyliodonium salt is preferable. Particularly, a diphenyl iodonium salt which has an electron-donating group as a substituent, for example, which is substituted with an alkyl group or an alkoxy group is preferable, and an asymmetric diphenyl iodonium salt is preferable. Specific examples thereof include diphenyliodonium=hexafluorophosphate, 4-methoxyphenyl-4-(2-methylpropyl) phenyliodonium=hexafluorophosphate, 4-(2-methylpropyl) phenyl-p-tolyliodonium=hexafluorophosphate, 4-hexyloxyphenyl-2,4,6-trimethoxyphenyliodonium=hexafluorophosphate, 4-hexyloxyphenyl-2,4-diethoxyphenyliodonium=tetrafluoroborate, 4-octyloxyphenyl-2,4,6-trimethoxyphenyliodonium=1-perfluorobutane-sulfonate, 4-octyloxyphenyl-2,4,6-trimethoxyphenyliodonium=hexafluorophosphate, and bis(4-t-butylphenyl)iodonium=hexafluorophosphate.

As examples of the sulfonium salt, a triaryl sulfonium salt is preferable. Particularly, a triaryl sulfonium salt which has an electron-withdrawing group as a substituent, for example, in which at least some groups on the aromatic ring have been substituted with halogen atoms is preferable, and a triaryl sulfonium salt in which the total number of substitutions of halogen atoms on the aromatic ring is 4 or more is more preferable. Specific examples of the sulfonium salt include triphenyl sulfonium=hexafluorophosphate, triphenylsulfonium=benzoylformate, bis(4-chlorophenyl) phenylsulfonium=benzoylformate, bis(4-chlorophenyl)-4-methyl phenylsulfonium=tetrafluoroborate, tris(4-chlorophenyl)sulfonium=3,5-bis(methoxycarbonyl) benzenesulfonate, tris(4-chlorophenyl) sulfonium=hexafluorophosphate, and tris(2,4-dichlorophenyl)sulfonium=hexafluorophosphate.

The electron-accepting radical initiator may be used alone or in combination of two or more kinds thereof.

The content of the electron-accepting radical initiator is preferably in a range of 0.1% to 50% by mass, more preferably in a range of 0.5% to 30% by mass, and particularly preferably in a range of 0.8% to 20% by mass with respect to the total solid content of the second radiation-sensitive composition.

[Radical Polymerizable Component]

The radical polymerizable component in the second radiation-sensitive composition has the same definition as that for the radical polymerizable component in the first radiation-sensitive composition, and the preferable aspects thereof are also the same as described above.

[Radiation Absorption Compound]

As the radiation absorption compound in the second radiation-sensitive composition, the radiation absorption compound in the first radiation-sensitive composition or the infrared absorbing agent in the first radiation-sensitive composition may be used. The preferable aspects of these compounds are the same as the preferable aspects of these compounds in the first radiation-sensitive composition.

—Highest Occupied Molecular Orbital (HOMO) and Lowest Unoccupied Molecular Orbital (LUMO)—

From the viewpoints of the printing durability and the tone reproducibility, a difference (potential difference ΔG2, ΔG2=HOMO of radiation absorption compound–HOMO of electron-donating radical initiator) between the highest occupied molecular orbital (HOMO) of the radiation absorption compound and HOMO of the electron-donating radical initiator in the second radiation-sensitive composition is preferably 0.50 eV or greater, more preferably in a range of 0.60 eV to 1.50 eV, still more preferably in a range of 0.61 eV to 1.30 eV, and particularly preferably in a range of 0.65 eV to 1.20 eV.

In a case where the second radiation absorption compound contains a plurality of one or both of the radiation absorption compounds and the electron-donating radical initiators, it is preferable that a combination of the radiation absorption compounds and the electron-donating radical initiators, which enables the difference between HOMO of the radiation absorption compounds and HOMO of the electron-donating radical initiators to be in the above-described range, is present.

Further, from the viewpoints of the printing durability and the tone reproducibility, a difference (potential difference ΔG3, ΔG3=LUMO of electron-accepting radical initiator–LUMO of radiation absorption compound) between the lowest unoccupied molecular orbital (LUMO) of the electron-accepting radical initiator and LUMO of the radiation absorption compound in the second radiation-sensitive composition is preferably 0.90 eV or less, more preferably 0.85 eV or less, still more preferably 0.80 eV or less, and even still more preferably 0.75 eV or less. The lower limit thereof is not particularly limited, but is preferably 0.10 eV or greater.

In a case where the second radiation absorption compound contains a plurality of one or both of the radiation absorption compounds and the electron-accepting radical initiators, it is preferable that a combination of the radiation absorption compounds and the electron-accepting radical initiators, which enables the difference between LUMO of the radiation absorption compounds and LUMO of the electron-accepting radical initiators to be in the above-described range, is present.

In the present disclosure, HOMO and LUMO are calculated according to the following method.

First, the counter anions in the compounds to be calculated are not considered.

The structural optimization is carried out by DFT (B3LYP/6-31G(d)) using quantum chemical calculation software Gaussian 09.

The molecular orbital (MO) energy is calculated by DFT (B3LYP/6−31+G(d,p)/CPCM (solvent=methanol)) using the structure obtained by the above-described structural optimization.

The MO energy Ebare (unit: hartree) obtained by the above-described MO energy calculation is converted to Escaled (unit: eV) used as the values of HOMO and LUMO in the present disclosure according to the following formula.

$E_{scaled} = 0.823168 \times 27.2114 \times E_{bare} - 1.07634$

Further, 27.2114 is a simply a coefficient for converting hartree to eV, and 0.823168 and −1.07634 are adjustment coefficients and these are determined such that the calculated values of HOMO and LUMO of the compounds to be calculated match the measured values.

Further, ΔG2 (ΔG2=HOMO of radiation absorption compound–HOMO of electron-donating radical initiator) is acquired from the difference between HOMO of the radiation absorption compound and HOMO of the electron-donating radical initiator.

Further, ΔG3 (ΔG3=LUMO of electron-accepting radical initiator–LUMO of radiation absorption compound) is acquired from the difference between LUMO of the electron-accepting radical initiator and LUMO of the radiation absorption compound.

It is considered that the stability of the electron-donating radical initiator at times other than the exposure to image forming radiation is excellent, and electron transfer occurs from HOMO of the electron-donating radical initiator to HOMO of the radiation absorption compound at the time of exposure to image forming radiation so that the excitation of the radiation absorption compound to the lowest unoccupied molecular orbital (LUMO) is promoted and the decomposition of the radiation absorption compound is promoted, in a case where the potential difference between HOMO of the radiation absorption compound and HOMO of the electron-donating radical initiator is in the above-described range.

Further, it is considered that electron transfer from the radiation absorption compound to the electron-accepting radical initiator is promoted, the polymerization of the radical polymerizable component is promoted, and the curability of the composition is excellent, in a case where the potential difference between LUMO of the electron-accepting radical initiator and LUMO of the radiation absorption compound is in the above-described range.

[Binder Polymer]

It is preferable that the second radiation-sensitive composition contains a binder polymer.

The binder polymer in the second radiation-sensitive composition has the same definition as that for the binder polymer in the first radiation-sensitive composition, and the preferable aspects thereof are the same as described above.

[Microgel and Polymer Particles]

It is preferable that the second radiation-sensitive composition contains a microgel and polymer particles.

The microgel and the polymer particles in the second radiation-sensitive composition each have the same definition as that for the microgel and the polymer particles in the first radiation-sensitive composition, and the preferable aspects thereof are the same as described above.

[Other Components]

The second radiation-sensitive composition according to the embodiment of the present disclosure may contain additives (for example, surfactants) other than those described above, as necessary.

[Formation of Composition Film]

A composition film can be formed by dissolving or dispersing each component contained in the second radiation-sensitive composition according to the embodiment of the present disclosure in an appropriate solvent to prepare a coating solution, coating a support or the like with the coating solution, and drying the coating solution.

As the concentration of solid contents in the solvent and the coating solution used in the preparation, the concentration of solid contents in the solvent and the coating solution in a case of preparing the coating solution using the first radiation-sensitive composition described above can be used.

<Applications of Radiation-Sensitive Composition>

The radiation-sensitive composition according to the embodiment of the present disclosure is preferably used for an image forming material. Examples of the image forming material include image forming materials obtained by utilizing polymerization curing from image exposure, such as a planographic printing plate precursor, a printed wiring board, a color filter, and a photo mask.

The image forming material containing the first radiation-sensitive composition according to the embodiment of the present disclosure forms a region that is cured by being exposed to a light source radiating image forming radiation. Examples of the light source radiating image forming radiation include a solid-state laser and a semiconductor laser that radiates infrared rays.

(Planographic Printing Plate Precursor)

A planographic printing plate precursor according to the embodiment of the present disclosure includes: a support; and an image recording layer which contains a radical initiator, a radical polymerizable component, and a radiation absorption compound, and in which a radical generation amount-versus-time curve thereof has two or more peaks of a radical generation amount after exposure to image forming radiation.

Further, from the viewpoint of enabling exposure to infrared rays, it is preferable that the radiation absorption compound contained in the planographic printing plate precursor according to the embodiment of the present disclosure is an infrared absorption compound.

<Peaks of Radical Generation Amount>

In the image recording layer, the radical generation amount-versus-time curve having two or more peaks of the radical generation amount after exposure to image forming radiation is confirmed by measurement based on nano transient absorption.

Specifically, a quartz substrate is coated with a solution obtained by dissolving the image recording layer of the planographic printing plate precursor and drying the solution to form a coated film such that the coating amount thereof is set to be the same as the dry coating amount of the image recording layer. The formed coated film is irradiated with a nanosecond laser pulse having a wavelength used as image forming radiation. In synchronization with the nanosecond laser pulse, laser light (a wavelength at which a radical to be observed has absorption) for a monitor is oscillated, and a change in photon number of the laser light for a monitor over time is detected by a photomultiplier tube (PMT) so that the measurement is performed using a measurement technique using an oscilloscope.

The solution obtained by dissolving the image recording layer of the planographic printing plate precursor can be obtained by dissolving the image recording layer in a solvent.

The solvent is not limited as long as the image recording layer can be dissolved, and examples of the solvent include solvents used for forming the above-described composition film.

Here, in a case where it is difficult to dissolve the image recording layer, for example, the planographic printing plate precursor has a protective layer, the measurement is performed using the composition used for forming the image recording layer of the planographic printing plate precursor in place of the solution obtained by dissolving the image recording layer of the planographic printing plate precursor.

According to the measuring method, in a case where two or more peaks of the radical generation amount are present in the radical generation amount-versus-time curve, the planographic printing plate precursor is considered to have the image recording layer having two or more peaks of the radical generation amount in the radical generation amount-versus-time curve after exposure to image forming radiation.

In addition, the preferable aspects of the measuring method based on the nano transient absorption are the same as the preferable aspects of the measuring method based on the nano transient absorption using the above-described radiation-sensitive composition.

In the image recording layer according to the present disclosure, from the viewpoint of improving the printing durability, a peak interval between a peak of the radical generation amount which is initially generated with respect to the time after the exposure to the image forming radiation and at least one of peaks of the radical generation amount which are generated subsequent to the initially generated peak, among the peaks of the radical generation amount, is preferably 30 ms or greater, more preferably 40 ms or greater, still more preferably in a range of 40 ms to 500 ms, and even still more preferably in a range of 50 ms to 300 ms.

According to the above-described method, the peak interval measured using the solution obtained by dissolving the image recording layer of the planographic printing plate precursor can be assumed to be the same as the peak interval in the image recording layer of the planographic printing plate.

In the image recording layer according to the present disclosure, from the viewpoint of achieving both of printing durability and tone reproducibility, it is preferable that at least one of peaks of the radical generation amount which are generated subsequent to the initially generated peak with respect to the time after exposure to the image forming radiation, among the peaks of the radical generation amount, is a peak derived from a decomposition product of the radiation absorption compound.

For example, in a case where the image recording layer contains a decomposition type radiation absorption compound described above, at least one of peaks of the radical generation amount which are generated subsequent to the initially generated peak with respect to the time becomes a peak derived from a decomposition product of the radiation absorption compound.

<Aspects of the Planographic Printing Plate Precursor>

According to a first aspect of the present disclosure, the planographic printing plate precursor (hereinafter, also referred to as a "first planographic printing plate precursor") is a planographic printing plate precursor including a support; and an image recording layer which contains a radical initiator, a radical polymerizable component, and a radiation absorption compound and in which the radical generation amount-versus-time curve has two or more peaks of a radical generation amount after exposure to image forming radiation, in which the radical initiator contains an electron-donating radical initiator, and the radiation absorption compound contains a compound which is decomposable to generate a radical due to exposure to the image forming radiation.

The image recording layer of the first planographic printing plate precursor is formed by being coated with a coating solution obtained by adding other components such as a solvent to the first radiation-sensitive composition as necessary.

According to a second aspect of the present disclosure, the planographic printing plate precursor (hereinafter, also referred to as a "second planographic printing plate precursor") is a planographic printing plate precursor including a support; and an image recording layer which contains a radical initiator, a radical polymerizable component, and a radiation absorption compound and in which the radical generation amount-versus-time curve thereof has two or more peaks of a radical generation amount after exposure to image forming radiation, in which the radical initiator contains an electron-donating radical initiator and an electron-accepting radical initiator.

Further, the second planographic printing plate precursor also includes an aspect in which the radical initiator includes an electron-donating radical initiator and an electron-accepting radical initiator, and the radiation absorption compound contains a compound that is decomposable to generate a radical due to exposure to the image forming radiation.

The image recording layer of the second planographic printing plate precursor is formed by being coated with a coating solution obtained by adding other components such as a solvent to the second radiation-sensitive composition as necessary.

Hereinafter, the image recording layer, the interlayer, the protective layer, and the support in the first planographic printing plate precursor or the second planographic printing plate precursor will be collectively described.

<Image Recording Layer>

The details and the content of each constituent component such as the radical initiator, the radical polymerizable component, the radiation absorption compound, the binder polymer, the microgel, the polymer particles, the infrared absorbing agent, or other components contained in the image recording layer of the first planographic printing plate precursor or the second planographic printing plate precursor can be referred to the description of the first radiation-sensitive composition or the second radiation-sensitive composition according to the embodiment of the present disclosure.

In order to realize on-press development, it is preferable that the image recording layer of the planographic printing plate precursor according to the embodiment of the present disclosure can be removed by any one or both of dampening water and printing ink described below.

The image recording layer according to the present disclosure may further contain a low-molecular-weight hydrophilic compound, a sensitizing agent, a solvent, and components other than the above-described constituent components.

[Low-Molecular-Weight Hydrophilic Compound]

In order to improve the on-press developability while suppressing degradation of the printing durability, the image recording layer may contain a low-molecular-weight hydrophilic compound. As the low-molecular-weight hydrophilic compound, a compound having a molecular weight of less than 1000 is preferable, a compound having a molecular weight of less than 800 is more preferable, and a compound having a molecular weight of less than 500 is still more preferable.

As the low-molecular-weight hydrophilic compound, examples of a water-soluble organic compound include glycols such as ethylene glycol, diethylene glycol, triethylene glycol, propylene glycol, dipropylene glycol, and tripropylene glycol and ether or ester derivatives thereof; polyols such as glycerin, pentaerythritol, and tris(2-hydroxyethyl) isocyanurate; organic amines such as triethanolamine, diethanolamine, and monoethanolamine and salts thereof; organic sulfonic acids such as alkylsulfonic acid, toluenesulfonic acid, and benzenesulfonic acid and salts thereof; organic sulfamic acids such as alkyl sulfamic acid and salts thereof; organic sulfuric acids such as alkyl sulfuric acid and alkyl ether sulfuric acid and salts thereof; organic phosphonic acids such as phenyl phosphonic acid and salts thereof; organic carboxylic acids such as tartaric acid, oxalic acid, citric acid, malic acid, lactic acid, gluconic acid, and amino acids and salts thereof; and betaines.

Among examples of the low-molecular-weight hydrophilic compound, it is preferable that the image recording layer contains at least one selected from the group consisting of polyols, organic sulfates, organic sulfonates, and betaines.

Specific examples of the organic sulfonates include an alkyl sulfonate such as sodium n-butyl sulfonate, sodium n-hexyl sulfonate, sodium 2-ethylhexyl sulfonate, sodium cyclohexyl sulfonate, or sodium n-octyl sulfonate; an alkyl sulfonate containing an ethylene oxide chain such as sodium 5,8,11-trioxapentadecane-1-sulfonate, sodium 5,8,11-trioxaheptadecane-1-sulfonate, sodium 13-ethyl-5,8,11-trioxaheptadecane-1-sulfonate, or sodium 5,8,11,14-tetraoxatetradecosane-1-sulfonate; an aryl sulfonate such as sodium benzene sulfonate, sodium p-toluene sulfonate, sodium p-hydroxybenzene sulfonate, sodium p-styrene sulfonate, sodium isophthalic acid dimethyl-5-sulfonate, sodium 1-naphthyl sulfonate, sodium 4-hydroxynaphthyl sulfonate, disodium 1,5-naphthalene disulfonate, or trisodium 1,3,6-naphthalene trisulfonate; and compounds described in paragraphs 0026 to 0031 of JP2007-276454A and paragraphs 0020 to 0047 of JP2009-154525A. The salt may be a potassium salt or a lithium salt.

Examples of the organic sulfates include an alkyl, an alkenyl, an alkynyl, and an aryl of polyethylene oxide and a sulfate of heterocyclic monoether. The number of ethylene oxide units is preferably in a range of 1 to 4. As a salt, a sodium salt, a potassium salt, or a lithium salt is preferable. Specific examples thereof include compounds described in paragraphs 0034 to 0038 of JP2007-276454A.

As betaines, compounds having 1 to 5 carbon atoms of hydrocarbon substituents to nitrogen atoms are preferable. Specific examples thereof include trimethyl ammonium acetate, dimethyl propyl ammonium acetate, 3-hydroxy-4-trimethyl ammonio butyrate, 4-(1-pyridinio)butyrate, 1-hydroxyethyl-1-imidazolioacetate, trimethyl ammonium methane sulfonate, dimethyl propyl ammonium methane sulfonate, 3-trimethylammonio-1-propane sulfonate, and 3-(1-pyridinio)-1-propane sulfonate.

Since the low-molecular-weight hydrophilic compound has a small structure of a hydrophobic portion and does not almost exhibit a surfactant action, the hydrophobicity or film hardness of an image area is not degraded by dampening water permeating into an exposed portion (image area) of the image recording layer and ink receptivity or printing durability of the image recording layer can be maintained satisfactorily.

The content of the low-molecular-weight hydrophilic compounds is preferably in a range of 0.5% to 20% by mass, more preferably in a range of 1% to 15% by mass, and still more preferably in a range of 2% to 10% by mass with respect to the total solid content of the image recording layer. In a case where the content thereof is in the above-described range, excellent on-press developability and printing durability can be obtained.

The low-molecular-weight hydrophilic compounds may be used alone or in mixture of two or more kinds thereof

[Sensitizing Agent]

In order to improve the impressing properties, the image recording layer may contain a sensitizing agent such as a phosphonium compound, a nitrogen-containing low-molecular-weight compound, or an ammonium group-containing polymer. Particularly, in a case where a protective layer contains an inorganic layered compound, these compounds function as a surface coating agent of the inorganic layered compound and suppress degradation of the impressing properties due to the inorganic layered compound during the printing.

As the sensitizing agent, it is preferable that a phosphonium compound, a nitrogen-containing low-molecular-weight compound, and an ammonium group-containing polymer are used in combination and more preferable that a phosphonium compound, quaternary ammonium salts, and an ammonium group-containing polymer are used in combination.

Examples of the phosphonium compound include phosphonium compounds described in JP2006-297907A and JP2007-050660A. Specific examples thereof include tetrabutyl phosphonium iodide, butyl triphenyl phosphonium bromide, tetraphenyl phosphonium bromide, 1,4-bis(triphenylphosphonio)butane=di(hexafluorophosphate), 1,7-bis(triphenylphosphonio)heptane=sulfate, and 1,9-bis(triphenylphosphonio)nonane=naphthalene-2,7-disulfonate.

Examples of the nitrogen-containing low-molecular-weight compound include amine salts and quaternary ammonium salts. Further, examples thereof include imidazolinium salts, benzimidazolinium salts, pyridinium salts, and quinolinium salts. Among these, quaternary ammonium salts and pyridinium salts are preferable. Specific examples thereof include tetramethyl ammonium=hexafluorophosphate, tetrabutylammonium=hexafluorophosphate, dodecyltrimethylammonium=p-toluene sulfonate, benzyltriethylammonium=hexafluorophosphate, benzyldimethyloctylammonium=hexafluorophosphate, benzyldimethyldodecylammonium=hexafluorophosphate, and compounds described in paragraphs 0021 to 0037 of JP2008-284858A and paragraphs 0030 to 0057 of JP2009-090645A.

The ammonium group-containing polymer is not limited as long as the polymer contains an ammonium group in the structure thereof, but a polymer that contains, as a copolymerization component, 5% to 80% by mole of (meth)acrylate having an ammonium group in the side chain is preferable. Specific examples thereof include polymers described in paragraphs 0089 to 0105 of JP2009-208458A.

The reduced specific viscosity (unit: ml/g) of the ammonium group-containing polymer which is acquired by the measuring method described in JP2009-208458A is preferably in a range of 5 to 120, more preferably in a range of 10 to 110, and particularly preferably in a range of 15 to 100. In a case where the reduced specific viscosity is converted to the weight-average molecular weight (Mw), the value thereof is preferably in a range of 10000 to 150000, more preferably in a range of 17000 to 140000, and particularly preferably in a range of 20000 to 130000.

Hereinafter, specific examples of the ammonium group-containing polymer will be described.

(1) A 2-(trimethylammonio)ethylmethacrylate=p-toluenesulfonate/3,6-dioxaheptylmethacrylate copolymer (molar ratio of 10/90, Mw of 45000);

(2) A 2-(trimethylammonio)ethylmethacrylate=hexafluorophosphate/3,6-dioxaheptylmethacrylate copolymer (molar ratio of 20/80, Mw of 60000), (3) A 2-(ethyldimethylammonio)ethylmethacrylate=p-toluenesulfonate/hexylmethacrylate copolymer (molar ratio of 30/70, Mw of 45000);

(4) A 2-(trimethylammonio)ethylmethacrylate=hexafluorophosphate/2-ethylhexylmethacrylate copolymer (molar ratio of 20/80, Mw of 60000);

(5) A 2-(trimethylammonio)ethylmethacrylate=methylsulfate/hexylmethacrylate copolymer (molar ratio of 40/60, Mw of 70000);

(6) A 2-(butyldimethylammonio)ethylmethacrylate=hexafluorophosphate/3,6-dioxaheptylmethacrylate copolymer (molar ratio of 25/75, Mw of 65000);

(7) A 2-(butyldimethylammonio)ethylacrylate=hexafluorophosphate/3,6-dioxaheptylmethacrylate copolymer (molar ratio of 20/80, Mw of 65000);

(8) A 2-(butyldimethylammonio)ethylmethacrylate=13-ethyl-5,8,11-trioxa-1-heptadecanesulfonate/3,6-dioxaheptylmethacrylate copolymer (molar ratio of 20/80, Mw of 75000); and (9) A 2-(butyldimethylammonio)ethylmethacrylate=hexafluorophosphate/3,6-dioxaheptylmethacrylate/2-hydroxy-3-methacryloxypropylmethacrylate copolymer (molar ratio of 15/80/5, Mw of 65000)

The content of the sensitizing agent is preferably in a range of 0.01% to 30.0% by mass, more preferably in a range of 0.1% to 15.0% by mass, and still more preferably in a range of 1% to 10% by mass with respect to the total solid content of the image recording layer.

[Other Components]

The image recording layer may contain a surfactant, a polymerization inhibitor, a higher fatty acid derivative, a plasticizer, inorganic particles, and an inorganic layered compound as other components. The details can be referred to the description in paragraphs 0114 to 0159 of JP2008-284817A.

[Formation of Image Recording Layer]

The image recording layer of the planographic printing plate precursor according to the embodiment of the present disclosure can be formed by dispersing or dissolving each of the above-described required components in a known solvent to prepare a coating solution, coating a support with the coating solution using a known method such as bar coater coating, and drying the coating solution, as described in paragraphs 0142 and 0143 of JP2008-195018A. The coating amount of the image recording layer (solid content) after the coating and drying varies depending on the applications thereof, but is preferably in a range of 0.3 to 3.0 g/m$^2$. In a case where the coating amount thereof is in the above-described range, excellent sensitivity and excellent film characteristics of the image recording layer are obtained.

<Interlayer>

The planographic printing plate precursor according to the embodiment of the present disclosure is preferably provided with an interlayer (also referred to as an undercoat layer) between the image recording layer and the support as necessary. Since bonding of the support to the image recording layer becomes stronger in an exposed portion and the support is easily separated from the image recording layer in an unexposed portion, the interlayer contributes to improvement of the developability without degrading the printing durability. Further, in a case of infrared laser exposure, the interlayer functions as a heat insulating layer so that a degradation in sensitivity due to heat, generated by exposure, being diffused in the support is prevented.

Examples of the compound used for the interlayer include a polymer containing an adsorptive group which can be adsorbed to the surface of the support and a hydrophilic group. A polymer which contains an adsorptive group and a hydrophilic group for the purpose of improving the adhesiveness to the image recording layer and further contains a crosslinking group is preferable. The compound used for the interlayer may be a low-molecular-weight compound or a polymer. The compound used for the interlayer may be used in the form of a mixture of two or more kinds thereof as necessary.

In a case where the compound used for an interlayer is a polymer, a copolymer of a monomer containing an adsorptive group, a monomer containing a hydrophilic group, and a monomer containing a crosslinking group is preferable.

As the adsorptive group which can be adsorbed by the surface of a support, a phenolic hydroxy group, a carboxy group, —$PO_3H_2$, —$OPO_3H_2$, —$CONHSO_2$—, —$SO_2NHSO_2$—, or —$COCH_2COCH_3$ is preferable. As the hydrophilic group, a sulfo group or a salt thereof, or a salt of a carboxy group is preferable. As the crosslinking group, an acrylic group, a methacrylic group, an acrylamide group, a methacrylamide group, or an allyl group is preferable.

The polymer may contain a crosslinking group introduced by forming salts between a polar substituent of the polymer and a compound that has a substituent having the opposite charge to the polar substituent and an ethylenically unsaturated bond or may be formed by further copolymerization of monomers other than the monomers described above and preferably hydrophilic monomers.

Specifically, a silane coupling agent having an ethylenic double bond reaction group, which can be added and polymerized, described in JP1998-282679A (JP-H10-282679A); and a phosphorous compound having an ethylenic double bond reaction group described in JP1990-304441A (JP-H02-304441A) are suitably exemplified. Further, crosslinking groups (preferably ethylenically unsaturated bond groups) described in JP2005-238816A, JP2005-125749A, JP2006-239867A, and JP2006-215263A, and low-molecular-weight or high-molecular-weight compounds containing functional groups and hydrophilic groups that interact with the surface of a support are preferably used.

More preferred examples thereof include high-molecular-weight polymers containing adsorptive groups which can be adsorbed by the surface of a support, hydrophilic groups, and crosslinking groups described in JP2005-125749A and JP2006-188038A.

The content of the ethylenically unsaturated bond group in the polymer used for the interlayer is preferably in a range of 0.1 mmol to 10.0 mmol and more preferably in a range of 0.2 mmol to 5.5 mmol with respect to 1 g of the polymer.

The weight-average molecular weight (Mw) of the polymer used for the interlayer is preferably 5000 or greater and more preferably in a range of 10000 to 300000.

For the purpose of preventing stain over time, the interlayer may contain a chelating agent, a secondary or tertiary amine, a polymerization inhibitor, a compound (for example, 1,4-diazabicyclo[2.2.2]octane (DABCO), 2,3,5,6-tetrahydroxy-p-quinone, chloranil, sulfophthalic acid, hydroxyethyl ethylene diamine triacetic acid, dihydroxyethyl ethylene diamine diacetic acid, or hydroxyethyl imino diacetic acid) that includes an amino group or a functional group having polymerization inhibiting ability and a group interacting with the surface of a support, and the like in addition to the compounds for an interlayer described above.

The interlayer is applied according to a known method. The coating amount (solid content) of the interlayer is preferably in a range of 0.1 to 100 mg/m² and more preferably in a range of 1 to 30 mg/m².

<Protective Layer>

It is preferable that the planographic printing plate precursor according to the embodiment of the present disclosure has a protective layer (also referred to as an overcoat layer) on the image recording layer as necessary. The protective layer has a function of increasing the radiation generation amount particularly in the peaks subsequent to the initially generated peak through oxygen blocking to improve the printing durability, a function of preventing generation of damage to the image recording layer, and a function of preventing ablation at the time of high illuminance laser exposure.

Such a protective layer having the above-described characteristics is described in U.S. Pat. No. 3,458,311A and JP1980-049729B (JP-555-049729B). As a polymer with low oxygen permeability which is used for a protective layer, any of a water-soluble polymer and a water-insoluble polymer is suitably selected and then used and two or more kinds thereof can be used in combination as necessary. Specific examples thereof include polyvinyl alcohol, modified polyvinyl alcohol, polyvinyl pyrrolidone, a water-soluble cellulose derivative, and poly(meth)acrylonitrile.

As the modified polyvinyl alcohol, acid-modified polyvinyl alcohol having a carboxy group or a sulfo group is preferably used. Specifically, modified polyvinyl alcohol described in JP2005-250216A and JP2006-259137A is used.

Since the protective layer improves oxygen-blocking properties, it is preferable that the protective layer contains an inorganic layered compound. The inorganic layered compound indicates a particle having a thin tabular shape, and examples thereof include a mica group such as natural mica, synthetic mica, and the like, talc represented by Formula: $3MgO \cdot 4SiO \cdot H_2O$, teniolite, montmorillonite, saponite, hectorite, and zirconium phosphate.

An inorganic layered compound which has been preferably used is a mica compound. Examples of the mica compound include a mica group such as synthetic mica and natural mica represented by Formula: $A(B,C)_{2-5}D_4O_{10}(OH, F,O)_2$ [here, A represents at least one element selected from the group consisting of K, Na, and Ca, B and C represent at least one element selected from the group consisting of Fe (II), Fe (III), Mn, Al, Mg, and V, and D represents Si or Al].

In the mica group, examples of the natural mica include muscovite, soda mica, phlogopite, biotite, and lepidolite. Examples of the synthetic mica include non-swellable mica such as fluorophogopite $KM_3(AlSi_3O_{10})F_2$ or potassium tetrasilicic mica $KMg_{2.5}(Si_4O_{10})F_2$; and swellable mica such as Na tetrasilicic mica $NaMg_{2.5}(Si_4O_{10})F_2$, Na or Li teniolite $(Na,Li)Mg_2Li(Si_4O_{10})F_2$, montmorillonite-based Na or Li hectorite $(Na,Li)_{1/8}Mg_{2/5}Li_{1/8}(Si_4O_{10})F_2$. Further, synthetic smectite is also useful.

Among the above-described mica compounds, fluorine-based swellable mica is particularly useful. In other words, swellable synthetic mica has a laminated structure formed of unit crystal lattice layers having a thickness of 10 to 15 Å (angstrom, 1 Å=0.1 nm), and substitution of metal atoms in the lattice is significantly larger than that in other clay minerals. As the result, the lattice layers causes shortage of a positive charge. In order to compensate for this, cations such as $Li^+$, $Na^+$, $Ca^{2+}$, and $Mg^{2+}$ are adsorbed between layers. Cations interposed between layers are referred to as exchangeable cations and can be exchanged for various cations. Particularly, in a case where interlayer cations are $Li^+$ and $Na^+$, since the ion radii thereof is small, bonds between layered crystal lattices are weak and largely swollen due to water. In a case where shearing is applied in this state, cleavage easily occurs so that a sol stabilized in water is formed. The swellable synthetic mica has such a strong tendency and is particularly preferably used.

As the shape of the mica compound, from the viewpoint of controlling diffusion, it is preferable that the thickness thereof is as small as possible and the plane size thereof is as large as possible within the range in which the smoothness of the coating surface or the permeability of actinic rays is not inhibited. Therefore, the aspect ratio thereof is preferably 20 or greater, more preferably 100 or greater, and particularly preferably 200 or greater. The aspect ratio is a ratio of the major axis to the thickness of a particle and can be measured using, for example, a projection drawing obtained from a microphotograph of particles. The effects to be obtained are increased as the aspect ratio becomes larger.

In the particle diameter of the mica compound, the average major diameter thereof is preferably in a range of 0.3 to 20 µm, more preferably in a range of 0.5 to 10 µm, and particularly preferably in a range of 1 to 5 µm. The average thickness of the particles is preferably 0.1 µm or less, more preferably 0.05 µm or less, and particularly preferably 0.01 µm or less. Specifically, for example, as a preferable aspect in a case of swellable synthetic mica which is a representative compound, the thickness is in a range of 1 to 50 nm and the surface size (major diameter) is in a range of 1 to 20 µm.

The content of the inorganic layered compound is preferably in a range of 0% to 60% by mass and more preferably in a range of 3% to 50% by mass with respect to the total solid content of the protective layer. In a case where a plurality of kinds of inorganic layered compounds are used in combination, it is preferable that the total amount of the inorganic layered compounds is the content described above. In a case where the content thereof is in the above-described range, the oxygen-blocking property is improved and excellent sensitivity is obtained. Further, degradation of the impressing properties can be prevented.

The protective layer may contain known additives such as a plasticizer for imparting flexibility, a surfactant for improving the coating properties, and inorganic fine particles for controlling the slipperiness of the surface. Further, the protective layer may contain a sensitizing agent described in the section of the image recording layer.

The protective layer is applied according to a known method. The coating amount (solid content) of the protective layer is preferably in a range of 0.01 to 10 g/m², more preferably in a range of 0.02 to 3 g/m², and particularly preferably 0.02 to 1 g/m².

<Support>

A support of the planographic printing plate precursor according to the embodiment of the present disclosure can be appropriately selected from known supports for a planographic printing plate precursor and then used.

As the support, a support having a hydrophilic surface is preferable.

An aluminum plate subjected to a roughening treatment and an anodization treatment according to known methods is preferable as the support.

The aluminum plate may be subjected to a treatment appropriately selected from an expansion treatment or a sealing treatment of micropores of an anodized film described in JP2001-253181A or JP2001-322365A or a surface hydrophilization treatment using alkali metal silicate described in U.S. Pat. Nos. 2,714,066A, 3,181,461A, 3,280,734A, and 3,902,734A or a surface hydrophilization treatment using polyvinyl phosphonic acid described in U.S. Pat. Nos. 3,276,868A, 4,153,461A, and 4,689,272A as necessary.

The center line average roughness Ra of the support is preferably in a range of 0.10 to 1.2 µm.

The support may have a back coat layer that contains an organic polymer compound described in JP1993-045885A (JP-H05-045885A) and an alkoxy compound of silicon described in JP1994-035174A (JP-H6-035174A) on a surface on the opposite side where the image recording layer is provided as necessary.

(Plate-Making Method for Planographic Printing Plate)

According to the first aspect of the present disclosure, a plate-making method for a planographic printing plate includes: a step (exposure step) of subjecting the planographic printing plate precursor according to the embodiment of the present disclosure to image-wise light exposure; and a step (developer development step) of removing a non-image area of an image recording layer from the exposed planographic printing plate precursor in the presence of a developer having a pH of 2 to 14.

According to the second aspect of the present disclosure, a plate-making method for a planographic printing plate includes: a step (exposure step) of subjecting the planographic printing plate precursor according to the embodiment of the present disclosure to image-wise light exposure; and a step (on-press development step) of supplying any one or both of printing ink and dampening water and removing a non-image area of an image recording layer on a printing press.

<Exposure Step>

In the first embodiment and the second embodiment of the plate-making method for a planographic printing plate, the exposure step is common.

The image exposure in the exposure step is performed by image-wise exposing the planographic printing plate precursor to image forming radiation, but it is preferable that the image exposure is performed according to a method of performing scanning exposure on digital data to an infrared laser or the like.

The wavelength of an exposure light source is preferably in a range of 750 nm to 1400 nm. As the light source having a wavelength of 750 nm to 1400 nm, a solid-state laser or a semiconductor laser that radiates infrared rays is suitable. The exposure mechanism may be any of an internal drum system, an external drum system, or a flat bed system.

The exposure step can be performed using a plate setter according to a known method. Further, the exposure may be performed on a printing press after the planographic printing plate precursor is mounted on the printing press using a printing press provided with an exposure device.

<Developer Development Step>

A planographic printing plate can be prepared using the planographic printing plate precursor according to the embodiment of the present disclosure by appropriately selecting a polymer and the like serving as constituent components of the image recording layer and performing a development treatment using a developer. As the development treatment using a developer, a treatment (also referred to as alkali development) using a developer with a high pH of 14 or less which contains an alkali agent or a treatment (also referred to as simple development) using a developer with a pH of 2 to 11 which contains at least one compound selected from the group consisting of surfactants and water-soluble polymer compounds may be exemplified. Alkali development and simple development can be performed according to known methods.

Hereinafter, the details of each component of the developer (simple treatment developer) used for the simple development will be described.

<<Surfactant>>

The simple treatment developer may contain a surfactant such as an anionic surfactant, a non-ionic surfactant, a cationic surfactant, or a betaine surfactant.

Among these, from the viewpoints of scratch and stain resistance and impressing properties, it is preferable that the simple treatment developer contains at least one selected from the group consisting of anionic surfactants and non-ionic surfactants and more preferable that the simple treatment developer contains an anionic surfactant and a non-ionic surfactant.

Preferred examples of the anionic surfactant include compounds represented by Formula (I).

$$R^1—Y^1—X^1 \quad (I)$$

In Formula (I), $R^1$ represents an alkyl group, a cycloalkyl group, an alkenyl group, an aralkyl group, or an aryl group which may have a substituent.

As the alkyl group, an alkyl group having 1 to 20 carbon atoms is preferable, and preferred specific examples thereof include a methyl group, an ethyl group, a propyl group, an n-butyl group, a sec-butyl group, a hexyl group, a 2-ethylhexyl group, an octyl group, a decyl group, a dodecyl group, a hexadecyl group, and a stearyl group.

The cycloalkyl group may be monocyclic or polycyclic. As the monocyclic cycloalkyl group, a monocyclic cycloalkyl group having 3 to 8 carbon atoms is preferable, and a cyclopropyl group, a cyclopentyl group, a cyclohexyl group, or a cyclooctyl group is more preferable. Preferred examples of the polycyclic cycloalkyl group include an adamantyl group, a norbornyl group, an isobornyl group, a camphanyl group, a dicyclopentyl group, an α-pinel group, and a tricyclodecanyl group.

As the alkenyl group, for example, an alkenyl group having 2 to 20 carbon atoms is preferable, and preferred specific examples thereof include a vinyl group, an allyl group, a butenyl group, and a cyclohexenyl group.

As the aralkyl group, for example, an aralkyl group having 7 to 12 carbon atoms is preferable, and preferred specific examples thereof include a benzyl group, a phenethyl group, and a naphthylmethyl group.

As the aryl group, for example, an aryl group having 6 to 15 carbon atoms is preferable, and preferred specific examples thereof include a phenyl group, a tolyl group, a dimethylphenyl group, a 2,4,6-trimethylphenyl group, a naphthyl group, an anthryl group, and a 9,10-dimethoxyanthryl group.

As the substituent, a monovalent nonmetallic atom group excluding a hydrogen atom is used, and preferred examples thereof include a halogen atom (F, Cl, Br, or I), a hydroxy group, an alkoxy group, an aryloxy group, an acyl group, an amide group, an ester group, an acyloxy group, a carboxy group, a carboxylic acid anion group, and a sulfonic acid anion group.

As specific examples of the alkoxy group in these substituents, a methoxy group, an ethoxy group, a propyloxy group, an isopropyloxy group, a butyloxy group, a pentyloxy group, a hexyloxy group, a dodecyloxy group, a stearyloxy group, a methoxyethoxy group, a poly(ethyleneoxy) group, and a poly(propyleneoxy) group, respectively having 1 to 40 carbon atoms, are preferable; and these groups respectively having 1 to 20 carbon atoms are more preferable. Examples of the aryloxy group include a phenoxy group, a tolyloxy group, a xylyloxy group, a mesityloxy group, a cumenyloxy group, a methoxyphenyloxy group, an ethoxyphenyloxy group, a chlorophenyloxy group, a bromophenyloxy group, and a naphthyloxy group, respectively having 6 to 18 carbon atoms. Examples of the acyl group include an acetyl group, a propanoyl group, a butanoyl group, a benzoyl group, and a naphthoyl group, respectively having 2 to 24 carbon atoms. Examples of the amide group include an acetamide group, a propionic acid amide group, a dodecanoic acid amide group, a palmitic acid amide group, a stearic acid amide group, a benzoic acid amide group, and a naphthoic acid amide group, respectively having 2 to 24 carbon atoms. Examples of the acyloxy group include an acetoxy group, a propanoyloxy group, a benzoyloxy group, and a naphthoyloxy group, respectively having 2 to 20 carbon atoms. Examples of the ester group include a methyl ester group, an ethyl ester group, a propyl ester group, a hexyl ester group, an octyl ester group, a dodecyl ester group, and a stearyl ester group, respectively having 1 to 24 carbon atoms. The substituent may be formed by combining two or more substituents described above.

$X^1$ represents a sulfonate group, a sulfate monoester group, a carboxylate group, or a phosphate group.

$Y^1$ represents a single bond, $—C_nH_{2n}—$, $—C_{n-m}H_{2(n-m)}OC_mH_{2m}—$, $—O—(CH_2CH_2O)_n—$, $—O—(CH_2CH_2CH_2O)_n—$, $—CO—NH—$, or a divalent linking group formed by combining two or more of these and satisfies the expressions of "n≥1" and "n≥m≥0".

Among examples of the compound represented by Formula (I), from the viewpoint of scratch and stain resistance, a compound represented by Formula (I-A) or Formula (I-B) is preferable.

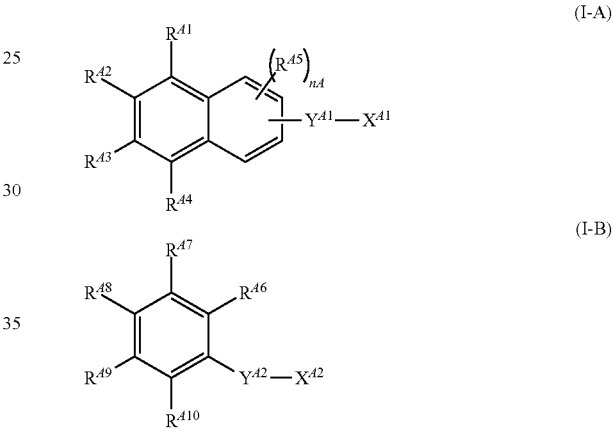

In Formulae (I-A) and (I-B), $R^{41}$ to $R^{410}$ each independently represent a hydrogen atom or an alkyl group, nA represents an integer of 1 to 3, $X^{41}$ and $X^{42}$ each independently represent a sulfonate group, a sulfate monoester group, a carboxylate group, or a phosphate group, and $Y^{41}$ and $Y^{42}$ each independently represent a single bond, $—C_nH_{2n}—$, $—C_{n-m}H_{2(n-m)}OC_mH_{2m}—$, $—O—(CH_2CH_2O)_n—$, $—O—(CH_2CH_2CH_2O)_n—$, $—CO—NH—$, or a divalent linking group formed by combining two or more of these and satisfy the expressions of "n≥1" and "n≥m≥0". The total number of carbon atoms in $R^{41}$ to $R^{45}$ or $R^{46}$ to $R^{410}$ and $Y^{41}$ and $Y^{42}$ is 3 or greater.

The total number of carbon atoms in $R^{41}$ to $R^{45}$ and $Y^{14}$ or $R^{46}$ to $R^{410}$ and $Y^{42}$ in the compound represented by Formula (I-A) or (I-B) is preferably 25 or less and more preferably in a range of 4 to 20. The structure of the above-described alkyl group may be linear or branched.

It is preferable that $X^{41}$ and $X^{42}$ in the compound represented by Formula (I-A) or (I-B) represent a sulfonate group or a carboxylate group. Further, the salt structure in $X^{41}$ and $X^{42}$ is preferable from the viewpoint that the solubility of the alkali metal salt in a water-based solvent is particularly excellent. Among the salt structures, a sodium salt or a potassium salt is particularly preferable.

As the compound represented by Formula (I-A) or (I-B), the description in paragraphs 0019 to 0037 of JP2007-206348A can be referred to.

As the anionic surfactant, the compounds described in paragraphs 0023 to 0028 of JP2006-065321A can be suitably used.

Examples of non-ionic surfactant include polyoxyethylene alkyl ethers, polyoxyethylene alkyl phenyl ethers, polyoxyethylene polystyryl phenyl ether, glycerin fatty acid partial esters, sorbitan fatty acid partial esters, pentaerythritol fatty acid partial esters, propylene glycol monofatty acid ester, sucrose fatty acid partial ester, polyoxyethylene sorbitan fatty acid partial esters, polyoxyethylene sorbitol fatty acid partial esters, polyethylene glycol fatty acid esters, polyglycerin fatty acid partial esters, polyoxyethylene glycerin fatty acid partial esters, polyoxyethylene diglycerins, fatty acid diethanolamides, N,N-bis-2-hydroxyalkylamines, polyoxyethylene alkylamine, triethanolamine fatty acid ester, trialkylamine oxide, polyoxyethylene alkyl phenyl ethers, and polyoxyethylene-polyoxypropylene block copolymers.

Further, acetylene glycol-based and acetylene alcohol-based oxyethylene adducts, fluorine-based surfactants, and silicone-based surfactants can also be used. These surfactants can be used in combination of two or more kinds thereof.

Particularly preferred examples of the non-ionic surfactant include a non-ionic aromatic ether-based surfactant represented by Formula (N1).

$$X^N—Y^N—O-(A^1)_{nB}-(A^2)_{mB}—H \quad (N1)$$

In the formula, $X^N$ represents an aromatic group which may have a substituent, $Y^N$ represents a single bond or an alkylene group having 1 to 10 carbon atoms, $A^1$ and $A^2$ are different groups and represent any of —CH$_2$CH$_2$O— or —CH$_2$CH(CH$_3$)O—, nB and mB each independently represent an integer of 0 to 100, where both of nB and mB do not represent 0 at the same time. Further, both of nB and mB do not represent 1 at the same time in a case where any of nB or mB represents 0.

In the formula, examples of the aromatic group as $X^N$ include a phenyl group, a naphthyl group, and an anthranyl group. These aromatic groups may have a substituent. As the substituent, an organic group having 1 to 100 carbon atoms is exemplified. Further, in the formula, this may represent a random or block copolymer in a case where both of A and B are present.

Specific examples of the organic group having 1 to 100 carbon atoms include aliphatic hydrocarbon groups and aromatic hydrocarbon groups, which may be saturated or unsaturated and linear or branched, such as an alkyl group, an alkenyl group, an alkynyl group, an aryl group, and an aralkyl group, an alkoxy group, an aryloxy group, a N-alkylamino group, a N,N-dialkylamino group, a N-arylamino group, a N,N-diarylamino group, a N-alkyl-N-arylamino group, an acyloxy group, a carbamoyloxy group, a N-alkylcarbamoyloxy group, a N-arylcarbamoyloxy group, a N,N-dialkylcarbamoyloxy group, a N,N-diarylcarbamoyloxy group, a N-alkyl-N-arylcarbamoyloxy group, an acylamino group, a N-alkylacylamino group, a N-arylacylamino group, an acyl group, an alkoxycarbonylamino group, an alkoxycarbonyl group, an aryloxycarbonyl group, a carbamoyl group, a N-alkylcarbamoyl group, a N,N-dialkylcarbamoyl group, a N-arylcarbamoyl group, a N,N-diarylcarbamoyl group, a N-alkyl-N-arylcarbamoyl group, a polyoxyalkylene chain, and the above-described organic group to which a polyoxyalkylene chain is bonded. The alkyl group may be linear or branched.

Further, as the non-ionic surfactants, compounds described in paragraphs 0030 to 0040 of JP2006-065321A can also be suitably used.

The surfactant may be used alone or in combination of two or more kinds thereof.

The content of the surfactant is preferably in a range of 1% by mass to 25% by mass, more preferably in a range of 2% by mass to 20% by mass, still more preferably in a range of 3% by mass to 15% by mass, and particularly preferably in a range of 5% by mass to 10% by mass with respect to the total mass of the developer. In a case where the content thereof is in the above-described range, the scratch and stain resistance is excellent, the dispersibility of the development scum is excellent, and the impressing properties of the planographic printing plate to be obtained are excellent.

<<Water-Soluble Polymer Compound>>

From the viewpoints of adjusting the viscosity of the developer and protecting the plate surface of the planographic printing plate to be obtained, the simple treatment developer may contain a water-soluble polymer.

Examples of the water-soluble polymer compound which can be contained in the developer include soybean polysaccharides, modified starch, arabic gum, dextrin, a fiber derivative (such as carboxymethyl cellulose, carboxyethyl cellulose, or methyl cellulose) and a modified product thereof, pullulan, polyvinyl alcohol and a derivative thereof, polyvinylpyrrolidone, polyacrylamide and an acrylamide copolymer, a vinyl methyl ether/maleic anhydride copolymer, a vinyl acetate/maleic anhydride copolymer, and a styrene/maleic anhydride copolymer.

As the soybean polysaccharides, those which have been known in the related art can be used. For example, SOYAFIBE (trade name, manufactured by FUJI OIL, CO., LTD.) can be used as a commercially available product, and various grades of products can be used. Preferred examples thereof include products in which the viscosity of a 10 mass % aqueous solution is in a range of 10 mPa/sec to 100 mPa/sec.

As the modified starch, starch represented by Formula (III) is preferable. Any of starch such as corn, potato, tapioca, rice, or wheat can be used as the starch represented by Formula (III). The modification of the starch can be performed according to a method of decomposing 5 to 30 glucose residues per one molecule with an acid or an enzyme and adding oxypropylene to an alkali.

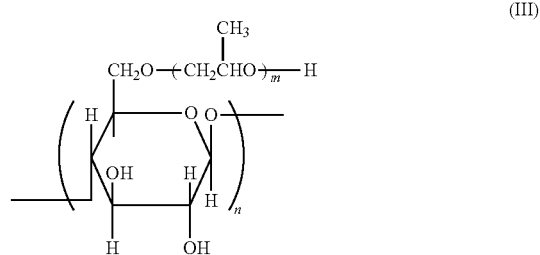

In the formula, the etherification degree (degree of substitution) is in a range of 0.05 to 1.2 per glucose unit, n represents an integer of 3 to 30, and m represents an integer of 1 to 3.

Among the examples of the water-soluble polymer compound, soybean polysaccharides, modified starch, arabic gum, dextrin, carboxymethyl cellulose, and polyvinyl alcohol are particularly preferable.

The water-soluble polymer compound can be used in combination of two or more kinds thereof.

It is preferable that the developer does not contain the water-soluble polymer compound or the content of the water-soluble polymer compound is greater than 0% by mass and 1% by mass or less with respect to the total mass of the developer, more preferable that the developer does not contain the water-soluble polymer compound or the content of the water-soluble polymer compound is greater than 0% by mass and 0.1% by mass or less with respect to the total mass of the developer, still more preferable that the developer does not contain a water-soluble polymer compound or the content of the water-soluble polymer compound is greater than 0% by mass and 0.05% by mass or less with respect to the total mass of the developer, and particularly preferable that the developer does not contain a water-soluble polymer compound. In a case of the above-described aspect, the viscosity of the developer is moderate, and deposition of development scum and the like on a roller member of an automatic development device can be suppressed.

<<Other Additives>>

The simple treatment developer may contain a wetting agent, a preservative, a chelate compound, an antifoaming agent, an organic acid, an organic solvent, an inorganic acid, and an inorganic salt in addition to those described above.

Suitable examples of the wetting agent include ethylene glycol, propylene glycol, triethylene glycol, butylene glycol, hexylene glycol, diethylene glycol, dipropylene glycol, glycerin, trimethylolpropane, and diglycerin. The wetting agent may be used alone or in combination of two or more kinds thereof. The content of the wetting agent is preferably in a range of 0.1% by mass to 5% by mass with respect to the total mass of the developer.

Preferred examples of the preservative include phenol and a derivative thereof, formalin, an imidazole derivative, a sodium dehydroacetate, 4-isothiazoline-3-one derivative, benzoisothiazolin-3-one, 2-methyl-4-isothiazolin-3-one, a benztriazole derivative, derivatives of quaternary ammonium salts, pyridine, quinoline, and guanidine, diazine, a triazole derivative, oxazole, an oxazole derivative, nitrobromo alcohol-based 2-bromo-2-nitropropane-1,3-diol, 1,1-dibromo-1-nitro-2-ethanol, and 1,1-dibromo-1-nitro-2-propane.

The amount of the preservative to be added is an amount of stably exhibiting the efficacy for bacterial, molds, yeasts, or the like, and is preferably in a range of 0.01% by mass to 4% by mass with respect to the total mass of the developer even though the amount thereof varies depending on the type of bacteria, molds, and the yeasts. Further, it is preferable that the preservative is used in combination of two or more kinds thereof so as to be effective for sterilizing various molds.

Examples of the chelate compound include organic phosphonic acids such as ethylenediamine tetraacetic acid, a potassium salt thereof, and a sodium salt thereof; diethylenetriamine pentaacetic acid, a potassium salt thereof, and a sodium salt thereof; triethylenetetraminehexaacetic acid, a potassium salt thereof, and a sodium salt thereof; hydroxyethylethylenediamine triacetic acid, a potassium salt thereof, and a sodium salt thereof; nitrilotriacetic acid and a sodium salt thereof; 1-hydroxyethane-1,1-diphosphonic acid, a potassium salt thereof, and a sodium salt thereof; and aminotri(methylenephosphonic acid), a potassium salt, and a sodium salt thereof. A salt of an organic amine is effectively used in place of a sodium salt or a potassium salt of a chelating agent.

A chelating agent which is stably present in the composition of the treatment liquid and does not disturb the printability is preferable as the chelating agent. The content of the chelating agent is preferably in a range of 0.001% by mass to 1.0% by mass with respect to the total mass of the developer.

As the antifoaming agent, a typical silicone-based self-emulsifying type compound, an emulsifying type compound, a non-ionic compound having a hydrophilic-lipophilic balance (HLB) of 5 or less can be used. A silicone antifoaming agent is preferable.

The content of the antifoaming agent is suitably in a range of 0.001% by mass to 1.0% by mass with respect to the total mass of the developer.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, gluconic acid, and organic phosphonic acid. The organic acid can be used in the form of an alkali metal salt or ammonium salt thereof. The content of the organic acid is preferably in a range of 0.01% by mass to 5% by mass with respect to the total mass of the developer.

Examples of the organic solvent which can be contained include aliphatic hydrocarbons (hexane, heptane, "ISOPAR E, H, G" (manufactured by Exxon Chemical Japan Ltd.), gasoline, kerosene, and the like), aromatic hydrocarbons (toluene, xylene, and the like), halogenated hydrocarbon (methylene dichloride, ethylene dichloride, trichlene (trichloroethylene), monochlorobenzene, or the like), and a polar solvent.

Examples of the polar solvent include alcohols (such as methanol, ethanol, propanol, isopropanol, benzyl alcohol, ethylene glycol monomethyl ether, 2-ethoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, methyl phenyl carbinol, n-amyl alcohol, and methyl amyl alcohol), ketones (such as acetone, methyl ethyl ketone, ethyl butyl ketone, methyl isobutyl ketone, and cyclohexanone), esters (such as ethyl acetate, propyl acetate, butyl acetate, amyl acetate, benzyl acetate, methyl lactate, butyl lactate, ethylene glycol monobutyl acetate, propylene glycol monomethyl ether acetate, diethylene glycol acetate, diethyl phthalate, and butyl levulinate), and others (such as triethyl phosphate, tricresyl phosphate, N-phenylethanolamine, and N-phenyldiethanolamine).

In a case where the organic solvent is insoluble in water, the organic solvent can be used by being solubilized in water using a surfactant or the like. In a case where the developer contains an organic solvent, from the viewpoints of safety and inflammability, the concentration of the solvent in the developer is preferably less than 40% by mass.

Examples the inorganic acid and inorganic salt include phosphoric acid, methacrylic acid, primary ammonium phosphate, secondary ammonium phosphate, primary sodium phosphate, secondary sodium phosphate, primary potassium phosphate, secondary potassium phosphate, sodium tripolyphosphate, potassium pyrophosphate, sodium hexametaphosphate, magnesium nitrate, sodium nitrate, potassium nitrate, ammonium nitrate, sodium sulfate, potassium sulfate, ammonium sulfate, sodium sulfite, ammonium sulfite, sodium hydrogensulfate, and nickel sulfate. The content of the inorganic salt is preferably in a range of 0.01% by mass to 0.5% by mass with respect to the total mass of the developer.

The simple treatment developer is obtained by dissolving or dispersing each of the above-described components in water as necessary. The concentration of solid contents in the developer is preferably in a range of 2% by mass to 25% by mass. The developer can be used by preparing a concentrate and diluting the concentrate with water at the time of use.

It is preferable that the simple treatment developer is an aqueous developer.

The pH of the simple treatment developer is in a range of 5 to 10, preferably 6 to 9, and more preferably in a range of 7 to 9. From the viewpoints of developability and dispersibility of the image recording layer, it is advantageous that the pH is set to be high. However, from the viewpoints of printability and particularly stains, it is effective that the pH is set to be low.

From the viewpoint of the dispersibility of the development scum, it is preferable that the simple treatment developer contains an alcohol compound.

Examples of the alcohol compound include methanol, ethanol, propanol, isopropanol, and benzyl alcohol. Among these, benzyl alcohol is preferable.

From the viewpoint of the dispersibility of the development scum, the content of the alcohol compound is preferably in a range of 0.01% by mass to 5% by mass, more preferably in a range of 0.1% by mass to 2% by mass, and particularly preferably in a range of 0.2% by mass to 1% by mass with respect to the total mass of the developer.

—Development Treatment Method—

In the removal step (development treatment step, in a case where the development is carried out by performing a treatment manually, a method of allowing sponge or absorbent cotton to contain a sufficient amount of an aqueous solution, performing the treatment while rubbing the entire plate surface, and sufficiently drying the aqueous solution after the treatment is completed is suitably exemplified. In a case of an immersion treatment, for example, a method of immersing the planographic printing plate precursor in a tray, a deep tank, or the like containing an aqueous solution therein for approximately 60 seconds, stirring the solution, and sufficiently drying the aqueous solution while rubbing the plate surface with absorbent cotton or sponge is suitably exemplified.

It is preferable that a device whose structure and steps are simplified is used in the development treatment.

In the development treatment of the related art, a protective layer is removed by a pre-water washing step, development is performed using an alkaline developer, an alkali is removed by a post-water washing step, the gum treatment is performed by a gum coating step, and drying is performed by a drying step.

In the present disclosure, development and gum coating can be simultaneously performed using one liquid. Therefore, the post-water washing step and the gum treatment step are not particularly required, and it is preferable that the drying step is performed after development and gum coating are performed using one liquid. As the gum, a polymer and more preferably a water-soluble polymer compound and a surfactant may be exemplified.

Further, it is preferable that removal of the protective layer, development, and gum coating are simultaneously performed using one liquid without performing the pre-water washing step. Further, it is preferable that the excessive developer is removed using a squeeze roller after the development and the gum coating and then drying is performed.

The removal step (development treatment step) in the present disclosure may be performed according to a method of performing immersion in a developer once or a method of performing immersion twice or more times. Among examples, a method of performing immersion in the developer once or twice is preferable.

The immersion may be carried out by passing the exposed planographic printing plate precursor through a developer tank in which the developer is stored or spraying the developer onto the plate surface of the exposed planographic printing plate precursor using a spray or the like.

Further, in the present disclosure, the development treatment is performed using one liquid (one liquid treatment) even in a case where the planographic printing plate precursor is immersed in the developer twice or more times or in a case where the planographic printing plate precursor is immersed, twice or more times, in the same developer as described above or a developer (fatigue liquid) obtained by dissolving or dispersing components of the image recording layer using the developer and the development treatment.

Further, it is preferable that a rubbing member is used in the development treatment and also preferable that a rubbing member such as a brush is provided in a developing bath that removes a non-image area of the image recording layer.

The development treatment in the present disclosure can be performed by immersing the planographic printing plate precursor which has been subjected to the exposure treatment in the developer and rubbing the precursor with brushes or pumping up the treatment liquid added to an external tank using a pump, spraying the developer from a spray nozzle, and rubbing the precursor with brushes at a temperature of preferably 0° C. to 60° C. and more preferably 15° C. to 40° C., according to a conventional method. These development treatments can be continuously performed plural times. For example, the development treatment can be performed by pumping up the developer added to an external tank using a pump, spraying the developer from a spray nozzle, rubbing the plate surface with brushes, spraying the developer from the spray nozzle again, and rubbing the plate surface with the brushes. In a case where the development treatment is performed using an automatic development device, since the developer becomes fatigued as the treatment amount increases, it is preferable that the treatment capability is recovered using a replenisher or a fresh developer.

The development treatment in the present disclosure in the present disclosure can also be performed using a gum coater or an automatic development device which has been known to be used for a presensitized (PS) plate and computer-to-plate (CTP) in the related art. In a case where an automatic development device is used, for example, any system from among a system of performing the treatment by pumping the developer added to a development tank or the developer added to an external tank using a pump and spraying the developer from a spray nozzle, a system of performing the treatment by immersing a printing plate in a tank filled with the developer and transporting the printing plate using a guide roller in the developer, and a so-called disposable treatment system, which is a system of performing the treatment by supplying the substantially unused developer by an amount required for each plate can be employed. In all systems, it is preferable that a rubbing mechanism using brushes or a molleton is provided. For example, commercially available automatic development devices (Clean Out Unit C85/C125, Clean-Out Unit+C85/120, FCF 85V, FCF 125V, FCF News (manufactured by Glunz & Jensen); and Azura CX85, Azura CX125, and Azura CX150 (manufactured by AGFA GRAPHICS) can be used. In addition, a device in which a laser exposure portion and an automatic development device portion are integrally incorporated can also be used.

<On-Press Development Step>

In the on-press development step, an unexposed portion of the planographic printing plate precursor is removed at an initial stage of the printing, the surface of the hydrophilic support is exposed along with the removal, and a non-image area is formed in a case where at least one selected from the group consisting of printing ink and dampening water and preferably printing ink and dampening water are supplied and the printing (on-press development) is initiated without performing any development treatment on the image-exposed planographic printing plate precursor. As the printing ink and dampening water, known printing ink for planographic printing and dampening water are used. Here, printing ink or dampening water may be initially supplied to the surface of the planographic printing plate precursor, but it is preferable that printing ink is initially supplied thereto from a viewpoint of preventing contamination of dampening water by the removed image recording layer components.

In this manner, the planographic printing plate precursor is subjected to on-press development on an off-set printing press and used as it is for a plurality of sheets of printing.

The plate-making method for a planographic printing plate according to the embodiment of the present disclosure may include known steps other than the above-described steps. Examples of other steps include a plate inspection step of confirming the orientation or position of the planographic printing plate precursor before each step and a confirmation step of confirming the printed image after the on-press development step.

EXAMPLES

Hereinafter, the embodiments of the present invention will be described in detail based on the examples, but the present disclosure is not limited to these. In the polymer compound, the molecular weight is a weight-average molecular weight (Mw) in terms of polystyrene according to a gel permeation chromatography (GPC) method and the ratio of repeating units is a molar percentage unless otherwise specified. Further, "part(s)" indicates "part(s) by mass" unless otherwise specified.

Examples 1 to 35 and Comparative Examples 1 to 4

<Preparation of Support>

In order to remove rolling oil on a surface of an aluminum plate (Material JIS A 1050) having a thickness of 0.3 mm, a degreasing treatment was performed using a 10 mass % sodium aluminate aqueous solution at 50° C. for 30 seconds, the surface of the aluminum was grains using three bundle nylon brushes having a diameter of 0.3 mm and a pumice water suspension (specific gravity of 1.1 g/cm$^3$) having a median diameter of 25 μm and then sufficiently washed with water. This aluminum plate was immersed in a 25 mass % sodium hydroxide aqueous solution at 45° C. for 9 seconds, etched, washed with water, and further immersed in a 20 mass % nitric acid aqueous solution at 60° C. for 20 seconds, and then washed with water. The etching amount of the grained surface at this time was approximately 3 g/m$^2$.

Next, an electrochemical roughening treatment was continuously performed using an AC voltage of 60 Hz. As the electrolytic solution, a 1 mass % nitric acid aqueous solution (including 0.5% by mass of aluminum ions) was used at a liquid temperature of 50° C. Using a trapezoidal rectangular waveform alternating current having time TP, until the current value reached a peak from zero, of 0.8 msec and the duty ratio of 1:1 as an AC power source waveform, the electrochemical roughening treatment was performed using a carbon electrode as a counter electrode. As an auxiliary anode, ferrite was used. The current density was 30 A/dm$^2$ as the peak current value, and 5% of the current flowing from the power source was separated to an auxiliary anode. The electric quantity in the nitric acid electrolysis was 175 C/dm$^2$ which is an electric quantity in a case where the aluminum plate was an anode. Thereafter, washing with water using a spray was performed.

Next, an electrochemical roughening treatment was performed according to the same method as the method for nitric acid electrolysis under the condition of an electric quantity of 50 C/dm$^2$ in a case where an aluminum plate is an anode in a 0.5 mass % hydrochloric acid aqueous solution (including 0.5% by mass of aluminum ions) and an electrolytic solution at a liquid temperature of 50° C. Subsequently, washing with water using a spray was performed.

Next, 2.5 g/m$^2$ of a DC anodized film was provided on this aluminum plate at a current density of 15 A/dm$^2$ using a 15 mass % nitric acid aqueous solution (including 0.5% by mass of aluminum ions) as an electrolytic solution, washed with water, and then dried, thereby preparing a support. The average pore diameter (surface average pore diameter) in the surface layer of the anodized film was 10 nm.

The pore diameter in the surface layer of the anodized film was measured by observing the surface at a magnification of 150000 times using an ultra-high resolution type SEM (S-900, manufactured by Hitachi, Ltd.) without performing a vapor deposition treatment and the like to impart the conductivity at a relatively low acceleration voltage of 12 V, randomly extracting 50 pores, and acquiring the average value. The standard deviation was ±10% or less.

<Formation of Undercoat Layer>

Next, the support was coated with an undercoat layer coating solution (1) such that the dry coating amount thereof was set to 20 mg/m$^2$, thereby preparing a support having an undercoat layer.

[Undercoat Layer Coating Solution (1)]

Compound (1) for undercoat layer having the following structure: 0.18 parts

Methanol: 55.24 parts

Water: 6.15 parts

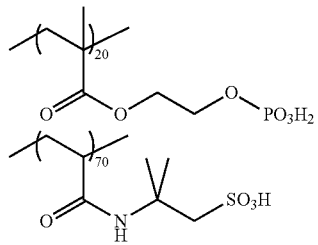

Compound (1)

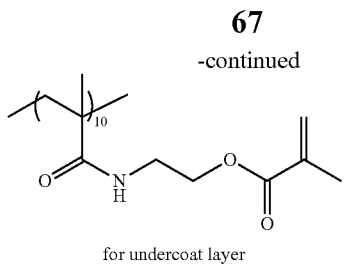

for undercoat layer

<Formation of Image Recording Layer>
The undercoat layer was bar-coated with the following image recording layer coating solution (1) and dried in an oven at 100° C. for 60 seconds, thereby forming an image recording layer having a dry coating amount of 1.0 g/m².

The image recording layer coating solution (1) was prepared by mixing the following photosensitive liquid (1) and the following microgel solution immediately before coating and stirring the solution.

Further, in the photosensitive liquid (1), the compound A corresponds to an electron-accepting radical initiator or electron-donating radical initiator that generates the first peak and the compound B corresponds to a radiation absorption compound or electron-donating radical initiator that generates peaks subsequent to the initially generated peak.

[Photosensitive Liquid (1)]
Binder polymer (1) [the following structure]: 0.240 parts
Radiation absorption compound: 0.030 parts
Compound A listed in Table 2 or 3: the amount listed in Table 2 or 3
Compound B listed in Table 2 or 3: the amount listed in Table 2 or 3
Radical polymerizable component: 0.192 parts, tris(acryloyloxyethyl)isocyanurate (NK ESTER A-9300, manufactured by Shin-Nakamura Chemical Co., Ltd.)
Low-molecular-weight hydrophilic compound: 0.062 parts, tris(2-hydroxyethyl)isocyanurate
Low-molecular-weight hydrophilic compound (1) [the following structure]: 0.050 parts
Sensitizing agent: 0.055 parts, phosphonium compound (1) [the following structure]
Sensitizing agent: 0.018 parts, benzyl-dimethyl-octyl ammonium•PF₆ salt
Sensitizing agent: 0.035 parts, ammonium group-containing polymer (1) [the following structure, reduced specific viscosity of 44 ml/g]
Fluorine-based surfactant (1) [the following structure]: 0.008 parts
2-Butanone: 1.091 parts
1-Methoxy-2-propanol: 8.609 parts
[Microgel Solution]
Microgel (1): 2.640 parts
Distilled water: 2.425 parts The structures of the binder polymer (1), the low-molecular-weight hydrophilic compound (1), the phosphonium compound (1), the ammonium group-containing polymer (1), and the fluorine-based surfactant (1) used for the photosensitive liquid (1) are shown below. Further, Me represents a methyl group, and each number on the lower right side of the parentheses of each constitutional unit of the polymer indicates the molar ratio.

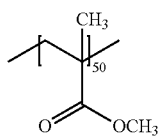

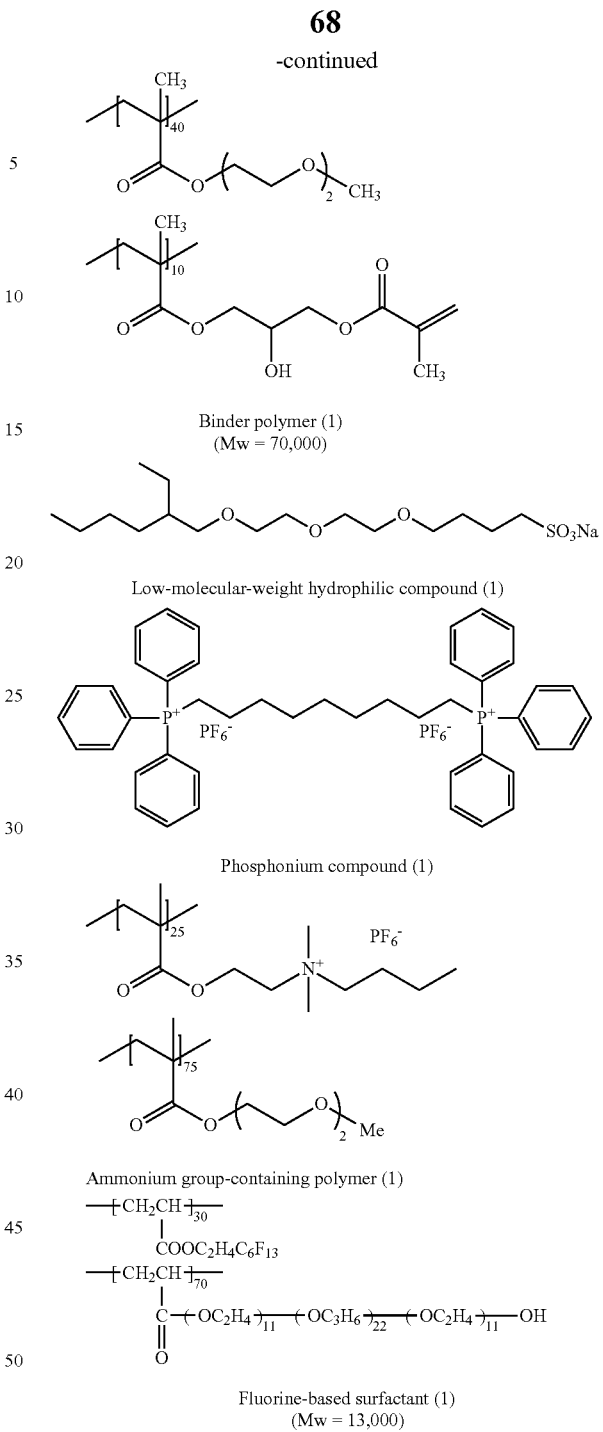

A method of preparing a microgel (1) used for the microgel solution will be described below.

—Preparation of Polyvalent Isocyanate Compound (1)—
0.043 parts of bismuth tris(2-ethylhexanoate) (NEOSTANN U-600 (manufactured by NITTO KASEI CO., LTD.)) was added to an ethyl acetate (25.31 parts) suspension solution of 17.78 parts (80 mmol) of isophorone diisocyanate and 7.35 parts (20 mmol) of the following polyhydric phenol compound (1), and the solution was stirred. The reaction temperature was set to 50° C. at the time of heat generation being subsided, and the solution was stirred for 3 hours, thereby obtaining an ethyl acetate (50% by mass) solution of a polyvalent isocyanate compound (1).

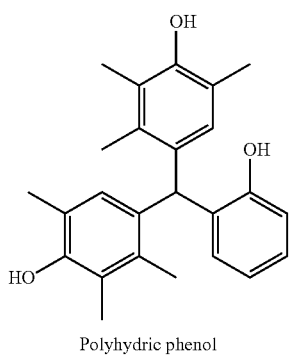

compound (1)

Polyhydric phenol

—Preparation of Microgel (1)—

The following oil phase components and the water phase components were mixed with each other and emulsified at 12000 rpm for 10 minutes using a homogenizer. The obtained emulsion was stirred at 45° C. for 4 hours, 5.20 parts of a 10 mass % aqueous solution of 1,8-diazabicyclo [5.4.0]undeca-7-ene-octylate (U-CAT SA102, manufactured by San-Apro Ltd.) was added thereto, and the solution was stirred at room temperature for 30 minutes and allowed to stand at 45° C. for 24 hours. The concentration of solid contents was adjusted to 20% by mass using distilled water, thereby obtaining an aqueous dispersion of the microgel (1). The volume average particle diameter was measured using a laser diffraction scattering type particle size distribution measuring device LA-920 (manufactured by Horiba Ltd.) according to a light scattering method, and the value was 0.28 μm.

<Oil Phase Components>

(Component 1) ethyl acetate: 12.0 parts (Component 2) adduct (50 mass % ethyl acetate solution, manufactured by Mitsui Chemicals, Inc.) obtained by adding trimethylolpropane (6 mol) and xylene diisocyanate (18 mol) and adding methyl one-terminal polyoxyethylene (1 mol, repetition number of oxyethylene units: 90) thereto: 3.76 parts (Component 3) polyvalent isocyanate compound (1) (as 50 mass % ethyl acetate solution): 15.0 parts (Component 4) 65 mass % solution of dipentaerythritol pentaacrylate (SR-399, manufactured by Sartomer Japan Inc.) in ethyl acetate: 11.54 parts (Component 5) 10% solution of sulfonate type surfactant (PIONINE A-41-C, manufactured by TAKEMOTO OIL & FAT Co., Ltd.) in ethyl acetate: 4.42 parts <Water Phase Components>

Distilled water: 46.87 parts

<Formation of Protective Layer>

In each example and each comparative example, the image recording layer was bar-coated with the protective layer coating solution with the following composition and dried in an oven at 120° C. for 60 seconds to form a protective layer having a dry coating amount of 0.15 g/m². Further, the protective layer had not been formed in a case where "unavailable" is noted in the columns of the protective layer in Table 2 or 3.

[Protective Layer Coating Solution]

Inorganic layered compound dispersion (1) [described below]: 1.5 parts 6 mass % aqueous solution containing polyvinyl alcohol (CKS50, manufactured by Nippon Synthetic Chemical Industry Co., Ltd., sulfonic acid-modified, saponification degree: 99% by mole or greater, degree of polymerization: 300): 0.55 parts 6 mass % aqueous solution containing polyvinyl alcohol (PVA-405, manufactured by KURARAY CO., LTD., saponification degree: 81.5% by mole, degree of polymerization: 500): 0.03 parts 1 mass % aqueous solution containing surfactant (polyoxyethylene lauryl ether, EMALEX 710, manufactured by Nihon Emulsion Co., Ltd.): 0.86 parts Ion exchange water: 6.0 parts A method of preparing the inorganic layered compound dispersion (1) used for the protective layer coating solution is described below.

—Preparation of Inorganic Layered Compound Dispersion (1)—

6.4 parts of synthetic mica (SOMASIF ME-100, manufactured by CO-OP CHEMICAL CO., LTD.) was added to 193.6 parts of ion exchange water and dispersed therein such that the average particle diameter (laser scattering method) was set to 3 μm using a homogenizer. The aspect ratio of the obtained dispersed particles was 100 or greater.

TABLE 2

| | Radiation absorption compound | | Compound A | | | Compound B | | | Protective layer | Difference in LUMO between compound A and radiation absorption compound (eV) | Difference in HOMO between compound B and radiation absorption compound (eV) | Position where peaks subsequent to initially generated peak were generated (ms) |
|---|---|---|---|---|---|---|---|---|---|---|---|---|
| | Type | HOMO (eV) | LUMO (eV) | Type | LUMO (eV) | Content (parts) | Type | HOMO (eV) | Content (parts) | | | | |
| Example 1 | IR-1 | −5.300 | −3.700 | A-1 | −2.952 | 0.110 | B-1 | −5.906 | 0.010 | Available | 0.748 | 0.606 | 200 |
| Example 2 | IR-1 | −5.300 | −3.700 | A-1 | −2.952 | 0.110 | B-2 | −5.959 | 0.010 | Available | 0.748 | 0.659 | 250 |
| Example 3 | IR-2 | −5.437 | −3.814 | A-1 | −2.952 | 0.110 | B-3 | −6.048 | 0.010 | Available | 0.863 | 0.612 | 260 |
| Example 4 | IR-2 | −5.437 | −3.814 | A-1 | −2.952 | 0.110 | B-4 | −6.194 | 0.010 | Available | 0.863 | 0.758 | 275 |
| Example 5 | IR-1 | −5.300 | −3.700 | A-1 | −2.952 | 0.110 | B-5 | −6.329 | 0.010 | Available | 0.748 | 1.029 | 350 |
| Example 6 | IR-1 | −5.300 | −3.700 | A-1 | −2.952 | 0.110 | B-6 | −6.589 | 0.010 | Available | 0.748 | 1.289 | 400 |
| Example 7 | IR-1 | −5.300 | −3.700 | A-1 | −2.952 | 0.110 | B-7 | −5.911 | 0.010 | Available | 0.748 | 0.611 | 220 |
| Example 8 | IR-1 | −5.300 | −3.700 | A-1 | −2.952 | 0.110 | B-8 | −6.205 | 0.010 | Available | 0.748 | 0.905 | 300 |
| Example 9 | IR-1 | −5.300 | −3.700 | A-1 | −2.952 | 0.110 | B-9 | −6.342 | 0.010 | Available | 0.748 | 1.042 | 350 |
| Example 10 | IR-1 | −5.300 | −3.700 | A-1 | −2.952 | 0.110 | B-10 | −6.409 | 0.010 | Available | 0.748 | 1.109 | 380 |
| Example 11 | IR-1 | −5.300 | −3.700 | A-1 | −2.952 | 0.110 | B-11 | −5.931 | 0.010 | Available | 0.748 | 0.631 | 230 |

TABLE 2-continued

| | Radiation absorption compound | | Compound A | | | Compound B | | | Protective layer | Difference in LUMO between compound A and radiation absorption compound (eV) | Difference in HOMO between compound B and radiation absorption compound (eV) | Position where peaks subsequent to initially generated peak were generated (ms) |
|---|---|---|---|---|---|---|---|---|---|---|---|---|
| | Type | HOMO (eV) | LUMO (eV) | Type | LUMO (eV) | Content (parts) | Type | HOMO (eV) | Content (parts) | | | | |
| Example 12 | IR-1 | −5.300 | −3.700 | A-1 | −2.952 | 0.110 | B-12 | −6.113 | 0.010 | Available | 0.748 | 0.813 | 290 |
| Example 13 | IR-1 | −5.300 | −3.700 | A-1 | −2.952 | 0.110 | B-13 | −6.192 | 0.010 | Available | 0.748 | 0.892 | 300 |
| Example 14 | IR-1 | −5.300 | −3.700 | A-1 | −2.952 | 0.110 | B-14 | −6.268 | 0.010 | Available | 0.748 | 0.968 | 330 |
| Example 15 | IR-2 | — | — | B-1 | — | 0.030 | IR-2 | — | 0.030 | Available | — | — | 150 |
| Example 16 | IR-3 | — | — | B-1 | — | 0.030 | IR-3 | — | 0.030 | Available | — | — | 150 |
| Example 17 | IR-4 | — | — | B-1 | — | 0.030 | IR-4 | — | 0.030 | Available | — | — | 200 |
| Example 18 | IR-5 | — | — | B-1 | — | 0.030 | IR-5 | — | 0.030 | Available | — | — | 150 |
| Example 19 | IR-3 | — | — | B-5 | — | 0.030 | IR-3 | — | 0.030 | Available | — | — | 150 |
| Example 20 | IR-4 | — | — | B-5 | — | 0.030 | IR-4 | — | 0.030 | Available | — | — | 200 |

TABLE 3

| | Radiation absorption compound | | | Compound A | | | Compound B | | | Protective layer | Difference in LUMO between compound A and radiation absorption compound (eV) | Difference in HOMO between compound B and radiation absorption compound (eV) | Position where peaks subsequent to initially generated peak were generated (ms) |
|---|---|---|---|---|---|---|---|---|---|---|---|---|---|
| | Type | HOMO (eV) | LUMO (eV) | Type | LUMO (eV) | Content (parts) | Type | HOMO (eV) | Content (parts) | | | | |
| Example 21 | IR-5 | — | — | B-5 | — | 0.030 | IR-5 | — | 0.030 | Available | — | — | 150 |
| Example 22 | IR-6 | — | — | B-5 | — | 0.030 | IR-6 | — | 0.030 | Available | — | — | 210 |
| Example 23 | IR-7 | — | — | B-5 | — | 0.030 | IR-7 | — | 0.030 | Available | — | — | 200 |
| Example 24 | IR-1 | −5.300 | −3.700 | A-2 | −3.036 | 0.110 | B-1 | −5.906 | 0.010 | Available | 0.664 | 0.606 | 150 |
| Example 25 | IR-1 | −5.300 | −3.700 | A-3 | −3.157 | 0.110 | B-1 | −5.906 | 0.010 | Available | 0.543 | 0.606 | 100 |
| Example 26 | IR-2 | −5.437 | −3.814 | A-3 | −3.157 | 0.110 | B-1 | −5.906 | 0.010 | Available | 0.657 | 0.469 | 70 |
| Example 27 | IR-1 | −5.300 | −3.700 | A-1 | −2.952 | 0.110 | B-15 | −6.759 | 0.010 | Available | 0.748 | 1.459 | 600 |
| Example 28 | IR-1 | −5.300 | −3.700 | A-1 | −2.952 | 0.110 | B-16 | −6.621 | 0.010 | Available | 0.748 | 1.321 | 500 |
| Example 29 | IR-1 | −5.300 | −3.700 | A-1 | −2.952 | 0.110 | B-1 | −5.906 | 0.010 | Unavailable | 0.748 | 0.606 | 10 |
| Example 30 | IR-1 | −5.300 | −3.700 | A-1 | −2.952 | 0.110 | B-6 | −6.589 | 0.010 | Unavailable | 0.748 | 1.289 | 10 |
| Example 31 | IR-1 | −5.300 | −3.700 | A-1 | −2.952 | 0.110 | B-7 | −5.911 | 0.010 | Unavailable | 0.748 | 0.611 | 50 |
| Example 32 | IR-1 | −5.300 | −3.700 | A-1 | −2.952 | 0.110 | B-8 | −6.205 | 0.010 | Unavailable | 0.748 | 0.905 | 20 |
| Example 33 | IR-1 | −5.300 | −3.700 | A-1 | −2.952 | 0.110 | B-9 | −6.342 | 0.010 | Unavailable | 0.748 | 1.042 | 10 |
| Example 34 | IR-2 | −5.437 | −3.814 | A-1 | −2.952 | 0.110 | B-3 | −6.048 | 0.010 | Available | 0.863 | 0.612 | 200 |
| Example 35 | IR-2 | −5.437 | −3.814 | A-1 | −2.952 | 0.110 | B-4 | −6.194 | 0.010 | Available | 0.863 | 0.758 | 250 |
| Comparative Example 1 | IR-1 | −5.300 | −3.700 | A-1 | −2.952 | 0.162 | — | — | — | Available | — | — | — |
| Comparative Example 2 | IR-1 | −5.300 | −3.700 | A-1 | −2.952 | 0.162 | — | — | — | Unavailable | — | — | — |
| Comparative Example 3 | IR-1 | −5.300 | −3.700 | — | — | — | B-1 | −5.906 | 0.010 | Available | — | — | — |
| Comparative Example 4 | IR-1 | −5.300 | −3.700 | — | — | — | — | — | — | Unavailable | — | — | — |

In Table 2 or 3, the description of "-" in the columns of the type of compound indicates that the corresponding compound was not contained.

Further, in Table 2 or 3, the description of "-" in the columns of LUMO, HOMO, the difference (eV) in LUMO between the compound A and the radiation absorption compound, and the difference (eV) in HOMO between the radiation absorption compound and the compound B indicates that the corresponding compound was not contained or HOMO or LUMO was not calculated.

Further, in Table 2 or 3, the description of (IR-2) to (IR-5) in the columns of the compound B indicates that new compounds were not added as the compound B because the radiation absorption compound corresponds to the compound B.

The radical peak (ms) subsequent to the initially generated peak indicates the peak position of the peak with the largest area value among the peaks subsequent to the initially generated peak in the radical generation amount-versus-time curve.

Further, in the present example, LUMO, HOMO, and the values of the radical peaks (ms) subsequent to the initially generated peak were calculated or measured according to the above-described methods.
Hereinafter, the details of the compounds listed as abbreviations in Table 2 or 3 will be described. In the chemical formula, Ph represents a phenyl group.
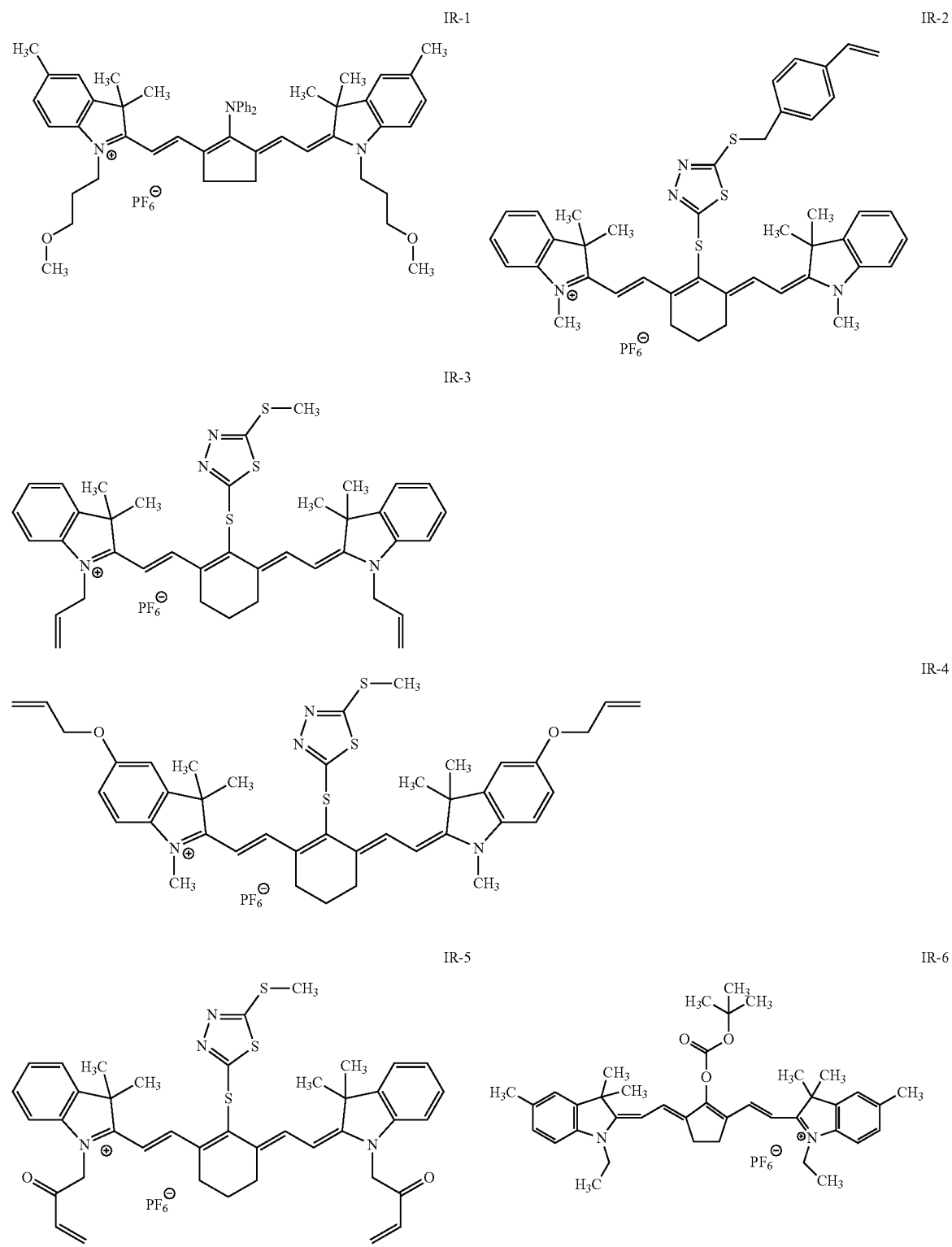

-continued
IR-7
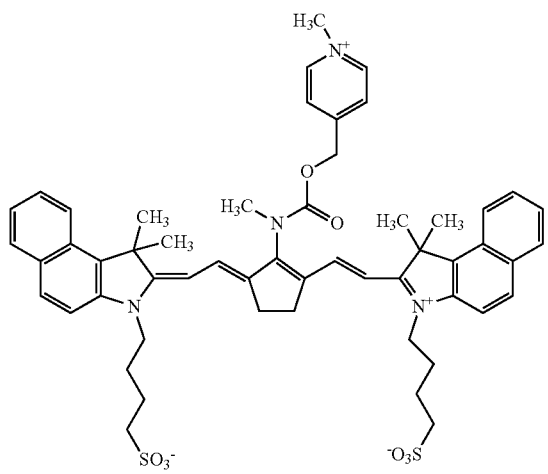
A-1
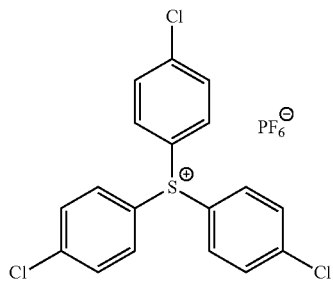
A-2
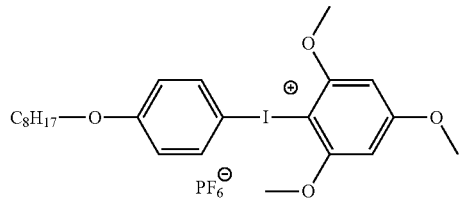
A-3
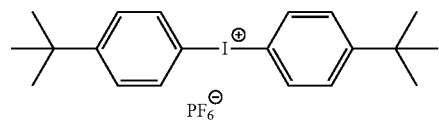
B-1
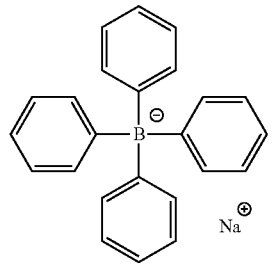
B-2
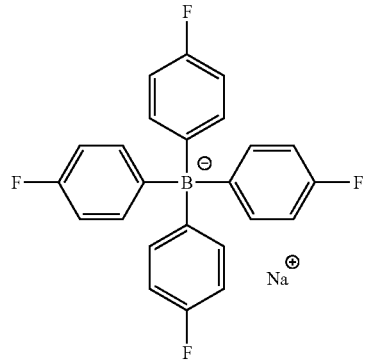
B-3
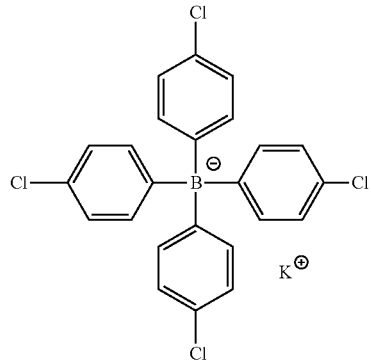
B-4
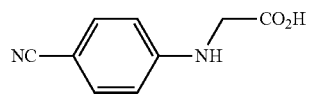
B-5
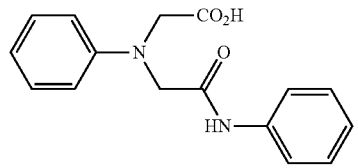
B-6
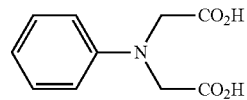

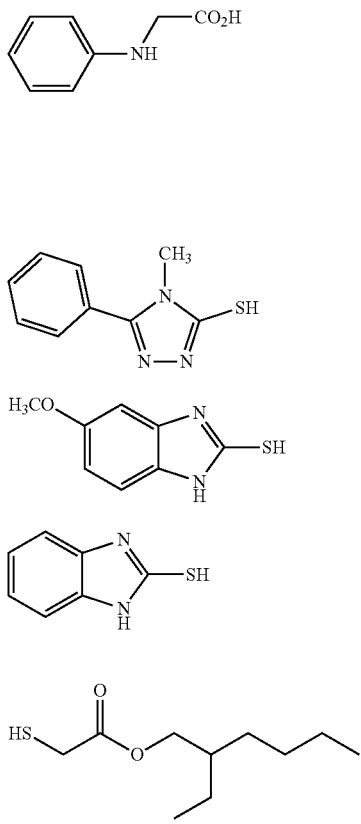

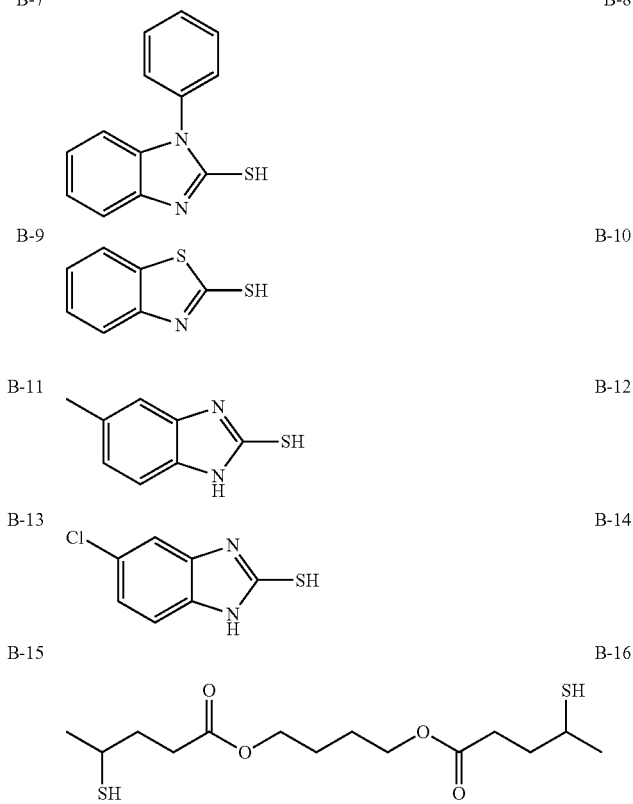

<Evaluation of Tone Reproducibility (On-Press Development)>

The planographic printing plate precursors obtained in each example and each comparative example were exposed in Luxel PLATESETTER T-6000111 (manufactured by Fujifilm Corporation) equipped with an infrared semiconductor laser under conditions of an external surface drum rotation speed of 1000 rpm, a laser output of 70%, and a resolution of 2400 dpi (dot per inch, 1 inch=2.54 cm). The exposed image had a solid image and a 50% halftone dot chart of an FM screen having dots with a diameter of 20 μm.

A printing press LITHRONE26 (manufactured by KOMORI Corporation) was attached to the plate cylinder without performing the development treatment on each of the obtained exposed planographic printing plate precursors. After the speed of a water supply roller with respect to the plate cylinder was decreased by 5%, dampening water and ink were supplied using a standard automatic printing start method for LITHRONE26 using dampening water, in which the volume ratio of Ecolity-2 (manufactured by Fujifilm Corporation) to tap water was 2:98, and Space color fusion G black ink (manufactured by DIC Graphics Corporation) to carry out on-press development, printing was performed on 500 sheets of Tokubishi Art (76.5 kg) paper at a printing speed of 10000 sheets per hour.

The density (solid density) of the solid image area of the 500-th printed material was set as DS, the density of the halftone dot portion was set as DT, and the halftone dot area % was calculated according to the following Murray-Davies Equation (Equation M). A case where the halftone dot area % was further decreased compared to a case where the planographic printing plate precursor of Comparative Example 1 was used was evaluated as A, and a case where the halftone dot area % thereof was further increased or the same compared to the case where the planographic printing plate precursor of Comparative Example 1 was used was evaluated as B.

$$\text{Halftone dot area \%} = (1-10^{-DT})/(1-10^{-DS}) \times 100 \quad \text{Equation (M)}$$

The evaluation results are listed in Table 4.

<Evaluation of Printing Durability (On-Press Development)>

After the above-described tone reproducibility was evaluated and printing was further continued. As the number of printed sheets was increased, since the image recording layer worn and the ink receptivity was degraded, the ink density on the printing paper was degraded. The printing durability was evaluated based on the number of printed sheets (number X of printed sheets) until the total light reflection density (measurement device: eXact, manufactured by Video jet X-Rite, Inc.) of the ink in a measurement wavelength range of 400 to 700 nm on a printing plate exposed to the same exposure amount of light was decreased by 0.1 than that at the start of printing. The printing durability was evaluated using the planographic printing plate precursor of Comparative Example 1 as a reference based on the relative printing durability defined as follows. In a case where the value of the relative printing durability is high, this indicates that the printing durability is high.

Relative printing durability=(number X of printed sheets in case where target planographic printing plate precursor was used)/(number X of printed sheets in case where reference planographic printing plate precursor was used)×100

The evaluation results are listed in Table 4.

<Evaluation of Tone Reproducibility (Developer Development)>

Image exposure of 50% screen tint was performed on the planographic printing plate precursors obtained in each example and each comparative example in Trendsetter 3244VX (manufactured by Creo Corporation, equipped with water-cooling type 40 W infrared semiconductor laser (830 nm)) under conditions of an output of 9 W, an external surface drum rotation speed of 210 rpm, and a resolution of 2400 dpi. The irradiation time was set to 2.38 microseconds. Next, the development treatment was performed by setting a heater such that the plate surface reaching temperature in a pre-heated portion reached 100° C. at a transportation speed at which the time for immersion (development time) in a developer was set to 20 seconds using a developer and an automatic development treatment device having a structure illustrated in FIG. 2. Further, the following developer 1 was used as the developer.

<Developer 1>
Surfactant-1 (SOFTAZLINE LPB-R, manufactured by Kawaken Fine Chemicals Co., Ltd.): 15 parts
Surfactant-2 (SOFTAZLINE LAO, manufactured by Kawaken Fine Chemicals Co., Ltd.): 4 parts
Chelating agent, trisodium ethylenediamine succinate (OCTAQUEST E30, manufactured by InnoSpec Inc.): 0.68 parts
2-Bromo-2-nitropropane-1,3 diol: 0.025 parts
2-Methyl-4-isothiazolin-3-one: 0.025 parts
Silicone-based antifoaming agent (TSA739, manufactured by GE Toshiba Silicones Co., Ltd.): 0.15 parts
Sodium gluconate: 1.5 parts
Sodium carbonate: 1.06 parts
Sodium hydrogen carbonate: 0.52 parts
Water: 77.04 parts
pH: 9.8

The obtained planographic printing plate was attached to a printing press SOR-M (manufactured by Heidelberger Druckmaschinen AG), and printing was performed at a printing speed of 6000 sheets per hour using dampening water (EU-3 (manufactured by Fujifilm Corporation), etching solution):water:isopropyl alcohol=1:89:10 (volume ratio)) and TRANS-G (N) black ink (manufactured by DIC Corporation).

The density (solid density) of the solid image area of the 500-th printed material was set as DS, the density of the halftone dot portion was set as DT, and the halftone dot area % was calculated according to the following Murray-Davies Equation (Equation M). A case where the halftone dot area % was further decreased compared to a case where the planographic printing plate precursor of Comparative Example 1 was used was evaluated as A, and a case where the halftone dot area % thereof was increased or the same compared to the case where the planographic printing plate precursor of Comparative Example 1 was used was evaluated as B.

$$\text{Halftone dot area \%} = (1-10^{-DT})/(1-10^{-DS}) \times 100 \quad \text{Equation (M)}$$

The evaluation results are listed in Table 4.

<Evaluation of Printing Durability (Developer Development)>

After the above-described tone reproducibility was evaluated and printing was further continued. As the number of printed sheets was increased, since the image recording layer worn and the ink receptivity was degraded, the ink density on the printing paper was degraded. The printing durability was evaluated based on the number of printed sheets (number X of printed sheets) until the total light reflection density (measurement device: eXact, manufactured by Video jet X-Rite, Inc.) of the ink in a measurement wavelength range of 400 to 700 nm on a printing plate exposed to the same exposure amount of light was decreased by 0.1 than that at the start of printing. The printing durability was evaluated using the planographic printing plate precursor of Comparative Example 1 as a reference based on the relative printing durability defined as follows. In a case where the value of the relative printing durability is high, this indicates that the printing durability is high.

Relative printing durability=(number X of printed sheets in case where target planographic printing plate precursor was used)/(number X of printed sheets in case where reference planographic printing plate precursor was used)×100

The evaluation results are listed in Table 4.

TABLE 4

|  | Tone reproducibility (on-press development) | Relative printing durability (on-press development) | Tone reproducibility (developer development) | Relative printing durability (developer development) |
| --- | --- | --- | --- | --- |
| Example 1 | A | 130 | A | 130 |
| Example 2 | A | 200 | A | 200 |
| Example 3 | A | 190 | A | 190 |
| Example 4 | A | 200 | A | 200 |
| Example 5 | A | 170 | A | 170 |
| Example 6 | A | 170 | A | 170 |
| Example 7 | A | 190 | A | 190 |
| Example 8 | A | 200 | A | 200 |
| Example 9 | A | 160 | A | 160 |
| Example 10 | A | 150 | A | 150 |
| Example 11 | A | 190 | A | 190 |
| Example 12 | A | 190 | A | 190 |
| Example 13 | A | 160 | A | 160 |
| Example 14 | A | 150 | A | 150 |
| Example 15 | A | 190 | A | 190 |
| Example 16 | A | 190 | A | 190 |
| Example 17 | A | 190 | A | 190 |
| Example 18 | A | 190 | A | 190 |
| Example 19 | A | 190 | A | 190 |

TABLE 4-continued

|  | Tone reproducibility (on-press development) | Relative printing durability (on-press development) | Tone reproducibility (developer development) | Relative printing durability (developer development) |
|---|---|---|---|---|
| Example 20 | A | 190 | A | 190 |
| Example 21 | A | 190 | A | 190 |
| Example 22 | A | 190 | A | 190 |
| Example 23 | A | 190 | A | 190 |
| Example 24 | A | 130 | A | 130 |
| Example 25 | A | 130 | A | 130 |
| Example 26 | A | 115 | A | 115 |
| Example 27 | A | 145 | A | 145 |
| Example 28 | A | 145 | A | 145 |
| Example 29 | A | 105 | A | 105 |
| Example 30 | A | 105 | A | 105 |
| Example 31 | A | 160 | A | 160 |
| Example 32 | A | 105 | A | 105 |
| Example 33 | A | 105 | A | 105 |
| Example 34 | A | 200 | A | 200 |
| Example 35 | A | 200 | A | 200 |
| Comparative Example 1 | — | 100 | — | 100 |
| Comparative Example 2 | A | 20 | A | 20 |
| Comparative Example 3 | A | 10 | A | 10 |
| Comparative Example 4 | A | 0 | A | 0 |

In Table 4, the results of the tone reproducibility (on-press development) and the tone reproducibility (developer development) of Comparative Example 1 are noted as "-" since the planographic printing plate precursor of Comparative Example 1 was used as a reference. Further, in Comparative Example 4, the printing durability is noted as "0" since halftone dots were not able to be formed by the development.

Examples 36 and 37 and Comparative Example 5 to 8

<Preparation of Support>

<Aluminum Plate>

A molten metal was prepared using an aluminum alloy containing 0.06% by mass of Si, 0.30% by mass of Fe, 0.005% by mass of Cu, 0.001% by mass of Mn, 0.001% by mass of Mg, 0.001% by mass of Zn, and 0.03% by mass of Ti and, as the remainder, Al and unavoidable impurities, a molten metal treatment and filtration were performed, and an ingot having a thickness of 500 mm and a width of 1200 mm was prepared according to a DC casting method (semi-continuous casting method). The surface was scraped off using a surface grinder having an average thickness of 10 mm and heated at 550° C. and maintained the state for approximately 5 hours. After the temperature was decreased to 400° C., a rolled sheet having a thickness of 2.7 mm was obtained using a hot rolling mill. Further, a heat treatment was performed thereon at 500° C. using a continuous annealing machine, and a cold rolling was performed so that the thickness of the rolled sheet was finished to 0.24 mm, thereby obtaining an aluminum plate formed of JIS 1050 material. The following surface treatment was performed after the width of this aluminum plate was adjusted to 1030 mm.

<Surface Treatment>

The surface treatment was performed by continuously performing the following treatments of (b) to (j).

Further, liquid cutting was performed using a nip roller after each treatment and washing with water.

(b) Alkali Etching

The aluminum plate obtained in the above-described manner was subjected to an etching treatment by spraying an aqueous solution in which the concentration of caustic soda was 2.6% by mass and the concentration of aluminum ions was 6.5% by mass at a temperature of 70° C. so that 6 g/m² of the aluminum plate was dissolved. Thereafter, washing with water by spraying was performed.

(c) Desmutting Treatment

A desmutting treatment was performed by spraying an acidic aqueous solution (containing 0.5% by mass of aluminum ions) having a nitric acid concentration of 1% by mass at a temperature of 30° C. Thereafter, washing with water was performed using a spray. As the nitric acid aqueous solution used for the desmutting treatment, a waste liquid used for the step of performing the electrochemical roughening treatment using the alternating current in a nitric acid aqueous solution was used.

(d) Electrochemical Roughening Treatment

An electrochemical roughening treatment was continuously performed using an AC voltage of 60 Hz. As an electrolytic solution at this time, an aqueous solution containing 10.5 g/L of nitric acid (containing 5 g/L of aluminum ions and 0.007% by mass of ammonium ions) at a liquid temperature of 50° C. was used. The AC power source waveform is a waveform illustrated in FIG. 4. Further, using a trapezoidal rectangular waveform AC having time TP, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. An electrolytic cell illustrated in FIG. 3 was used as the electrolytic cell. The current density was 30 A/dm² in terms of the peak current value, and the electric quantity was 220 C/dm² as the total electric quantity at the time of anodization of the aluminum plate. Further, 5% of the current from the power source was separately flowed to the auxiliary anode. Thereafter, washing with water was performed using a spray.

(e) Alkali Etching Treatment

The aluminum plate was subjected to an etching treatment by spraying an aqueous solution in which the concentration of caustic soda was 26% by mass and the concentration of aluminum ions was 6.5% by mass at a temperature of 32° C. so that 0.25 g/m² of the aluminum plate was dissolved. Further, a smut component mainly containing aluminum hydroxide generated at the time of the electrochemical roughening treatment using the alternating current at the former stage was removed, an edge portion of a generated pit was dissolved to smooth the edge portion. Thereafter, washing with water by spraying was performed.

(f) Desmutting Treatment

A desmutting treatment was performed by spraying an acidic aqueous solution (containing 4.5% by mass of aluminum ions) having a sulfuric acid concentration of 15% by mass at a temperature of 30° C. Thereafter, washing with water was performed using a spray. As the nitric acid aqueous solution used for the desmutting treatment, a waste liquid used for the step of performing the electrochemical roughening treatment using the alternating current in a nitric acid aqueous solution was used.

(g) Electrochemical Roughening Treatment

An electrochemical roughening treatment was continuously performed using an AC voltage of 60 Hz. As an electrolytic solution at this time, an aqueous solution containing 2.5 g/L of hydrochloric acid (containing 5 g/L of aluminum ions) at a temperature of 35° C. was used. The AC power source waveform is a waveform illustrated in FIG. 4. Further, using a trapezoidal rectangular waveform AC having time TP, until the current value reached a peak from zero, of 0.8 msec and the duty ratio of 1:1 as the AC power source waveform, the electrochemical roughening treatment was performed using a carbon electrode as a counter electrode. As an auxiliary anode, ferrite was used. An electrolytic cell illustrated in FIG. 3 was used as the electrolytic cell. The current density was 25 A/dm² in terms of the peak current value, and the electric quantity was 50 C/dm² as the total electric quantity at the time of anodization of the aluminum plate. Thereafter, washing with water was performed using a spray.

(h) Alkali Etching Treatment

The aluminum plate was subjected to an etching treatment by spraying an aqueous solution in which the concentration of caustic soda was 26% by mass and the concentration of aluminum ions was 6.5% by mass at a temperature of 32° C. so that 0.1 g/m² of the aluminum plate was dissolved. Further, a smut component mainly containing aluminum hydroxide generated at the time of the electrochemical roughening treatment using the alternating current at the former stage was removed, an edge portion of a generated pit was dissolved to smooth the edge portion. Thereafter, washing with water by spraying was performed.

(i) Desmutting Treatment

A desmutting treatment was performed by spraying an acidic aqueous solution (containing 0.5% by mass of aluminum ions) having a sulfuric acid concentration of 25% by mass at a temperature of 60° C. Thereafter, washing with water was performed using a spray.

(j) Anodization Treatment

Figure 3:
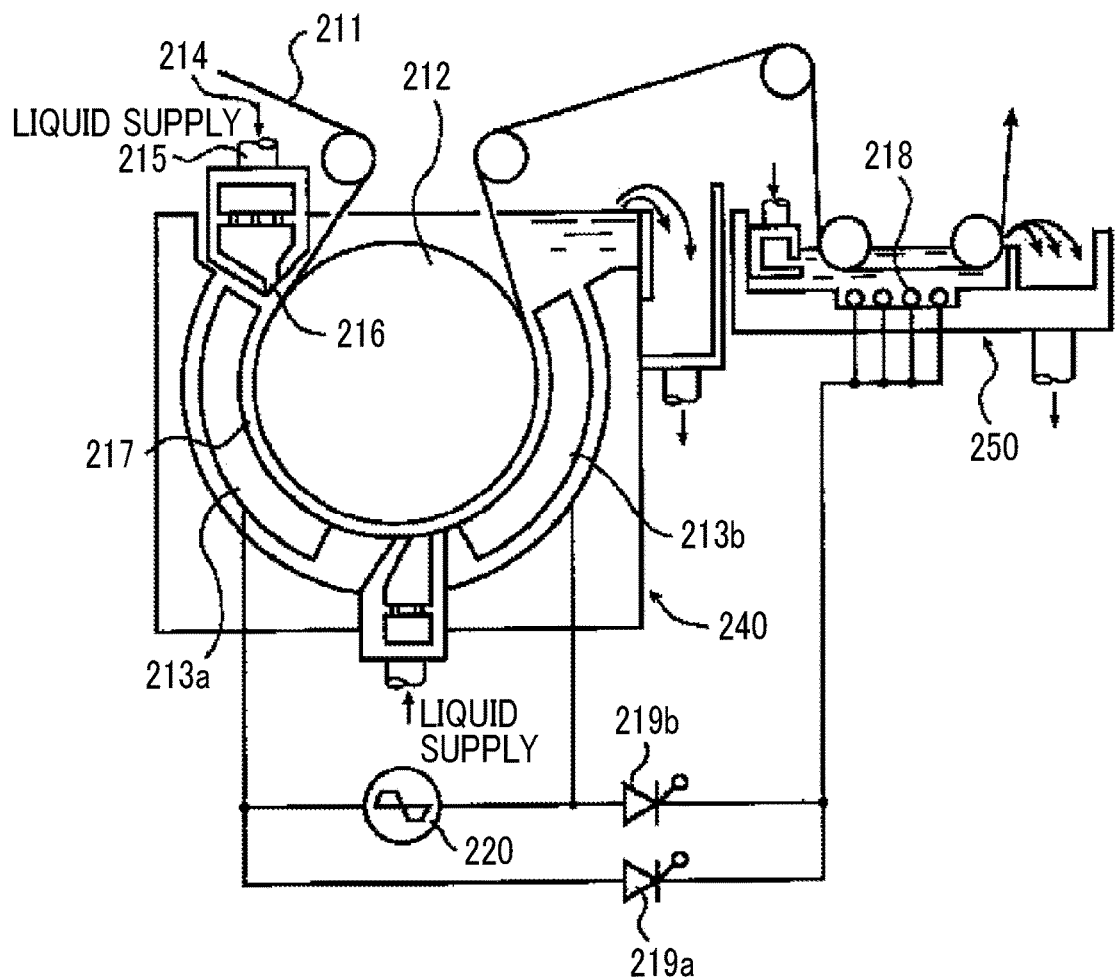
FIG. 3 is a side view illustrating an example of a radial type cell in an electrochemical roughening treatment carried out using an alternating current in preparation of a planographic printing plate precursor according to the present disclosure.
Figure 4:
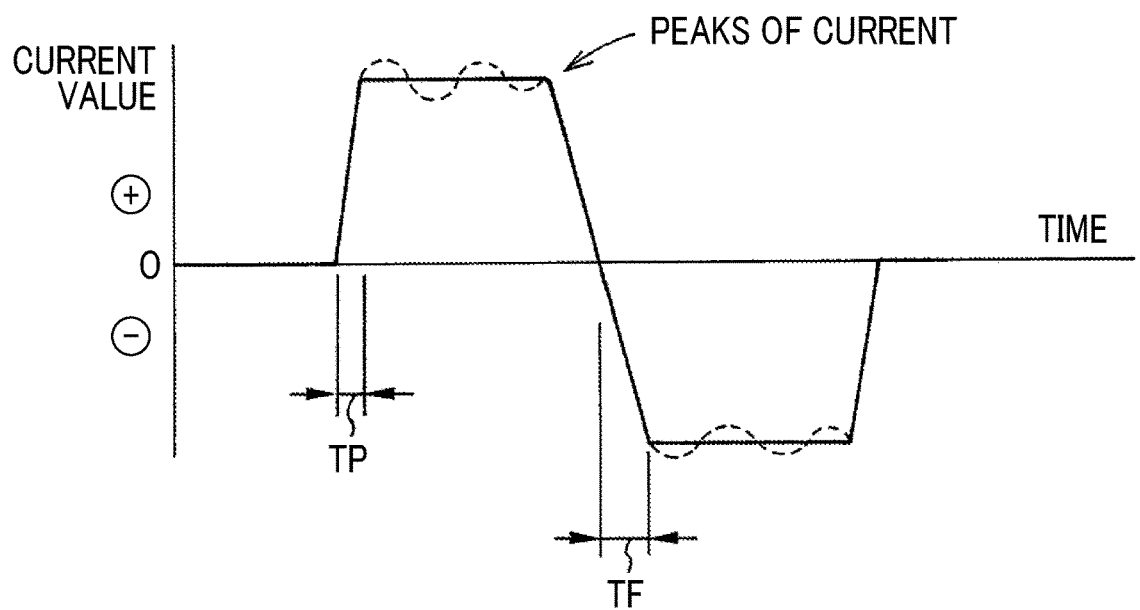
FIG. 4 is a graph showing an example of an alternating waveform-current waveform diagram used for an electrochemical roughening treatment in preparation of a planographic printing plate precursor according to the present disclosure.

An anodization treatment was performed with an anodizing device having a structure illustrated in FIG. 3, thereby obtaining each support for a planographic printing plate of Example 36, Example 37, and Comparative Examples 5 to 8. As the electrolytic solution supplied to first and second electrolysis portions, sulfuric acid was used. The electrolytic solution had a sulfuric acid concentration of 170 g/L (containing 0.5% by mass of aluminum ions) and the temperature thereof was 38° C. Thereafter, washing with water was performed using a spray. The final oxide coating amount was 2.7 g/m².

Next, a support used for the following test was prepared by being coated with the following undercoat layer coating solution (2) such that the dry coating amount was set to 15 mg/m².

<Undercoat Layer Coating Solution (2)>

Compound (2) for undercoat layer having the following structure: 0.18 parts

Tetrasodium ethylenediaminetetraacetate: 0.10 parts

Polyoxyethylene lauryl ether: 0.03 parts

Water: 61.39 parts

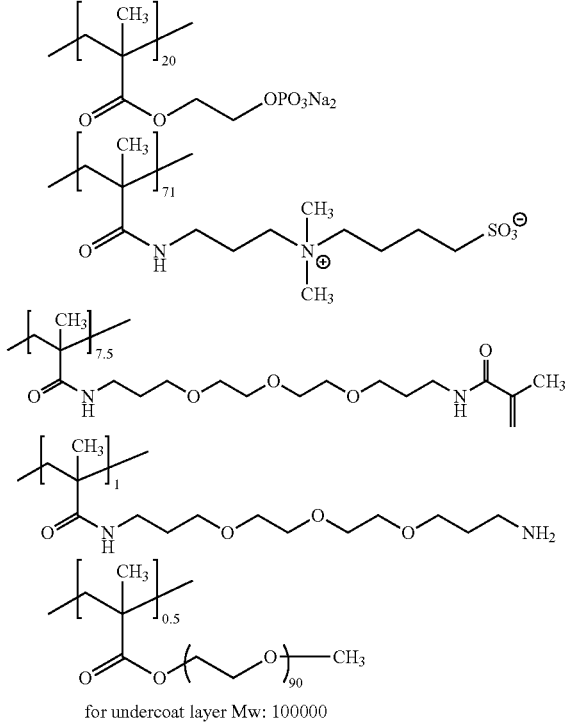

Compound (2) for undercoat layer Mw: 100000

The numbers on the lower right side of the parentheses of each constitutional unit in the compound (2) for an undercoat layer indicate the mass ratios and the number on the lower right side of the parentheses of each ethyleneoxy unit indicate repetition numbers.

<Preparation of Planographic Printing Plate Precursor>

(3) Formation of Image Recording Layer

The undercoat layer on the support formed in the above-described manner was bar-coated with an image recording layer coating solution (2) with the following composition and dried in an oven at 100° for 60 seconds, thereby forming an image recording layer having a dry coating amount of 1.0 g/m².

The image recording layer coating solution (2) was obtained by mixing a photosensitive liquid (2) and a microgel solution (2) described below immediately before the coating and then stirring the solution.

<Photosensitive Liquid (2)>

Binder polymer (2): 0.480 parts [the following structure, Mw: 50000, n: number of ethylene oxide (EO) units: 4]

Radiation absorption compound: 0.030 parts

Compound A listed in Table 5: the amount listed in Table 5

Compound B listed in Table 5: the amount listed in Table 5

Radical polymerizable compound: 0.192 parts, tris(acryloyloxyethyl)isocyanurate (NK ESTER A-9300, manufactured by Shin-Nakamura Chemical Co., Ltd.)

Low-molecular-weight hydrophilic compound: 0.052 parts tris(2-hydroxyethyl)isocyanurate Low-molecular-weight hydrophilic compound (1): 0.099 parts Sensitizing agent: 0.12 parts, phosphonium compound (1) [the structure shown above]

Sensitizing agent: 0.035 parts, ammonium group-containing polymer (1) [the structure shown above]

Sensitizing agent: 0.032 parts, benzyl-dimethyl-octyl ammonium•$PF_6$ salt

Colorant Ethyl Violet [the following structure]: 0.030 parts

Fluorine-based surfactant (1): 0.02 parts [the structure shown above]

2-Butanone: 1.091 parts

1-Methoxy-2-propanol: 8.609 parts

<Microgel Solution (2)>

Microgel (2): 1.580 parts

Distilled water: 1.455 parts

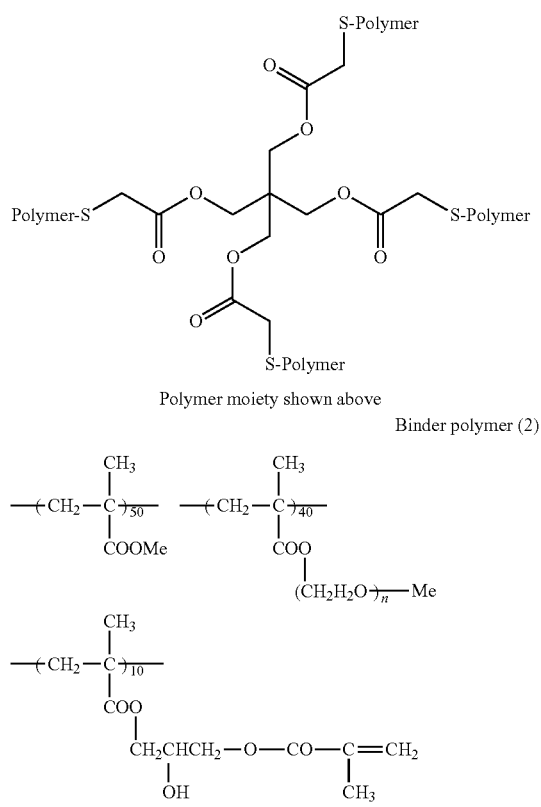

Binder polymer (2)

Further, Me represents a methyl group, and each number on the lower right side of the parentheses of each constitutional unit of the binder polymer (2) indicates the molar ratio.

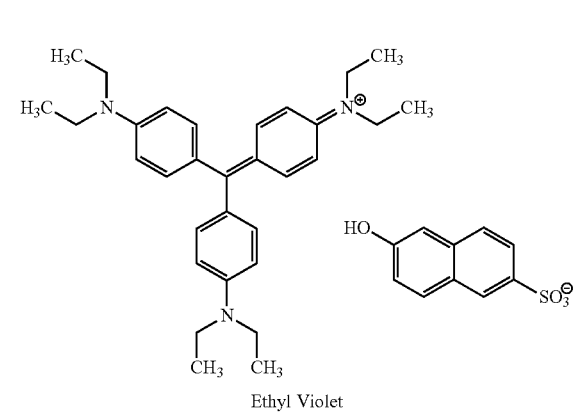

Ethyl Violet

A synthesis method of the above-described microgel (2) is as follows.

—Synthesis of Microgel (2)—

10 parts of an adduct (TAKENATE D-110N, manufactured by Mitsui Chemicals Polyurethanes, Inc.) of trimethylolpropane and xylene diisocyanate, 5.54 parts of dipentaerythritol pentaacrylate (SR399, manufactured by Sartomer Japan Inc.), and 0.1 parts of PIONINE A-41C (manufactured by TAKEMOTO OIL & FAT Co., Ltd.), as oil phase components, were dissolved in 17 parts of ethyl acetate. As a water phase component, 40 parts of a 4 mass % aqueous solution of PVA-205 was prepared. The oil phase components and the water phase components were mixed with each other and emulsified at 12000 rpm for 10 minutes using a homogenizer. 25 parts of distilled water was added to the obtained emulsion, and the resultant was stirred at room temperature (25° C., the same applies hereinafter) for 30 minutes and stirred at 50° C. for 3 hours. The microgel solution obtained in this manner was diluted with distilled water such that the concentration of solid contents was set to 15% by mass, thereby preparing a microgel (2). The average particle diameter of the microgel measured by a light scattering method was 0.2 μm.

(4) Formation of Protective Layer

In each example and each comparative example, the image recording layer was bar-coated with the following protective layer coating solution (2) with the following composition and dried in an oven at 120° C. for 60 seconds to form a protective layer having a dry coating amount of 0.15 g/m².

Further, the protective layer had not been formed in a case where "unavailable" is noted in the columns of the protective layer in Table 5.

<Protective Layer Coating Solution (2)>

Inorganic layered compound dispersion (1): 1.5 parts

Hydrophilic polymer (1): 0.55 parts, [the following structure, Mw: 30000]

6 mass % aqueous solution containing polyvinyl alcohol (CKS50, manufactured by Nippon Synthetic Chemical Industry Co., Ltd., sulfonic acid-modified, saponification degree of 99% by mole or greater, degree of polymerization of 300): 0.10 parts 6 mass % aqueous solution containing polyvinyl alcohol (PVA-405, manufactured by KURARAY CO., LTD., saponification degree of 81.5% by mole, degree of polymerization of 500): 0.03 parts 80 mass % aqueous solution containing surfactant (RAPISOL A-80 (trade name), manufactured by NOF Corporation): 0.011 parts Ion exchange water: 6.0 parts

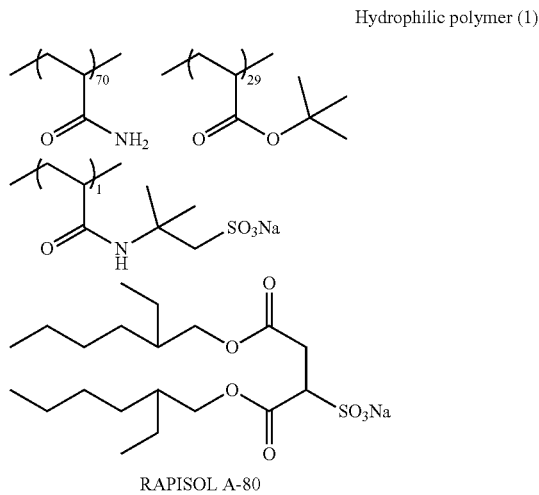

Hydrophilic polymer (1)

RAPISOL A-80

Further, Me represents a methyl group, and each number on the lower right side of the parentheses of each constitutional unit of the hydrophilic polymer (1) indicates the molar ratio.

corresponding compound was not contained or HOMO or LUMO was not calculated.

<Evaluation of Tone Reproducibility (Developer Development)>

[Exposure]

The planographic printing plate precursors of Examples 35 and 36 or Comparative Examples 5 to 8 were exposed in Luxel PLATESETTER T-6000III (manufactured by Fujifilm Corporation) equipped with an infrared semiconductor laser under conditions of an external surface drum rotation speed of 1000 rpm, a laser output of 70%, and a resolution of 2400 dpi (dot per inch, 1 inch=2.54 cm). The exposed image had a solid image and a 50% halftone dot chart of an FM screen having dots with a diameter of 20 µm.

[Development Treatment]

Figure 2:
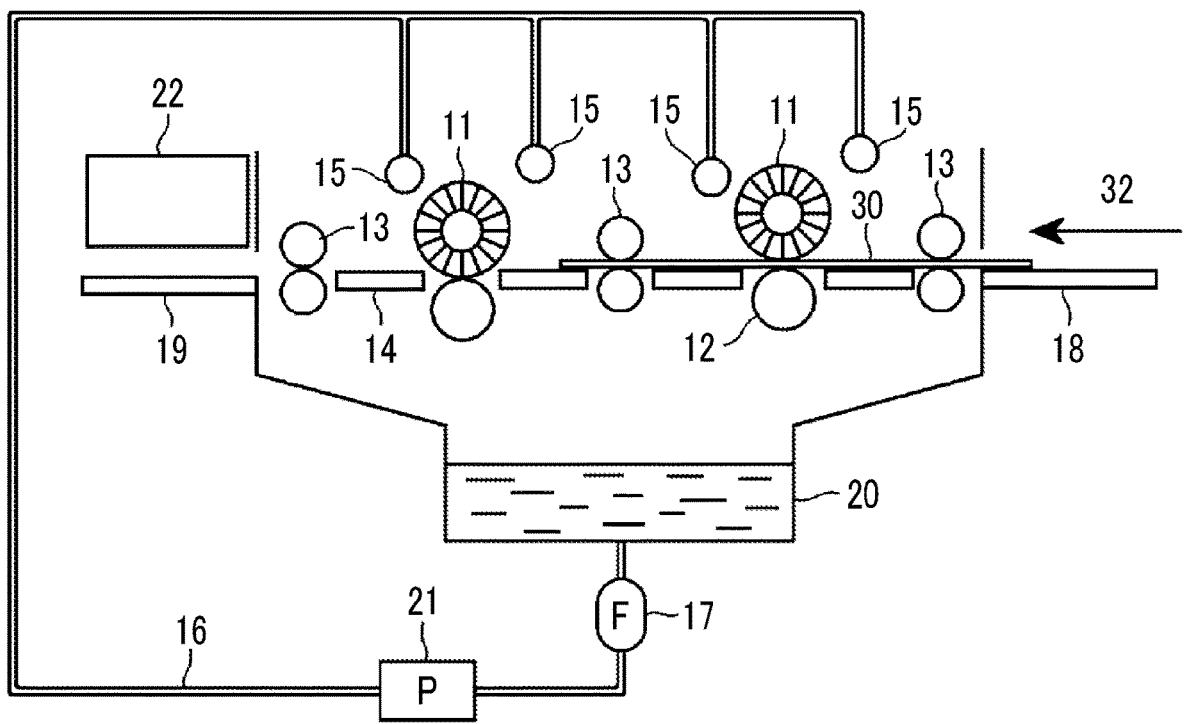
FIG. 2 is a schematic view illustrating a structure of an automatic development treatment device used in the examples.

Next, the planographic printing plate precursor was subjected to a development treatment using a development treatment device illustrated in FIG. 2. Here, the "development treatment" indicates a combined treatment having one or more treatments selected from the group consisting of removal of the protective layer, gum coating, and drying in addition to the development of the image recording layer.

As the treatment liquid used for the development treatment, any one of the treatment liquid (1) or the treatment liquid (2) with the following composition listed in Table 5 was used.

<Treatment Liquid (1)> pH=8.4

PELEX NBL (sodium alkyl naphthalene sulfonate, manufactured by Kao Corporation, anionic surfactant): 2.5% by mass

TABLE 5

|  | Radiation absorption compound | | Compound A | | | Compound B | | | Pro- tective layer | Treat- ment liquid | Difference in LUMO between compound A and radiation absorption (eV) | Difference in HOMO between compound B and radiation absorption (eV) | Position where peaks subsequent to initially generated peak were generated (ms) |
|---|---|---|---|---|---|---|---|---|---|---|---|---|---|
|  | Type | HOMO (eV) | LUMO (eV) | Type | LUMO (eV) | Content (parts) | Type | HOMO (eV) | Content (parts) | | | | | |
| Example 36 | IR-1 | −5.300 | −3.700 | A-2 | −3.036 | 0.110 | B-1 | −5.906 | 0.010 | Available | (1) | 0.664 | 0.606 | 150 |
| Example 37 | IR-1 | −5.300 | −3.700 | A-2 | −3.036 | 0.110 | B-1 | −5.906 | 0.010 | Available | (2) | 0.664 | 0.606 | 150 |
| Comparative Example 5 | IR-1 | −5.300 | −3.700 | A-2 | −3.036 | 0.162 | — | — | — | Available | (1) | — | — | — |
| Comparative Example 6 | IR-1 | −5.300 | −3.700 | — | — | — | B-1 | −5.906 | 0.010 | Unavailable | (1) | — | — | — |
| Comparative Example 7 | IR-1 | −5.300 | −3.700 | A-2 | −3.036 | 0.162 | — | — | — | Available | (2) | — | — | — |
| Comparative Example 8 | IR-1 | −5.300 | −3.700 | — | — | — | B-1 | −5.9061 | 0.01 | Unavailable | (2) | — | — | — |

In Table 5, the description of "-" in the columns of the type of compound indicates that the corresponding compound was not contained.

Further, in Table 5, the description of "-" in the columns of LUMO, HOMO, the difference (eV) in LUMO between the compound A and the radiation absorption compound, and the difference (eV) in HOMO between the radiation absorption compound and the compound B indicates that the NEWCOL B13 (polyoxyethylene aryl ether, manufactured by Nippon Nyukazai Co., Ltd., non-ionic surfactant): 2.0% by mass Benzyl alcohol (manufactured by Wako Pure Chemical Industries, Ltd.): 0.6% by mass Disodium hydrogen phosphate (manufactured by Wako Pure Chemical Industries, Ltd.): 0.3% by mass Sodium hydrogen carbonate (manufactured by Wako Pure Chemical Industries, Ltd.): 0.225% by mass Sodium gluconate (manufactured by Fuso Chemical Co., Ltd.): 3.0% by mass Antifoaming agent (polydimethylsiloxane, SILCOLAPSE 432, manufactured by Bluestar Silicones): 0.002% by mass Water: 91.373% by mass <Treatment Liquid (2)> pH=8.4

PELEX NBL (sodium alkyl naphthalene sulfonate, manufactured by Kao Corporation, anionic surfactant): 2.5% by mass LUGALVAN BNO24 (polyoxyethylene aryl ether, manufactured by BASF SE, non-ionic surfactant): 2.0% by mass Benzyl alcohol (manufactured by Wako Pure Chemical Industries, Ltd.): 0.6% by mass Disodium hydrogen phosphate (manufactured by Wako Pure Chemical Industries, Ltd.): 0.3% by mass Sodium hydrogen carbonate (manufactured by Wako Pure Chemical Industries, Ltd.): 0.225% by mass Sodium gluconate (manufactured by Fuso Chemical Co., Ltd.): 3.0% by mass Antifoaming agent (polydimethylsiloxane, SILCOLAPSE 432, manufactured by Bluestar Silicones): 0.002% by mass Water: 91.373% by mass The development treatment device illustrated in FIG. 2 is an automatic treatment device including two rotary brush rolls 11. A brush roll having an external diameter of 90 mm in which polybutylene terephthalate fibers (diameter of bristle: 200 μm, length of bristle: 17 mm) were implanted was used as the first rotary brush roll 11, and the roll was allowed to rotate 200 times (the circumferential speed of the brush tip: 0.94 m/s) per minute in the same direction as the transportation direction. Further, a brush roll having an external diameter of 60 mm in which polybutylene terephthalate fibers (diameter of bristle: 200 μm, length of bristle: 17 mm) were implanted was used as the second rotary brush roll 11, and the roll was allowed to rotate 200 times (the peripheral speed of the brush tip: 0.63 m/s) per minute in the direction opposite to the transportation direction. A planographic printing plate precursor 30 after being exposed was transported in the transportation direction illustrated in the figure between three pairs of transport rolls 13 from a plate feed stand 18 to a plate discharge stand 19 at a transportation speed of 100 cm/min on a transport guide plate 14 provided during the process such that the planographic printing plate precursor 30 was allowed to pass through a space between the rotary brush roll 11 and a receiving roll 12.

In four spray pipes 15, the developer stored in a treatment liquid tank 20 was supplied by a circulation pump 21 through a filter 17 using a pipe line 16, and the developer was supplied to the plate surface from each spray pipe 15 by performing showering. Further, the volume of the treatment liquid tank 20 was 10 liters, and the developer was recycled. The planographic printing plate discharged from the development treatment device was dried by a dryer 22 without being washed with water.

The rotation direction of the rotary brush roll used in the present disclosure may be the same as or opposite to the transport direction of the planographic printing plate precursor according to the embodiment of the present disclosure. Further, in a case where the rotary brush roll is allowed to swing in a rotation axis direction of the brush roll, this is also effective for the development.

The obtained planographic printing plate was attached to a printing press SOR-M (manufactured by Heidelberger Druckmaschinen AG), and printing was performed at a printing speed of 6000 sheets per hour using dampening water (EU-3 (manufactured by Fujifilm Corporation), etching solution):water:isopropyl alcohol=1:89:10 (volume ratio)) and TRANS-G (N) black ink (manufactured by DIC Corporation).

The density (solid density) of the solid image area of the 500-th printed material was set as DS, the density of the halftone dot portion was set as DT, and the halftone dot area % was calculated according to the following Murray-Davies Equation (Equation M). A case where the halftone dot area % was further decreased compared to a case where the planographic printing plate precursor of Comparative Example 5 was used was evaluated as A, and a case where the halftone dot area % thereof was increased or the same compared to the case where the planographic printing plate precursor of Comparative Example 5 was used was evaluated as B.

$$\text{Halftone dot area \%} = (1-10^{-DT})/(1-10^{-DS}) \times 100 \quad \text{Equation (M)}$$

The evaluation results are listed in Table 6.

<Evaluation of Printing Durability (Developer Development)>

After the above-described tone reproducibility was evaluated and printing was further continued. As the number of printed sheets was increased, since the image recording layer worn and the ink receptivity was degraded, the ink density on the printing paper was degraded. The printing durability was evaluated based on the number of printed sheets (number X of printed sheets) until the total light reflection density (measurement device: eXact, manufactured by Video jet X-Rite, Inc.) of the ink in a measurement wavelength range of 400 to 700 nm on a printing plate exposed to the same exposure amount of light was decreased by 0.1 than that at the start of printing. The printing durability was evaluated using the planographic printing plate precursor of Comparative Example 5 as a reference based on the relative printing durability defined as follows. In a case where the value of the relative printing durability is high, this indicates that the printing durability is high.

Relative printing durability=(number X of printed sheets in case where target planographic printing plate precursor was used)/(number X of printed sheets in case where reference planographic printing plate precursor was used)×100

The evaluation results are listed in Table 6.

TABLE 6

|  | Tone reproducibility (developer development) | Relative printing durability (developer development) |
| --- | --- | --- |
| Example 36 | A | 140 |
| Example 37 | A | 140 |
| Comparative Example 5 | — | 100 |
| Comparative Example 6 | A | 100 |
| Comparative Example 7 | A | 10 |
| Comparative Example 8 | A | 10 |

In Table 6, the result of the tone reproducibility (developer development) of Comparative Example 5 is noted as "-" since the planographic printing plate precursor of Comparative Example 5 was used as a reference.

EXPLANATION OF REFERENCES

11: rotary brush roll

12: receiving roll

13: transport roll
14: transport guide plate
15: spray pipe
16: pipe line
17: filter
18: plate feed stand
19: plate discharge stand
20: treatment liquid tank
21: circulation pump
22: dryer
30: planographic printing plate precursor
32: transport direction
211: aluminum plate
212: radial drum roller
213a, 213b: main pole
214: electrolytic treatment liquid
215: electrolytic solution supply port
216: slit
217: electrolytic solution passage
218: auxiliary anode
219a, 219b: thyristor
220: AC power source
240: main electrolytic cell
250: auxiliary anode cell

What is claimed is:

1. A planographic printing plate precursor for on-press development, comprising:
a support; and
an image recording layer which comprises a radical initiator, a radical polymerizable component, and a radiation absorption compound, and wherein the image recording layer shows two or more peaks of a radical generation amount in a radical generation amount-versus-time curve after exposure to image forming radiation,
the radiation absorption compound comprising a compound represented by the following Formula 1:

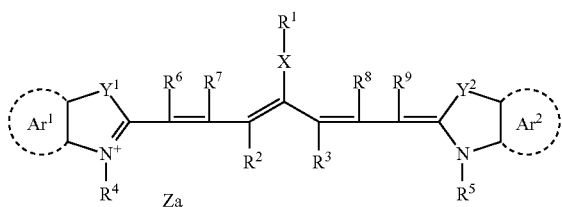

Formula 1 wherein, in Formula 1, $R^1$ represents a group capable of cleaving $R^1$—X bond due to exposure to image forming radiation, X represents —$NR^N$—, $R^N$ represents an alkyl group, $R^2$ and $R^3$ each independently represent a hydrogen atom or an alkyl group, $R^2$ and $R^3$ may be linked to each other to form a ring, $Ar^1$ and $Ar^2$ each independently represent a group forming a benzene ring or a group forming a naphthalene ring, $Y^1$ and $Y^2$ each independently represent an oxygen atom, a sulfur atom, —$NR^O$—, or a dialkylmethylene group, $R^4$ and $R^5$ each independently represent an alkyl group, $R^6$ to $R^9$ each independently represent a hydrogen atom or an alkyl group, $R^O$ represents a hydrogen atom, an alkyl group, or an aryl group, and Za represents a counter ion that neutralizes the charge.

2. The planographic printing plate precursor according to claim 1, further comprising a protective layer on the image recording layer.

3. The planographic printing plate precursor according to claim 2, wherein the protective layer comprises at least one selected from the group consisting of polyvinyl alcohol, modified polyvinyl alcohol, polyvinyl pyrrolidone, a water-soluble cellulose derivative, and poly(meth)acrylonitrile.

4. The planographic printing plate precursor according to claim 1,
wherein, among the peaks of the radical generation amount, a peak interval, between a peak that is initially generated with respect to time after the exposure to the image forming radiation and at least one peak that is generated subsequent to the initially generated peak, is 40 ms or greater.

5. The planographic printing plate precursor according to claim 1,
wherein, among the peaks of the radical generation amount, at least one peak that is generated subsequent to an initially generated peak with respect to the time after exposure to the image forming radiation is a peak derived from a decomposition product of the radiation absorption compound.

6. The planographic printing plate precursor according to claim 1, wherein the radical initiator comprises an electron-donating radical initiator, and the radiation absorption compound comprises a compound which is decomposable to generate a radical due to exposure to the image forming radiation.

7. The planographic printing plate precursor according to claim 1, wherein the radical initiator comprises an electron-donating radical initiator and an electron-accepting radical initiator.

8. The planographic printing plate precursor according to claim 7, wherein a difference between a highest occupied molecular orbital of the electron-donating radical initiator and a highest occupied molecular orbital of the radiation absorption compound is 0.61 eV or greater.

9. The planographic printing plate precursor according to claim 7, wherein a difference between a lowest unoccupied molecular orbital of the electron-accepting radical initiator and a lowest unoccupied molecular orbital of the radiation absorption compound is 0.90 eV or less.

10. The planographic printing plate precursor according to claim 1, further comprising an interlayer between the support and the image recording layer.

11. The planographic printing plate precursor according to claim 1, wherein the radiation absorption compound comprises an infrared absorption compound.

12. The planographic printing plate precursor according to claim 1, wherein the image recording layer is removable by at least one of dampening water or printing ink.

13. A plate-making method for a planographic printing plate, the method comprising:
subjecting the planographic printing plate precursor according to claim 1 to image-wise light exposure; and
supplying at least one of printing ink or dampening water on a printing press to remove a non-image area of an image recording layer.

14. The planographic printing plate precursor according to claim 1, wherein the image recording layer further comprises a binder.

15. The planographic printing plate precursor according to claim 14, wherein the binder comprises at least one film-forming polymer selected from the group consisting of a (meth)acrylic resin, polyurethane, polyester, polyamide, polyether, polycarbonate, polyurea, polyolefin, a vinyl resin, and polyamine.

\* \* \* \* \*